(12) United States Patent  (10) Patent No.: US 8,648,343 B2
Yamazaki et al.  (45) Date of Patent: Feb. 11, 2014

(54) SEMICONDUCTOR DEVICE AND METHOD FOR MANUFACTURING THE SAME

(75) Inventors: Shunpei Yamazaki, Setagaya (JP); Junichiro Sakata, Atsugi (JP); Hiroyuki Miyake, Atsugi (JP); Hideaki Kuwabara, Isehara (JP); Ikuko Kawamata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 563 days.

(21) Appl. No.: 12/839,519

(22) Filed: Jul. 20, 2010

(65) Prior Publication Data

US 2011/0017995 A1  Jan. 27, 2011

(30) Foreign Application Priority Data

Jul. 23, 2009  (JP) ................................. 2009-172413

(51) Int. Cl.
*H01L 27/12* (2006.01)
(52) U.S. Cl.
USPC ................... 257/59; 257/71; 257/43; 257/58; 257/88
(58) Field of Classification Search
USPC .......................................... 257/43, 58, 59, 88
See application file for complete search history.

(56) References Cited

U.S. PATENT DOCUMENTS

| 5,731,216 | A | 3/1998 | Holmberg et al. |
| 5,731,856 | A | 3/1998 | Kim et al. |
| 5,744,864 | A | 4/1998 | Cillessen et al. |
| 5,818,070 | A | 10/1998 | Yamazaki et al. |
| 5,969,377 | A | 10/1999 | Seo |
| 6,294,274 | B1 | 9/2001 | Kawazoe et al. |

(Continued)

FOREIGN PATENT DOCUMENTS

| EP | 1737044 A | 12/2006 |
| EP | 1770788 | 4/2007 |

(Continued)

OTHER PUBLICATIONS

Transparent Circuit,, Nikkei Electronics, Aug. 27, 2007, No. 959, pp. 39-52.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

(Continued)

*Primary Examiner* — Chuong A Luu
*Assistant Examiner* — Jaehwan Oh
(74) *Attorney, Agent, or Firm* — Eric J. Robinson; Robinson Intellectual Property Law Office, P.C.

(57) ABSTRACT

An object is to increase the aperture ratio of a semiconductor device. The semiconductor device includes a driver circuit portion and a display portion (also referred to as a pixel portion) over the same substrate. The driver circuit portion includes a channel-etched thin film transistor for a driver circuit, in which a source electrode and a drain electrode are formed using a metal and a channel layer is formed using an oxide semiconductor, and a driver circuit wiring formed using a metal. The display portion includes a channel protection thin film transistor for a pixel, in which a source electrode and a drain electrode are formed using an oxide conductor and a semiconductor layer is formed using an oxide semiconductor, and a display portion wiring formed using an oxide conductor. The thin film transistors provided in the semiconductor device are formed with a resist mask formed using a multi-tone mask.

28 Claims, 39 Drawing Sheets

(56) References Cited

U.S. PATENT DOCUMENTS

| | | | |
|---|---|---|---|
| 6,563,174 B2 | 5/2003 | Kawasaki et al. | |
| 6,713,785 B2 | 3/2004 | Yagi | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,582,904 B2 | 9/2009 | Fujii et al. | |
| 7,674,650 B2 | 3/2010 | Akimoto et al. | |
| 7,719,185 B2 | 5/2010 | Jin et al. | |
| 7,732,819 B2 | 6/2010 | Akimoto et al. | |
| 7,745,798 B2 | 6/2010 | Takahashi | |
| 7,791,082 B2 | 9/2010 | Iwasaki | |
| 7,800,113 B2 | 9/2010 | Shoji et al. | |
| 7,851,279 B2 | 12/2010 | Takano et al. | |
| 7,855,379 B2 | 12/2010 | Hayashi et al. | |
| 7,910,932 B2 | 3/2011 | Marks et al. | |
| 7,932,521 B2 | 4/2011 | Akimoto et al. | |
| 8,088,652 B2 | 1/2012 | Hayashi et al. | |
| 8,093,586 B2 * | 1/2012 | Shimoji et al. | 257/40 |
| 8,207,533 B2 | 6/2012 | Maekawa et al. | |
| 8,247,814 B2 | 8/2012 | Maekawa et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0111663 A1 | 6/2003 | Yagi | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0095356 A1 * | 5/2005 | Nakamura et al. | 427/58 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0051958 A1 * | 3/2007 | Yamazaki et al. | 257/72 |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2007/0295973 A1 * | 12/2007 | Jinbo et al. | 257/88 |
| 2008/0001151 A1 * | 1/2008 | Jun et al. | 257/59 |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0176347 A1 * | 7/2008 | Nakamura et al. | 438/30 |
| 2008/0182358 A1 | 7/2008 | Cowdery-Corvan et al. | |
| 2008/0199992 A1 * | 8/2008 | Maekawa et al. | 438/161 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0291350 A1 | 11/2008 | Hayashi et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2009/0001375 A1 * | 1/2009 | Yamazaki et al. | 257/59 |
| 2009/0045399 A1 * | 2/2009 | Kaji et al. | 257/43 |
| 2009/0050876 A1 * | 2/2009 | Marks et al. | 257/24 |
| 2009/0050974 A1 * | 2/2009 | Mostarshed et al. | 257/368 |
| 2009/0061573 A1 * | 3/2009 | Miyairi et al. | 438/160 |
| 2009/0068773 A1 | 3/2009 | Lai et al. | |
| 2009/0072233 A1 * | 3/2009 | Hayashi et al. | 257/43 |
| 2009/0073325 A1 | 3/2009 | Kuwabara et al. | |
| 2009/0079920 A1 | 3/2009 | Aoki | |
| 2009/0114910 A1 | 5/2009 | Chang | |
| 2009/0134399 A1 | 5/2009 | Sakakura et al. | |
| 2009/0140438 A1 | 6/2009 | Yamazaki et al. | |
| 2009/0152506 A1 | 6/2009 | Umeda et al. | |
| 2009/0152541 A1 | 6/2009 | Maekawa et al. | |
| 2009/0189155 A1 | 7/2009 | Akimoto | |
| 2009/0189156 A1 | 7/2009 | Akimoto | |
| 2009/0212291 A1 | 8/2009 | Ikeda | |
| 2009/0230390 A1 * | 9/2009 | Gosain et al. | 257/43 |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2010/0044701 A1 | 2/2010 | Sano et al. | |
| 2010/0065831 A1 * | 3/2010 | Shimoji et al. | 257/40 |
| 2010/0065844 A1 | 3/2010 | Tokunaga | |
| 2010/0065847 A1 * | 3/2010 | Gotou et al. | 257/59 |
| 2010/0084648 A1 | 4/2010 | Watanabe | |
| 2010/0092800 A1 | 4/2010 | Itagaki et al. | |
| 2010/0102313 A1 | 4/2010 | Miyairi et al. | |
| 2010/0109002 A1 | 5/2010 | Itagaki et al. | |
| 2011/0003429 A1 | 1/2011 | Oikawa et al. | |
| 2011/0006302 A1 | 1/2011 | Yamazaki et al. | |
| 2011/0012105 A1 | 1/2011 | Yamazaki et al. | |
| 2011/0012106 A1 | 1/2011 | Yamazaki et al. | |
| 2011/0012112 A1 | 1/2011 | Yamazaki et al. | |
| 2011/0012116 A1 | 1/2011 | Yamazaki et al. | |
| 2011/0012117 A1 | 1/2011 | Yamazaki et al. | |
| 2011/0012118 A1 | 1/2011 | Yamazaki et al. | |
| 2011/0215318 A1 | 9/2011 | Yamazaki et al. | |
| 2011/0254009 A1 | 10/2011 | Ohtani et al. | |
| 2012/0061668 A1 | 3/2012 | Miyairi et al. | |
| 2012/0104386 A1 | 5/2012 | Miyairi et al. | |

(56) References Cited

U.S. PATENT DOCUMENTS

| | | | | |
|---|---|---|---|---|
| 2012/0286279 | A1* | 11/2012 | Hsu et al. | 257/66 |
| 2013/0001583 | A1 | 1/2013 | Yamazaki et al. | |

FOREIGN PATENT DOCUMENTS

| | | | |
|---|---|---|---|
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | | 9/1993 |
| JP | 08-264794 | | 10/1996 |
| JP | 08-264794 | A | 10/1996 |
| JP | 11-505377 | | 5/1999 |
| JP | 2000-044236 | A | 2/2000 |
| JP | 2000-150900 | | 5/2000 |
| JP | 2002-076356 | A | 3/2002 |
| JP | 2002-289859 | A | 10/2002 |
| JP | 2003-029293 | | 1/2003 |
| JP | 2003-086000 | | 3/2003 |
| JP | 2003-086000 | A | 3/2003 |
| JP | 2003-086808 | | 3/2003 |
| JP | 2003-179233 | A | 6/2003 |
| JP | 2004-103957 | | 4/2004 |
| JP | 2004-273614 | A | 9/2004 |
| JP | 2004-273732 | A | 9/2004 |
| JP | 2007-081362 | | 3/2007 |
| JP | 2007-096055 | | 4/2007 |
| JP | 2007-123861 | | 5/2007 |
| JP | 2007-163467 | | 6/2007 |
| JP | 2007-171932 | | 7/2007 |
| JP | 2008-235871 | A | 10/2008 |
| JP | 2008-281988 | A | 11/2008 |
| JP | 2009-158940 | A | 7/2009 |
| JP | 2009-265271 | | 11/2009 |
| JP | 2010-098280 | | 4/2010 |
| WO | 2004/114391 | | 12/2004 |
| WO | WO-2008/105347 | | 9/2008 |
| WO | WO-2008/126879 | | 10/2008 |

OTHER PUBLICATIONS

Kimizuka et al., "Syntheses and Single-Crystal Data of Homologous Compounds, In$_2$O$_3$(ZnO)$m$ ($m$ =3, 4, and 5), InGaO$_3$(ZnO)$_3$, and Ga$_2$O$_3$(ZnO)$m$, ($m$ =7, 8, 9, and 16) in the In$_2$O$_3$-ZnGa$_2$O$_4$-ZnO System," Journal of Solid State Chemistry, Apr. 1, 1995, vol. 116, No. 1, pp. 170-178.

Nakamura et al., "The Phase Relations in the In$_2$O$_3$-Ga$_2$ZnO$_4$-ZnO System at 1350° C.," Journal of Solid State Chemistry, Aug. 1, 1991, vol. 93, No. 2, pp. 298-315.

Li et al., "Modulated Structures of Homologous Compounds InMO$_3$(ZnO)$_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Device Employing MoO$_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-277.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Miyasaka, "58.2: Invited Paper: Suftla Flexible Microelectronics on their Way to Business," SID Digest '07: SID International Symposium Digest of Technical Papers, 2007, vol. 38, pp. 1673-1676.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Prins et al., "A Ferroelectric Transparent Thin-Film Transistor," Appl. Phys. Lett. (Applied Physics Letters), Jun. 17, 1996, vol. 68, No. 25, pp. 3650-3652.
Takahashi et al., "Theoretical Analysis of IGZO Transparent Amorphous Oxide Semiconductor," IDW '08: Proceedings of the 15th International Display Workshops, Dec. 3, 2008, pp. 1637-1640.
Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.
Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.
Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.
Osada et al., "Development of Driver-Integrated Panel using Amorphous In-Ga-Zn-Oxide TFT," AM-FPD '09 Digest of Technical Papers, Jul. 1, 2009, pp. 33-36.
Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Sakata et al., "Development of 4.0-In. AMOLED Display with Driver Circuit Using Amorphous In-Ga-Zn-Oxide TFTs," IDW '09: Proceedings of the 16th International Display Workshops, 2009, pp. 689-692.
International Search Report (Application No. PCT/JP2010/061298) Dated Aug. 17, 2010.
Written Opinion (Application No. PCT/JP2010/061298) Dated Aug. 17, 2010.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Nakamura.M, "Synthesis of Homologous Compound with New Long-Period Structure,", NIRIM Newsletter, Mar. 1, 1995, vol. 150, pp. 1-4.
Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.
Janotti.A et al., "Oxygen Vacancies in ZnO,", Appl. Phys. Lett. (Applied Physics Letters), 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

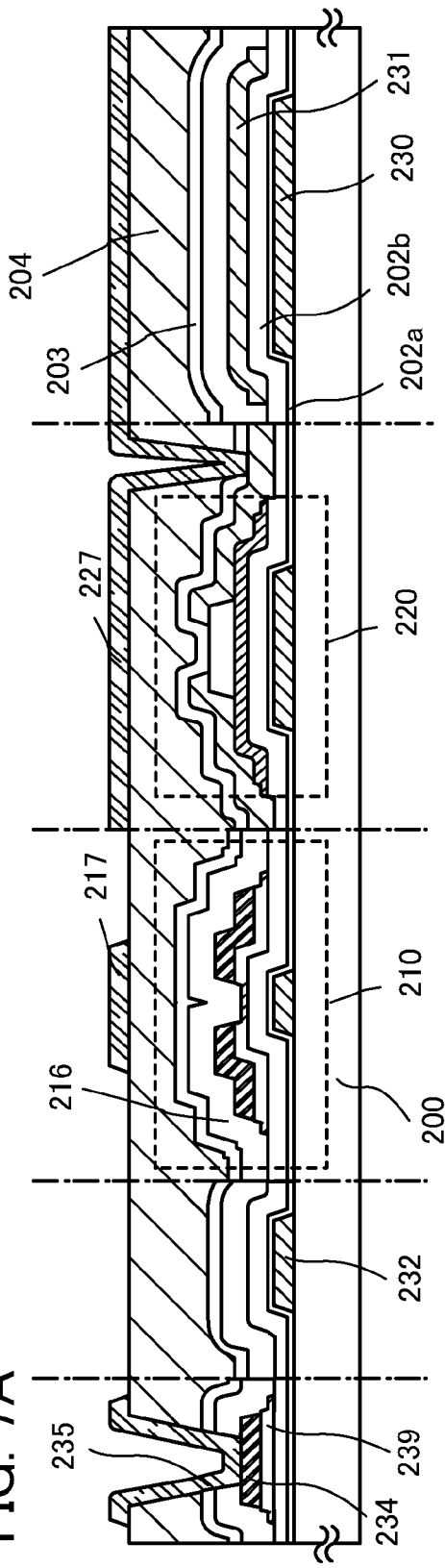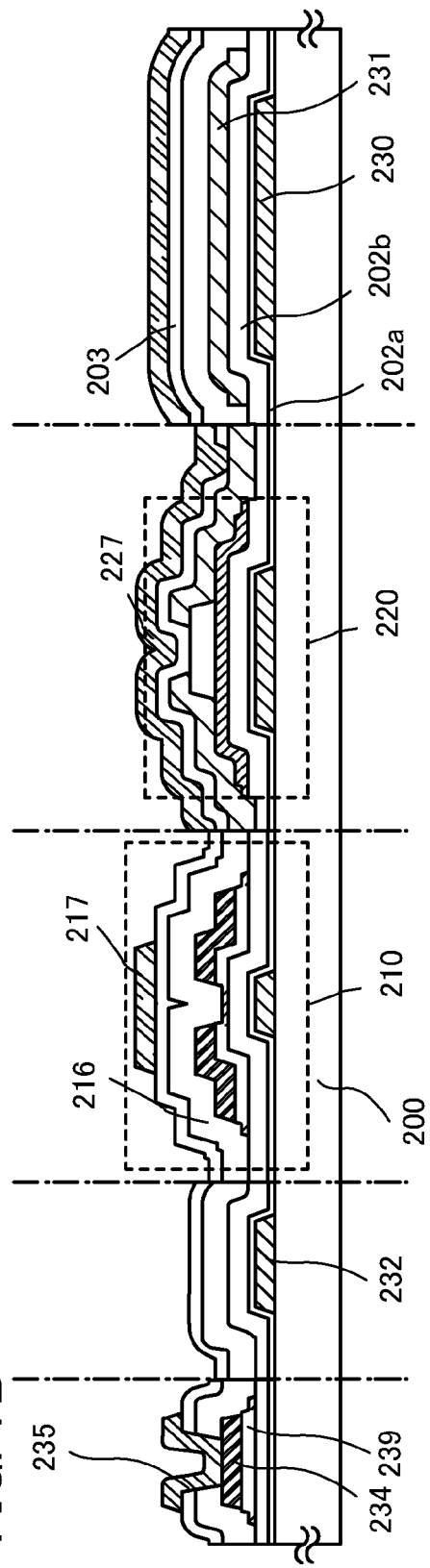

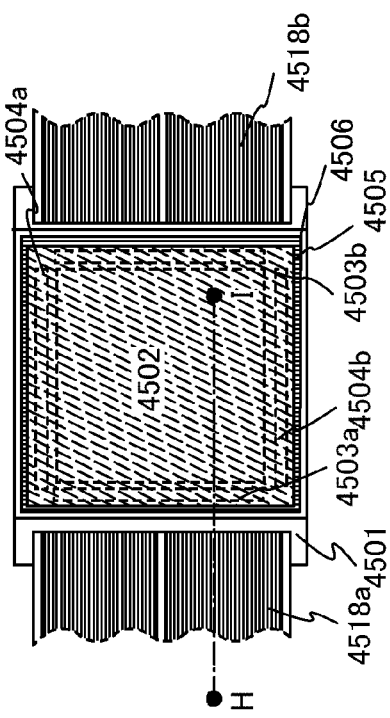
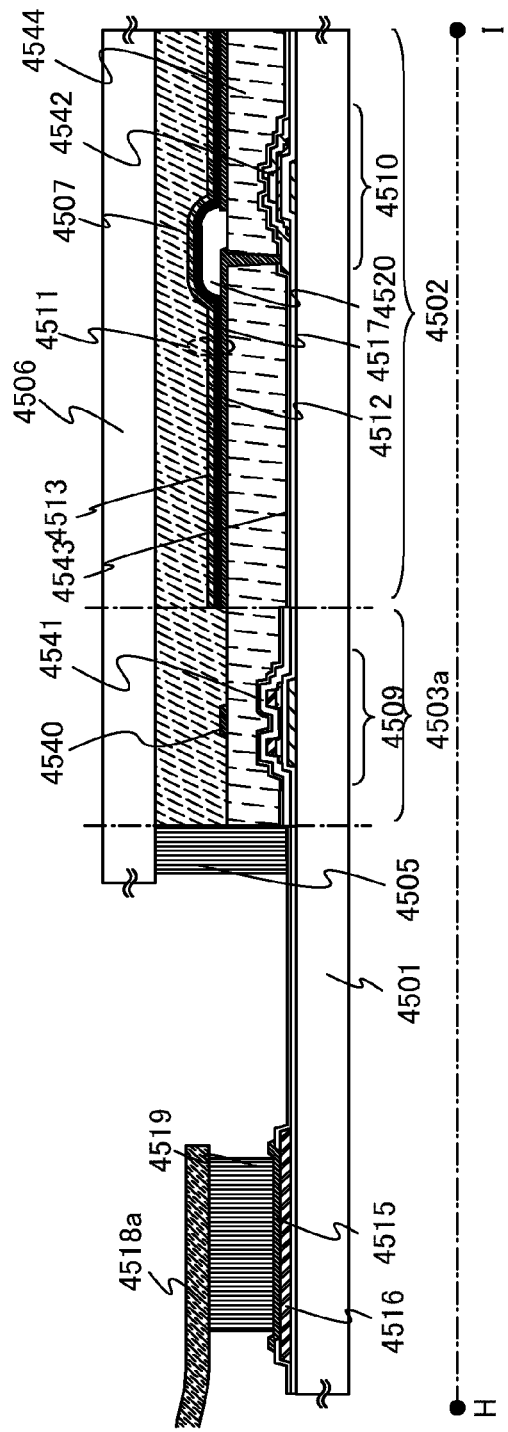
FIG. 11A
FIG. 11B

SEMICONDUCTOR DEVICE AND METHOD FOR MANUFACTURING THE SAME

TECHNICAL FIELD

The present invention relates to semiconductor devices including oxide semiconductors and manufacturing methods thereof.

Note that semiconductor devices in this specification refer to all devices that can function by utilizing semiconductor properties, and electro-optical devices such as display devices, semiconductor circuits, and electronic devices are all semiconductor devices.

BACKGROUND ART

Light-transmitting metal oxides have been used in semiconductor devices. For example, conductive metal oxides (hereinafter referred to as oxide conductors) such as indium tin oxide (ITO) are used as materials for transparent electrodes that are necessary in display devices such as liquid crystal displays.

Moreover, light-transmitting metal oxides have attracted attention as materials having semiconductor properties. For example, In—Ga—Zn—O-based oxides and the like have been expected to be used as semiconductor materials that are necessary in display devices such as liquid crystal displays. In particular, they have been expected to be used for channel layers in thin film transistors (hereinafter also referred to as TFTs).

TFTs that include metal oxides having semiconductor properties (hereinafter such oxides are referred to as oxide semiconductors) can be formed by low-temperature processes. Thus, the oxide semiconductors have been increasingly expected to surpass or replace amorphous silicon used in display devices and the like.

The use of oxide conductors and oxide semiconductors that have light-transmitting properties enables the production of light-transmitting TFTs (e.g., see Reference 1).

Furthermore, a TFT including an oxide semiconductor as a channel layer has high field effect mobility. Therefore, a driver circuit in a display device or the like can be formed using such TFTs (e.g., see Reference 2).

REFERENCE

Reference 1: T. Nozawa. "Transparent Circuitry", Nikkei Electronics, No. 959, Aug. 27, 2007, pp. 39-52

Reference 2: T. Osada, et al., "Development of Driver-Integrated Panel using Amorphous In—Ga—Zn-Oxide TFT", Proc. SID '09 DIGEST, 2009, pp. 184-187

DISCLOSURE OF INVENTION

An object of one embodiment of the present invention is to reduce manufacturing costs of a semiconductor device.

An object of one embodiment of the present invention is to increase the aperture ratio of a semiconductor device.

An object of one embodiment of the present invention is to realize higher definition of an image displayed on a display portion in a semiconductor device.

An object of one embodiment of the present invention is to provide a semiconductor device that can operate at high speed.

One embodiment of the present invention is a semiconductor device including a driver circuit portion and a display portion (also referred to as a pixel portion) over the same substrate. The driver circuit portion includes a driver circuit thin film transistor and a driver circuit wiring. A source electrode (also referred to as a source electrode layer) and a drain electrode (also referred to as a drain electrode layer) of the driver circuit thin film transistor are formed using a metal. A semiconductor layer of the driver circuit thin film transistor is formed using an oxide semiconductor. The driver circuit wiring is formed using a metal. The display portion includes a pixel thin film transistor and a display portion wiring. A source electrode layer and a drain electrode layer of the pixel thin film transistor are formed using an oxide conductor. A semiconductor layer of the pixel thin film transistor is formed using an oxide semiconductor. The display portion wiring is formed using an oxide conductor.

As the pixel thin film transistor and the driver circuit thin film transistor, an inverted staggered thin film transistor with a bottom-gate structure is used. The pixel thin film transistor is a channel protection (channel stop) thin film transistor in which a channel protective layer is provided over a channel formation region in a semiconductor layer, whereas the driver circuit thin film transistor is a channel-etched thin film transistor which has a source electrode layer and a drain electrode layer overlapping with an oxide semiconductor layer and which is provided with an oxide insulating layer in contact with a region of the oxide semiconductor layer between the source electrode layer and the drain electrode.

In a method for manufacturing a semiconductor device including a thin film transistor, an etching step is performed with the use of a mask layer formed using a multi-tone mask which is a light-exposure mask through which light is transmitted so as to have a plurality of intensities.

Since a mask layer formed using a multi-tone mask has a plurality of thicknesses and can be further changed in shape by performing etching, the mask layer can be used in a plurality of etching steps for providing different patterns. Consequently, a mask layer corresponding at least two kinds of different patterns can be formed by one multi-tone mask. Thus, the number of light-exposure masks can be reduced and the number of corresponding photolithography steps can also be reduced, whereby a process can be simplified.

Reference 1 does not disclose a specific manufacturing process of a TFT and a specific structure of another element (e.g., a capacitor) included in a semiconductor device. Moreover, it does not contain a description of manufacture of a driver circuit and a light-transmitting TFT on the same substrate.

In a semiconductor device which is one embodiment of the present invention, a driver circuit portion including a driver circuit TFT and a display portion including a pixel TFT are formed over the same substrate. Consequently, manufacturing costs of the semiconductor device can be reduced.

In a semiconductor device which is one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. In other words, a region where the pixel TFT and the display portion wiring are formed can be used as a display region in a pixel portion. Thus, the aperture ratio of the semiconductor device can be increased.

In a semiconductor device which is one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. In other words, the size of a pixel in the semiconductor device can be set without being limited by the size of the pixel TFT. Thus, it is possible to achieve higher definition of images displayed on the display portion in the semiconductor device.

In a semiconductor device which is one embodiment of the present invention, a driver circuit portion includes a driver circuit TFT and a driver circuit wiring. A source electrode and a drain electrode of the driver circuit TFT are formed using a metal. A channel layer of the driver circuit TFT is formed using an oxide semiconductor. The driver circuit wiring is formed using a metal. In other words, the driver circuit in the semiconductor device includes a TFT with high field effect mobility and a low-resistance wiring. Thus, the semiconductor device can operate at high speed.

An oxide semiconductor used in this specification forms a thin film represented by $InMO_3(ZnO)_m$ (m>0), and a thin film transistor is manufactured by using the thin film as an oxide semiconductor layer. Note that M represents one or more metal elements selected from Ga, Fe, Ni, Mn, or Co. As an example, M may be Ga or may include the above metal element in addition to Ga, for example, M may be Ga and Ni or Ga and Fe. Moreover, in the above oxide semiconductor, a transition metal element such as Fe or Ni or an oxide of the transition metal is sometimes contained as an impurity element in addition to the metal element contained as M. In this specification, among oxide semiconductors having a composition formula expressed by $InMO_3(ZnO)_m$ (m>0), an oxide semiconductor that includes Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for the oxide semiconductor layer, any of the following metal oxides can be used in addition to the above: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be contained in the oxide semiconductor layer formed using any of the above metal oxides.

In the process for manufacturing the above-mentioned semiconductor device, when heat treatment is performed in an inert gas atmosphere of nitrogen or a rare gas (e.g., argon or helium) or under a reduced pressure, an oxide semiconductor layer is changed into an oxygen-deficient oxide semiconductor layer by the heat treatment so as to be a low-resistance oxide semiconductor layer, that is, an n-type (e.g., $n^-$-type) oxide semiconductor layer. Then, the oxide semiconductor layer is made to be in an oxygen-excess state by the formation of an oxide insulating film that is in contact with the oxide semiconductor layer. Accordingly, part of the oxide semiconductor layer is changed into a high-resistance oxide semiconductor layer, that is, an i-type (intrinsic) oxide semiconductor layer. Thus, it is possible to manufacture a semiconductor device including a highly reliable thin film transistor with favorable electrical characteristics.

The above-mentioned heat treatment is performed at a temperature which is higher than or equal to 350° C., preferably higher than or equal to 400° C., and lower than the strain point of a substrate in an inert gas atmosphere of nitrogen or a rare gas (e.g., argon or helium) or under a reduced pressure. In this heat treatment, the oxide semiconductor layer undergoes dehydration or dehydrogenation, which results in the reduction of impurities such as moisture contained in the oxide semiconductor layer.

The oxide semiconductor layer is subjected to heat treatment for dehydration or dehydrogenation under a condition that two peaks of water or at least one peak of water at around 300° C. is not detected even if thermal desorption spectroscopy (TDS) is performed at up to 450° C. on the oxide semiconductor layer subjected to dehydration or dehydrogenation. Therefore, even if TDS is performed at up to 450° C. on a thin film transistor including an oxide semiconductor layer subjected to dehydration or dehydrogenation, at least the peak of water at around 300° C. is not detected.

Cooling after the heat treatment is carried out so that the oxide semiconductor layer does not contact with water and hydrogen, which is achieved by performing the cooling in a furnace used for dehydration or dehydrogenation without exposure of the oxide semiconductor layer to the air. When a thin film transistor is formed using an oxide semiconductor layer obtained by changing an oxide semiconductor layer into a low-resistance oxide semiconductor layer, that is, an n-type (e.g., $n^-$-type) oxide semiconductor layer by dehydration or dehydrogenation and then by changing the low-resistance oxide semiconductor layer into a high-resistance oxide semiconductor layer so as to be an i-type oxide semiconductor layer, the threshold voltage of the thin film transistor can be positive voltage, so that a so-called normally-off switching element can be realized. It is preferable for a semiconductor device (a display device) that a channel in a thin film transistor be formed with a positive threshold voltage and as close to 0 V as possible. If the threshold voltage of the thin film transistor is negative, it tends to be normally on; in other words, current flows between the source electrode and the drain electrode even when the gate voltage is 0 V. In an active matrix display device, electrical characteristics of a thin film transistor included in a circuit are important and performance of the display device depends on the electrical characteristics of the thin film transistor. Among the electrical characteristics of thin film transistor, the threshold voltage (Vth) is particularly important. If the threshold voltage is high or negative even when the field effect mobility is high, it is difficult to control the circuit. When a thin film transistor has a high threshold voltage whose absolute value is large, the thin film transistor driven at low voltage cannot perform a switching function as the TFT and might be a load. In the case of an n-channel thin film transistor, it is preferable that a channel be formed and drain current flows after positive voltage is applied as gate voltage. A transistor in which a channel is not formed unless the driving voltage is raised and a transistor in which a channel is formed and drain current flows even when negative voltage is applied are not suitable for a thin film transistor used in a circuit.

Cooling after the heat treatment may be carried out after switching the gas used in heating to a different gas. For example, cooling may be performed while the furnace used for dehydration or dehydrogenation is filled with a high-purity oxygen gas, a high-purity $N_2O$ gas, or an ultra-dry air (with a dew point of −40° C. or lower, preferably −60° C. or lower) without exposure of the oxide semiconductor layer to the air.

By using an oxide semiconductor film cooled slowly (or cooled) in an atmosphere that does not contain moisture (with a dew point of −40° C. or lower, preferably −60° C. or lower) after moisture contained in the film is reduced by heat treatment for dehydration or dehydrogenation, the electrical characteristics of a thin film transistor are improved and high-performance thin film transistors that can be mass-produced are realized.

In this specification, heat treatment in an inert gas atmosphere of nitrogen or a rare gas (e.g., argon or helium) or under a reduced pressure is referred to as heat treatment for dehydration or dehydrogenation. In this specification, for convenience, dehydration or dehydrogenation refer not only to elimination of $H_2$ but also to elimination of H, OH, or the like.

As mentioned above, by the heat treatment for dehydration or dehydrogenation, the oxide semiconductor layer is changed into an oxygen-deficient oxide semiconductor layer by the heat treatment so as to be a low-resistance oxide semiconductor layer, that is, an n-type (e.g., $n^-$-type) oxide semiconductor layer. Therefore, the formation of a drain electrode layer over the low-resistance oxide semiconductor layer allows a region overlapping with the drain electrode layer to be as a high-resistance drain region (also referred to as an HRD region) which is an oxygen-deficient region.

Specifically, the carrier concentration of the high-resistance drain region is higher than or equal to $1\times10^{17}/cm^3$ and is at least higher than the carrier concentration of a channel formation region (lower than $1\times10^{17}/cm^3$). Note that the carrier concentration in this specification refers to a value of carrier concentration obtained by Hall effect measurement at room temperature.

Then, a channel formation region is formed in such a manner that at least part of the oxide semiconductor layer subjected to dehydration or dehydrogenation is made to be in an oxygen-excess state so as to be a high-resistance oxide semiconductor layer, that is, an i-type oxide semiconductor layer. Note that as the treatment for making part of the dehydrated or dehydrogenated oxide semiconductor layer be in an oxygen-excess state, any of the following methods is employed: deposition of an oxide insulating film by sputtering on and in contact with the dehydrated or dehydrogenated oxide semiconductor layer; heat treatment for the oxide insulating film formed over and in contact with the dehydrated or dehydrogenated oxide semiconductor layer; heat treatment for the oxide insulating film formed on and in contact with the dehydrated or dehydrogenated oxide semiconductor layer in an atmosphere containing oxygen; heat treatment for the oxide insulating film formed on and in contact with the dehydrated or dehydrogenated oxide semiconductor layer in an inert gas atmosphere, which is followed by the cooling treatment in an oxygen atmosphere; and heat treatment for the oxide insulating film formed on and in contact with the dehydrated or dehydrogenated oxide semiconductor layer in an inert gas atmosphere, which is followed by cooling treatment in ultra-dry air (having a dew point of −40° C. or lower, preferably −60° C. or lower).

Further, at least part of the dehydrated or dehydrogenated oxide semiconductor layer (a portion overlapping with a gate electrode layer) can be selectively made to be in an oxygen-excess state, which allows the part to be a high-resistance oxide semiconductor layer, i.e., an i-type oxide semiconductor layer. Hence, the channel formation region can be formed. For example, the channel formation region can be formed in such a manner that a source electrode layer and a drain electrode layer formed using metal electrodes of Ti or the like are formed on and in contact with the dehydrated or dehydrogenated oxide semiconductor layer and then the exposure regions that do not overlap with at least one of the source electrode layer and the drain electrode layer are selectively made to be in an oxygen-excess state. When the exposure regions are selectively made to be in an oxygen-excess state, a first high-resistance drain region overlapping with the source electrode layer and a second high-resistance drain region overlapping with the drain electrode layer are formed, and a region between the first high-resistance drain region and the second high-resistance drain region serves as the channel formation region. That is, the channel formation region is formed between the source electrode layer and the drain electrode layer in a self-aligned manner.

Consequently, it is possible to manufacture a semiconductor device including a highly reliable thin film transistor with favorable electrical characteristics.

Note that by forming the high-resistance drain regions in the oxide semiconductor layer overlapping with the drain electrode layer (and the source electrode layer), the reliability of a driver circuit to be formed can be improved. Specifically, by forming the high-resistance drain region, the conductivity can vary from the drain electrode layer to the high-resistance drain region and the channel formation region. Therefore, in the case where operation is performed with the drain electrode layer connected to a wiring for supplying a high power supply potential VDD, the high-resistance drain region serves as a buffer and a high electric field is not applied locally even if the high electric field is applied between the gate electrode layer and the drain electrode layer, so that the withstand voltage of the transistor can be improved.

Moreover, when the high-resistance drain region is formed in the oxide semiconductor layer overlapping with the drain electrode layer (and the source electrode layer), the amount of leakage current in the channel formation region in a driver circuit to be formed can be reduced. Specifically, by forming the high-resistance drain region, the leakage current of the transistor, which flows between the drain electrode layer and the source electrode layer, flows sequentially through the drain electrode layer, the high-resistance drain region on the drain electrode layer side, the channel formation region, the high-resistance drain region on the source electrode layer side, and the source electrode layer. In that case, in the channel formation region, leakage current flowing from a low-resistance n-type region on the drain electrode layer side to the channel formation region can be concentrated on the vicinity of an interface between the channel formation region and a gate insulating layer, which has high resistance when the transistor is off. Thus, the amount of leakage current in a back channel portion (part of a surface of the channel formation region, which is apart from the gate electrode layer) can be reduced.

Furthermore, the first high-resistance drain region overlapping with the source electrode layer and the second high-resistance drain region overlapping with the drain electrode layer may be formed so that they overlap with part of the gate electrode layer which allows the intensity of an electric field in the vicinity of an edge of the drain electrode layer to be reduced more effectively.

One embodiment of a structure of the invention disclosed in this specification is a semiconductor device including, over one substrate, a pixel portion including a first thin film transistor; and a driver circuit including a second thin film transistor. The first thin film transistor includes a gate electrode layer over the substrate; a gate insulating layer over the gate electrode layer; an oxide semiconductor layer including a thin end region, over the gate insulating layer; a first oxide insulating layer in contact with part of the oxide semiconductor layer; a source electrode layer and a drain electrode layer over the first oxide insulating layer and the oxide semiconductor layer; and a pixel electrode layer over the first oxide insulating layer. The gate electrode layer, the gate insulating layer, the oxide semiconductor layer, the source electrode layer, the drain electrode layer, the first oxide insulating layer, and the pixel electrode layer of the first thin film transistor have light-transmitting properties. A source electrode layer and a drain electrode layer of the second thin film transistor are covered with a second oxide insulating layer. A material for the source electrode layer and the drain electrode layer of the second thin film transistor is different from a material for the source electrode layer and the drain electrode layer of the first thin film transistor, and is a conductive material with a lower resistance than the material for the source electrode layer and the drain electrode layer of the first thin film transistor.

One embodiment of a structure of the invention disclosed in this specification is as follows. A first gate electrode and a second gate electrode are formed. A gate insulating layer is formed over the first gate electrode layer and the second gate electrode layer. An oxide semiconductor film is formed over the gate insulating layer. Dehydration or dehydrogenation is performed on the oxide semiconductor film and then water and hydrogen are prevented from entering the oxide semiconductor film, with the oxide semiconductor film not exposed to air. A conductive film is formed over the oxide semiconductor film. A resist mask is formed over the oxide semiconductor film and the conductive film. The oxide semiconductor film and the conductive film are etched with the resist mask. Ashing is performed on the resist mask and etching is performed on the etched oxide semiconductor film and the etched conductive film with the resist mask subjected to the ashing, to form a first oxide semiconductor layer overlapping with the first gate electrode layer, a second oxide semiconductor layer overlapping with the second gate electrode layer, and a second source electrode and a second drain electrode layer. A first oxide insulating layer is formed in a region where the first oxide semiconductor layer overlaps with the first gate electrode layer, and a second oxide insulating layer is formed in contact with part of the second oxide semiconductor layer. A first source electrode layer and a first drain electrode layer are formed over the first oxide semiconductor layer and the first oxide insulating layer. A protective insulating layer is formed over the first oxide insulating layer, the first source electrode layer, the first drain electrode layer, and the second oxide insulating layer. A pixel electrode layer electrically connected to the first source electrode layer or the first drain electrode layer, and a conductive layer overlapping with the second oxide semiconductor layer are formed over the protective insulating layer.

The resist mask is formed using a light-exposure mask. A multi-tone mask is used as the light-exposure mask. As the multi-tone mask, a half-tone mask or a gray-tone mask may be used.

In the above-described structure, an oxide semiconductor layer of the second thin film transistor may have a region thinner than a region overlapping with the source electrode layer or the drain electrode layer. Alternatively, the oxide semiconductor layer of the second thin film transistor may have a channel formation region thinner than the region overlapping with the source electrode layer or the drain electrode layer, and a conductive layer may be provided over the channel formation region with the second oxide insulating layer therebetween.

Since the first oxide insulating layer and the second oxide insulating layer can be formed in the same step, they can be formed using the same light-transmitting insulating material.

Furthermore, the source electrode layer and the drain electrode layer of the second thin film transistor are preferably formed using a film containing an element selected from Al, Cr, Cu, Ta, Ti, Mo, and W or a stacked film including any of these elements.

On the other hand, the source electrode layer, the drain electrode layer, and the pixel electrode layer of the first thin film transistor are preferably formed using a light-transmitting conductive film of indium oxide, an alloy of indium oxide and tin oxide, an alloy of indium oxide and zinc oxide, zinc oxide, or the like.

In the above-described structure, a capacitor portion may be provided over the substrate; the capacitor portion may include a capacitor wiring and a capacitor electrode overlapping with the capacitor wiring; and the capacitor wiring and the capacitor electrode may have light-transmitting properties.

The oxide semiconductor layer of the second thin film transistor may include a high-resistance drain region overlapping with the source electrode layer or the drain electrode layer.

Note that the ordinal numbers such as "first" and "second" are used for convenience and do not denote the order of steps and the stacking order of layers. In addition, the ordinal numbers in this specification do not denote particular names that specify the present invention.

Examples of display devices including driver circuits are a light-emitting display device including a light-emitting element and a display device including an electrophoretic display element, which is also referred to as an electronic paper, in addition to a liquid crystal display device.

A light-emitting display device including a light-emitting element includes a plurality of thin film transistors in a pixel portion, and the pixel portion has a region where a gate electrode of one thin film transistor is connected to a source wiring (also referred to as a source wiring layer) or a drain wiring (also referred to as a drain wiring layer) of another thin film transistor. In addition, a driver circuit in a light-emitting display device including a light-emitting element has a region where a gate electrode of a thin film transistor is connected to a source wiring or a drain wiring of the thin film transistor.

A thin film transistor with stable electrical characteristics can be manufactured. Consequently, a semiconductor device including a thin film transistor with favorable electrical characteristics and high reliability can be provided.

A photolithography process is simplified by reducing the number of light-exposure masks. Thus, a semiconductor device can be manufactured at low cost with high productivity.

BRIEF DESCRIPTION OF DRAWINGS

In the accompanying drawings:

FIGS. 7A and 7B each illustrate a semiconductor device;

FIGS. 10A-1, 10A-2, and 10B each illustrate a semiconductor device;

FIGS. 11A and 11B illustrate a semiconductor device;

BEST MODE FOR CARRYING OUT THE INVENTION

Figures 1, 1A:
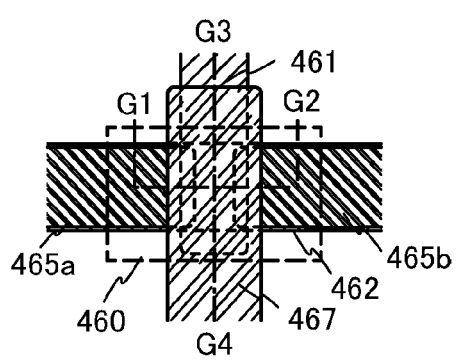
FIGS. 1A-1, 1A-2, 1B, and 1C illustrate a semiconductor device.

Embodiments will be described in detail with reference to the accompanying drawings. Note that the present invention is not limited to the following description, and it can be easily understood by those skilled in the art that the mode and detail can be changed variously without departing from the sprit and scope of the present invention. Therefore, the present invention is not construed as being limited to the description of the following embodiments. In the structures to be given below, the same portions or portions having similar functions are denoted by the same reference numerals in different drawings, and explanation thereof will not be repeated.

(Embodiment 1)

One embodiment of a semiconductor device and a method of manufacturing a semiconductor device will be described with reference to FIGS. 1A-1, 1A-2, 1B, and 1C, FIGS. 2A to 2E, and FIGS. 3A to 3E.

FIGS. 1A-1, 1A-2, 1B, and 1C illustrate examples of cross-sectional structures of two transistors with different structures formed over one substrate. In FIGS. 1A-1, 1A-2, 1B, and 1C, a thin film transistor 460 has a kind of bottom-gate structure called a channel-etched type, and a thin film transistor 470 has a kind of bottom-gate structure called a channel protection type (also referred to as a channel stop type). The thin film transistors 460 and 470 are also referred to as inverted staggered thin film transistors.

FIG. 1A-1 is a plan view of the channel-etched thin film transistor 460 arranged in a driver circuit. FIG. 1B illustrates a cross-sectional view along line G1-G2 in FIG. 1A-1. FIG. 1C illustrates a cross-sectional view along line G3-G4 in FIG. 1A-1.

The thin film transistor 460 arranged in the driver circuit is a channel-etched thin film transistor and includes a gate electrode layer 461; a first gate insulating layer 452a; a second gate insulating layer 452b; an oxide semiconductor layer 462 including at least a channel formation region 463, a first high-resistance drain region 464a, and a second high-resistance drain region 464b; a source electrode layer 465a; and a drain electrode layer 465b over a substrate 450 having an insulating surface. Moreover, an oxide insulating layer 466 which covers the thin film transistor 460 and is in contact with the channel formation region 463 is provided.

The first high-resistance drain region 464a is formed in contact with a bottom surface of the source electrode layer 465a in a self-aligned manner. The second high-resistance drain region 464b is formed in contact with a bottom surface of the drain electrode layer 465b in a self-aligned manner. The channel formation region 463 is in contact with the oxide insulating layer 466, has smaller thickness than the first high-resistance drain region 464a and the second high-resistance drain region 464b, and is a region (an i-type region) with higher resistance than the first high-resistance drain region 464a and the second high-resistance drain region 464b.

In order to make the resistance of the wiring lower in the thin film transistor 460, a metal material is preferably used for the source electrode layer 465a and the drain electrode layer 465b.

When a pixel portion and a driver circuit are formed over one substrate in a liquid crystal display device, in the driver circuit, only one of positive voltage or negative voltage is applied between a source electrode and a drain electrode of a thin film transistor included in a logic gate such as an inverter circuit, a NAND circuit, a NOR circuit, or a latch circuit and a thin film transistor included in an analog circuit such as a sense amplifier, a constant voltage generation circuit, or a voltage controlled oscillator (VCO). Consequently, the width of the second high-resistance drain region 464b, which is the region that needs high withstand voltage, may be designed to be larger than the width of the first high-resistance drain region 464a, which is the other region. Moreover, the width of the first high-resistance drain region 464a and the second high-resistance drain region 464b that overlap with the gate electrode layer may be increased.

The thin film transistor 460 arranged in the driver circuit is described using a single-gate thin film transistor; a multi-gate thin film transistor including a plurality of channel formation regions can be formed when needed.

Furthermore, a conductive layer 467 is provided above the channel formation region 463 so as to overlap with the channel formation region 463. The conductive layer 467 is electrically connected to the gate electrode layer 461 so that the conductive layer 467 and the gate electrode layer 461 have the same potential, whereby a gate voltage can be applied from above and below the oxide semiconductor layer placed between the gate electrode layer 461 and the conductive layer 467. Alternatively, when the gate electrode layer 461 and the conductive layer 467 are made to have different potentials, for example, when the conductive layer 467 has a fixed potential, GND, or 0 V, electrical characteristics of the TFT, such as the threshold voltage, can be controlled. In other words, the gate electrode layer 461 functions as a first gate electrode layer and the conductive layer 467 functions as a second gate electrode layer, whereby the thin film transistor 460 can be used as a thin film transistor having four terminals.

Further, a protective insulating layer 453 and a planarization insulating layer 454 are stacked between the conductive layer 467 and the oxide insulating layer 466.

The protective insulating layer 453 is preferably in contact with the first gate insulating layer 452a provided below the protective insulating layer 453 or an insulating film serving as a base, and blocks entry of impurities such as moisture, a hydrogen ion, and OH⁻. It is particularly effective to use a silicon nitride film as the first gate insulating layer 452a or the insulating film serving as the base, which is in contact with the protective insulating layer 453.

Figures 1, 1A, 2:
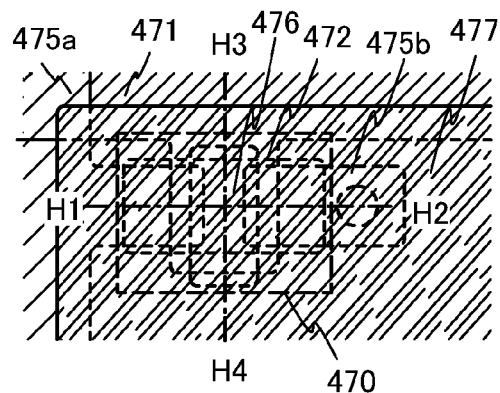
Figure 1B:
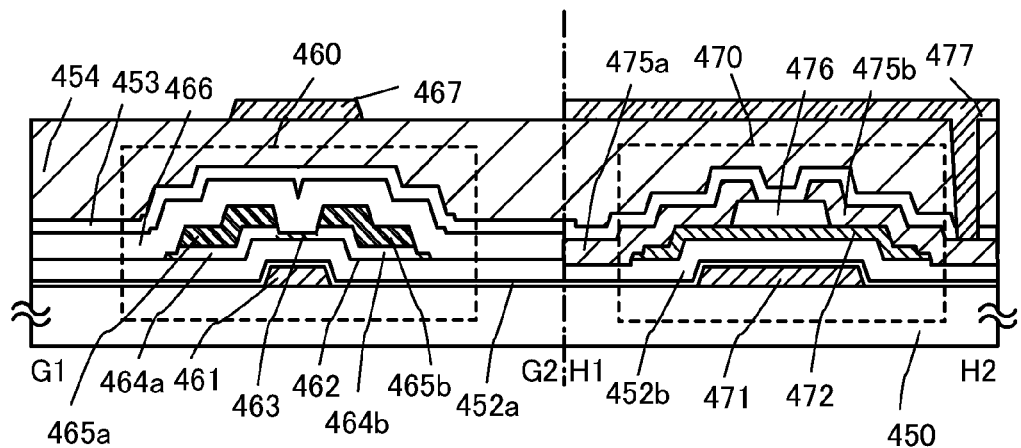
Figure 1C:
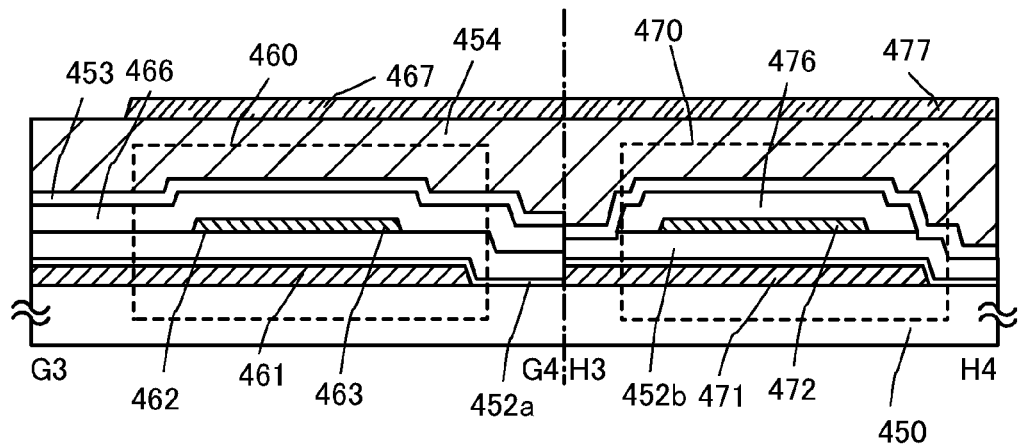

FIG. 1A-2 is a plan view of the channel protection thin film transistor 470 arranged in a pixel. FIG. 1B illustrates a cross-sectional view along line H1-H2 in FIG. 1A-2. FIG. 1C illustrates a cross-sectional view along line H3-H4 in FIG. 1A-2.

The thin film transistor 470 arranged in the pixel is a channel protection thin film transistor and includes a gate electrode layer 471, the first gate insulating layer 452a, the second gate insulating layer 452b, an oxide semiconductor layer 472 including a channel formation region, an oxide insulating layer 476 functioning as a channel protective layer, a source electrode layer 475a, and a drain electrode layer 475b over the substrate 450 having an insulating surface. Moreover, the protective insulating layer 453 is provided so as to cover the thin film transistor 470 and to be in contact with the oxide insulating layer 476, the source electrode layer 475a, and the drain electrode layer 475b; the planarization insulating layer 454 is stacked over the protective insulating layer 453. A pixel electrode layer 477 is provided over the planarization insulating layer 454 to be in contact with the drain electrode layer 475b and electrically connected to the thin film transistor 470.

Heat treatment for reducing impurities such as moisture (heat treatment for dehydration or dehydrogenation) is performed after an oxide semiconductor film is deposited. Reduction of the carrier concentration of the oxide semiconductor layer, for example, by forming an oxide insulating layer in contact with the oxide semiconductor layer after the heat treatment for dehydration or dehydrogenation and slow cooling leads to improvement of the electrical characteristics and reliability of the thin film transistor 470.

The channel formation region of the thin film transistor 470 arranged in the pixel is a region of the oxide semiconductor layer 472, which is in contact with the oxide insulating layer 476 which is the channel protective layer and overlaps with the gate electrode layer 471. Since the thin film transistor 470 is protected by the oxide insulating layer 476, the oxide semiconductor layer 472 can be prevented from being etched in an etching step for forming the source electrode layer 475a and the drain electrode layer 475b.

A light-transmitting conductive film is used for the source electrode layer 475a and the drain electrode layer 475b so that the thin film transistor 470 can realize a display device with a high aperture ratio as a light-transmitting thin film transistor.

Moreover, a light-transmitting conductive film is also used for the gate electrode layer 471 in the thin film transistor 470.

In the pixel in which the thin film transistor 470 is arranged, a conductive film that transmits visible light is used for the pixel electrode layer 477 or another electrode layer (e.g., a capacitor electrode layer) or another wiring layer (e.g., a capacitor wiring layer), which realizes a display device with a high aperture ratio. Needless to say, it is preferable to use a film that transmits visible light for the first gate insulating layer 452a, the second gate insulating layer 452b, and the oxide insulating layer 476.

In this specification, a film that transmits visible light refers to a film having a visible light transmittance of 75% to 100%; when the film has conductivity, it is also referred to as a transparent conductive film. Further, a conductive film that is semi-transparent to visible light may be used for a metal oxide applied to the gate electrode layer, the source electrode layer, the drain electrode layer, the pixel electrode layer, or another electrode layer or another wiring layer. Semi-transparency to visible light means that the visible light transmittance is 50% to 75%.

In the method for manufacturing the thin film transistors 460 and 470, etching is performed with the use of a mask layer formed by a multi-tone mask which is a light-exposure mask through which light is transmitted to have a plurality of intensities. Consequently, each of the oxide semiconductor layers 462 and 472 has a shape such that its end region is thin. Note that the thin region at the periphery of the oxide semiconductor layer 462 is in contact with the oxide insulating layer 466. When the oxide semiconductor layers 462 and 472 have a thin end region, they can be adequately covered with the oxide insulating layer 466 or the source electrode layer 475a and the drain electrode layer 475b which are stacked thereover.

Steps for manufacturing the thin film transistors 460 and 470 over one substrate will be described below with reference to FIGS. 2A to 2E and FIGS. 3A to 3E.

First, a light-transmitting conductive film is formed over the substrate 450 having an insulating surface, and then, the gate electrode layers 461 and 471 are formed in a first photolithography step. Moreover, a capacitor wiring layer is formed in a pixel portion from the same light-transmitting material as the gate electrode layers 461 and 471 in the first photolithography step. Furthermore, when a capacitor is necessary in a driver circuit as well as in the pixel portion, the capacitor wiring layer is also formed in the driver circuit. Note that a resist mask may be formed by an inkjet method. A photomask is not used when the resist mask is formed by an inkjet method, which results in reducing manufacturing costs.

Although there is no particular limitation on a light-transmitting substrate which can be used as the substrate 450 having an insulating surface, the light-transmitting substrate needs to have heat resistance high enough to withstand at least heat treatment to be performed later. As the substrate 450 having an insulating surface, a glass substrate of barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that a glass substrate is heat-resistant and of more practical use by containing a larger amount of barium oxide (BaO) than boron trioxide. Therefore, a glass substrate containing a larger amount of BaO than $B_2O_3$ is preferably used.

Note that a light-transmitting substrate formed of an insulator, such as a ceramic substrate, a quartz substrate, or a sapphire substrate, may be used instead of the glass substrate. Alternatively, crystallized glass or the like may be used.

An insulating film serving as a base film may be provided between the substrate 450 and the gate electrode layers 461 and 471. The base film has a function of preventing diffusion of an impurity element from the substrate 450, and can be formed with a single-layer structure or a layered structure using a silicon nitride film, a silicon oxide film, a silicon nitride oxide film, and/or a silicon oxynitride film.

As a material for the gate electrode layers 461 and 471, a conductive material that transmits visible light, for example, any of the following metal oxides can be used: an In—Sn—

Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thickness of the gate electrode layers 461 and 471 is set within the range of 50 nm to 300 nm as appropriate. The metal oxide used for the gate electrode layers 461 and 471 is deposited by a sputtering method, a vacuum evaporation method (e.g., an electron beam evaporation method), an arc discharge ion plating method, or a spray method. When a sputtering method is employed, it is preferable that deposition be performed using a target containing $SiO_2$ of 2 wt % to 10 wt % and SiOx (x>0) which inhibits crystallization be contained in the light-transmitting conductive film so as to prevent crystallization at the time of heat treatment for dehydration or dehydrogenation in a later step.

Next, a gate insulating layer is formed over the gate electrode layers 461 and 471.

The gate insulating layer can be formed with a single layer or a stack of a silicon oxide layer, a silicon nitride layer, a silicon oxynitride layer, and/or a silicon nitride oxide layer by a plasma CVD method, a sputtering method, or the like. For example, a silicon oxynitride layer may be formed using $SiH_4$, oxygen, and nitrogen as deposition gases by a plasma CVD method.

In this embodiment, the gate insulating layer is a stack of the first gate insulating layer 452a with a thickness of 50 nm to 200 nm and the second gate insulating layer 452b with a thickness of 50 nm to 300 nm As the first gate insulating layer 452a, a 100-nm-thick silicon nitride film or silicon nitride oxide film is used. As the second gate insulating layer 452b, a 100-nm-thick silicon oxide film is used.

An oxide semiconductor film 480 with a thickness of 2 nm to 200 nm is formed over the second gate insulating layer 452b. The oxide semiconductor film 480 preferably has a thickness of 50 nm or less so as to remain in an amorphous state even when heat treatment for dehydration or dehydrogenation is performed after the oxide semiconductor film 480 is formed. Reduction in thickness can prevent the oxide semiconductor film from being crystallized when heat treatment is performed after the formation of the oxide semiconductor layer.

Note that before the oxide semiconductor film 480 is formed by a sputtering method, dust attached to a surface of the second gate insulating layer 452b is preferably removed by reverse sputtering in which plasma is generated by introduction of an argon gas. The reverse sputtering refers to a method in which, without application of voltage to a target side, an RF power source is used for application of voltage to a substrate side in an argon atmosphere so that plasma is generated around the substrate to modify a surface. Note that instead of an argon atmosphere, nitrogen, helium, oxygen, or the like may be used.

Before the oxide semiconductor film 480 is deposited, the gate insulating layer may be subjected to heat treatment (400° C. or higher and lower than the strain point of the substrate) in an inert gas atmosphere (e.g., nitrogen, helium, neon, or argon) or an oxygen atmosphere or under a reduced pressure to remove impurities such as hydrogen and water included in the layer.

As the oxide semiconductor film 480, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film 480 is formed by a sputtering method with the use of an In—Ga—Zn—O-based oxide semiconductor target. Alternatively, the oxide semiconductor film 480 can be formed by a sputtering method in a rare gas (typically argon) atmosphere, an oxygen atmosphere, or an atmosphere including a rare gas (typically argon) and oxygen. When a sputtering method is employed, it is preferable that deposition be performed using a target containing $SiO_2$ of 2 wt % to 10 wt % and SiOx (x>0) which inhibits crystallization be contained in the oxide semiconductor film 480 so as to prevent crystallization at the time of the heat treatment for dehydration or dehydrogenation in a later step.

The oxide semiconductor film preferably contains In, more preferably contains In and Ga. Dehydration or dehydrogenation is effective in obtaining an i-type (intrinsic) oxide semiconductor film.

Then, the oxide semiconductor film 480 is subjected to dehydration or dehydrogenation. The temperature of first heat treatment for dehydration or dehydrogenation is 350° C. or higher and lower than the strain point of the substrate, preferably 400° C. or higher and lower than the strain point. Here, the substrate is put in an electric furnace which is a kind of heat treatment apparatus and heat treatment is performed on the oxide semiconductor film in a nitrogen atmosphere, and then, the oxide semiconductor film is not exposed to the air so that water and hydrogen are prevented from being mixed into the oxide semiconductor film. Thus, an oxide semiconductor film 481 is obtained (see FIG. 2B). In this embodiment, the same furnace is used in the temperature range from the heat temperature T at which the oxide semiconductor film is subjected to dehydration or dehydrogenation to a temperature low enough to prevent water from entering again; specifically, slow cooling is performed in a nitrogen atmosphere until the temperature drops by 100° C. or more from the heat temperature T. Note that without limitation to a nitrogen atmosphere, dehydration or dehydrogenation may be performed in a rare gas atmosphere (e.g., helium, neon, or argon) or under a reduced pressure.

Note that in the first heat treatment, it is preferable that water, hydrogen, and the like be not included in nitrogen or a rare gas such as helium, neon, or argon. For example, the purity of nitrogen or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

In some cases, the oxide semiconductor film is crystallized to be a microcrystalline film or a polycrystalline film depending on the conditions of the first heat treatment or the material of the oxide semiconductor film.

Next, the substrate is taken out from the heating apparatus after the first heat treatment, and a metal conductive film is formed over the oxide semiconductor film 481. A second photolithography step is performed on the oxide semiconductor film 481 and the metal conductive film. Examples of the material for the metal conductive film are an element selected from Al, Cr, Cu, Ta, Ti, Mo, and W; an alloy containing any of these elements as a component; and an alloy containing these elements in combination.

The metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Needless to say, the metal conductive film may have a single-layer structure, a two-layer structure, or a layered structure of four layers or more.

Resist masks 482a and 482b are formed over the gate insulating layers 452a and 452b, the oxide semiconductor film 481, and the metal conductive film.

In this embodiment, an example in which light exposure using a high-tone mask is performed for forming the resist masks 482a and 482b is described. A resist is formed in order to form the resist masks 482a and 482b. As the resist, a positive resist or a negative resist can be used. A positive resist is employed here. The resist may be formed by a spin coating method or may be selectively formed by an inkjet method. When the resist is selectively formed by an inkjet method, a resist can be prevented from being formed in an unintended portion, which results in reducing waste of the material.

Next, the resist is irradiated with light using a multi-tone mask as a light-exposure mask, so that the resist is exposed to light.

Here, light exposure using the multi-tone mask is described with reference to FIGS. 39A to 39D.

A multi-tone mask can perform three levels of light exposure to obtain an exposed portion, a half-exposed portion, and an unexposed portion. A multi-tone mask is a mask through which light is transmitted to have a plurality of intensities. One-time light exposure and development process can form a resist mask with regions of plural thicknesses (typically, two kinds of thicknesses). Consequently, the number of light-exposure masks can be reduced by using a multi-tone mask.

Figure 39A:
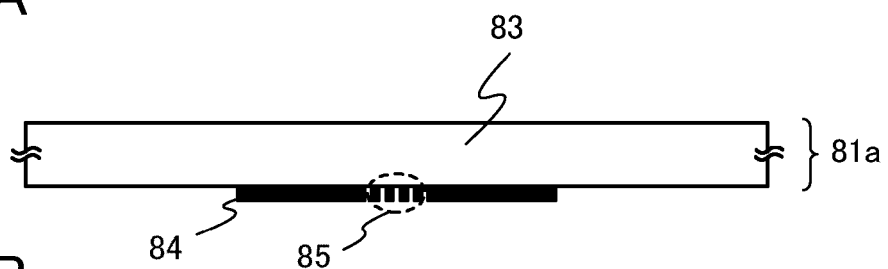
FIGS. 39A to 39D illustrate multi-tone masks.
Figure 39B:
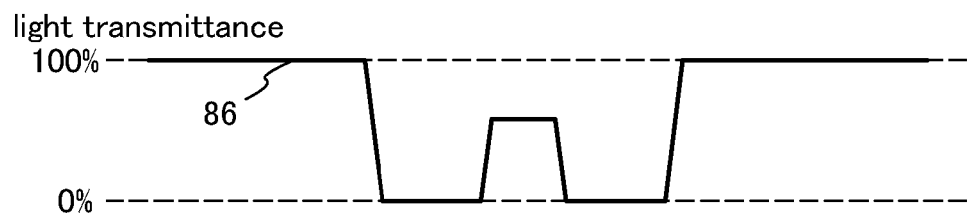
Figure 39C:
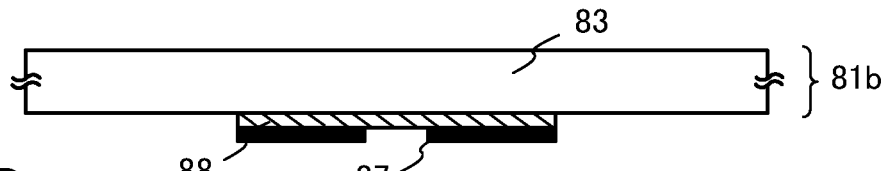

Typical examples of the multi-tone mask are a gray-tone mask 81a illustrated in FIG. 39A and a half-tone mask 81b illustrated in FIG. 39C.

As illustrated in FIG. 39A, the gray-tone mask 81a includes a light-transmitting substrate 83, and a light-blocking portion 84 and a diffraction grating 85 that are formed on the light-transmitting substrate 83. The light transmittance of the light-blocking portion 84 is 0%. The diffraction grating 85 has a light-transmitting portion in a slit form, a dot form, a mesh form, or the like with intervals that are less than or equal to the resolution limit of light used for the exposure, whereby the light transmittance can be controlled. Note that the diffraction grating 85 can be in a slit form, a dot form, or a mesh form with regular intervals; or in a slit form, a dot form, or a mesh form with irregular intervals.

As the light-transmitting substrate 83, a light-transmitting substrate such as a quartz substrate can be used. The light-blocking portion 84 and the diffraction grating 85 can be formed using a light-blocking material that absorbs light, such as chromium or chromium oxide.

When the gray-tone mask 81a is irradiated with light for exposure, a light transmittance 86 of the light-blocking portion 84 is 0% and the light transmittance 86 of a region where the light-blocking portion 84 and the diffraction grating 85 are not provided is 100% as illustrated in FIG. 39B. The light transmittance 86 of the diffraction grating 85 can be controlled in the range of 10% to 70%. The light transmittance of the diffraction grating 85 can be controlled by adjusting the interval or pitch of slits, dots, or meshes of the diffraction grating.

As illustrated in FIG. 39C, the half-tone mask 81b includes the light-transmitting substrate 83, and a semi-transmissive portion 87 and a light-blocking portion 88 that are formed on the light-transmitting substrate 83. The semi-transmissive portion 87 can be formed using MoSiN, MoSi, MoSiO, MoSiON, CrSi, or the like. The light-blocking portion 88 can be formed using a light-blocking material that absorbs light, such as chromium or chromium oxide.

Figure 39D:
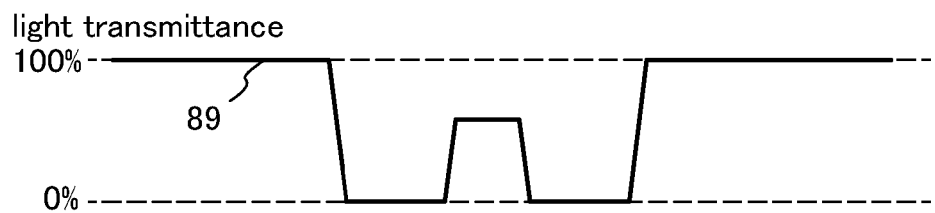

When the half-tone mask 81b is irradiated with light for exposure, a light transmittance 89 of the light-blocking portion 88 is 0% and the light transmittance 89 of a region where neither the light-blocking portion 88 nor the semi-transmissive portion 87 is provided is 100% as illustrated in FIG. 39D. Moreover, the light transmittance 89 of the semi-transmissive portion 87 can be controlled in the range of 10% to 70%. The light transmittance of the semi-transmissive portion 87 can be controlled with the material of the semi-transmissive portion 87.

Figure 2A:
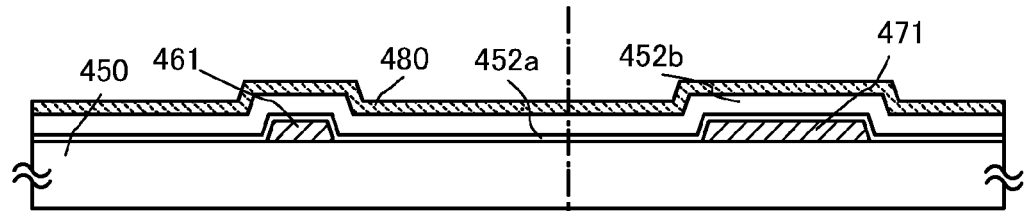
FIGS. 2A to 2E illustrate a method for manufacturing a semiconductor device.
Figure 2B:
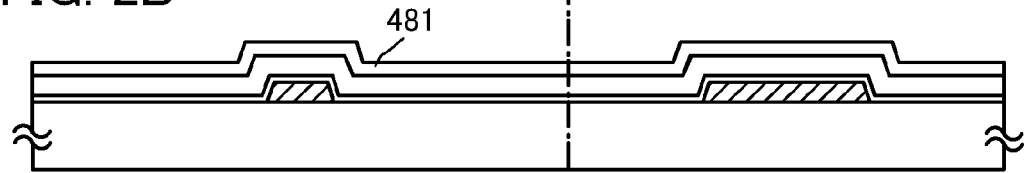
Figure 2C:
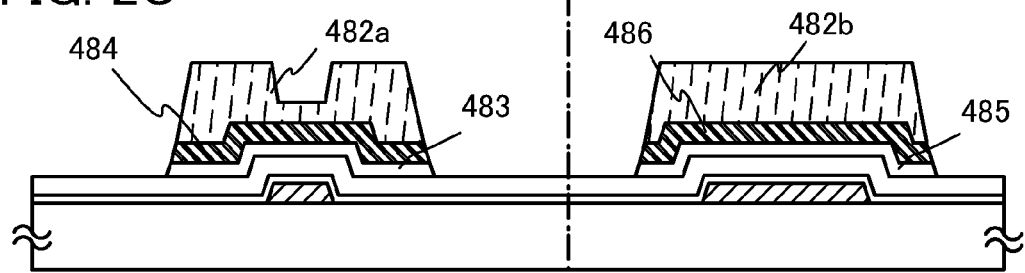

After the light exposure using the multi-tone mask, development is carried out, whereby the resist mask 482a with regions having different thicknesses can be formed as illustrated in FIG. 2C.

Next, a first etching step is performed using the resist masks 482a and 482b, so that the oxide semiconductor film 481 and the metal conductive film are etched into island shapes. As a result, oxide semiconductor layers 483 and 485 and metal conductive layers 484 and 486 can be formed (see FIG. 2C).

Then, the resist mask 482a is subjected to ashing. Consequently, the area (the volume considering three dimensions) of the resist mask is reduced and the thickness is reduced. At this time, a resist of the resist mask in a region with small thickness (a region overlapping with part of the gate electrode layer 461) is removed so that separated resist masks 487a can be formed. Similarly, the resist mask 482b is subjected to ashing, so that the area (the volume considering three dimensions) of the resist mask is reduced and a resist mask 487b is formed.

Figure 2D:
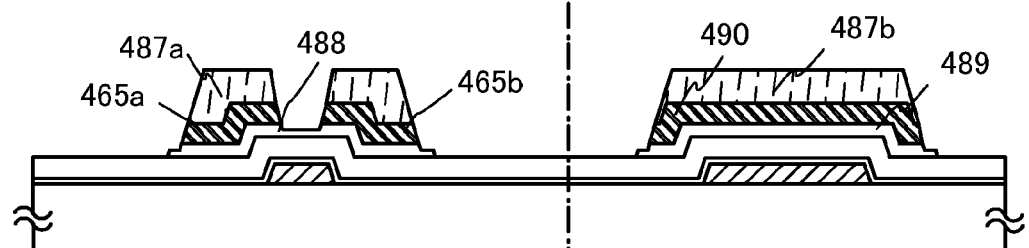

The oxide semiconductor layers 483 and 485 and the metal conductive layers 484 and 486 are etched in a second etching step with the use of the resist masks 487a and 487b; thus, oxide semiconductor layers 488 and 489, the source electrode layer 465a, the drain electrode layer 465b, and a metal electrode layer 490 are formed (see FIG. 2D). Note that since only part of the oxide semiconductor layer 488 is etched, the oxide semiconductor layer 488 has a groove (a recessed portion). Moreover, edges of the oxide semiconductor layers 488 and 489 are partly etched to expose the edges of the oxide semiconductor layers 488 and 489, whereby the oxide semiconductor layers 488 and 489 have a thin end region.

Figure 2E:
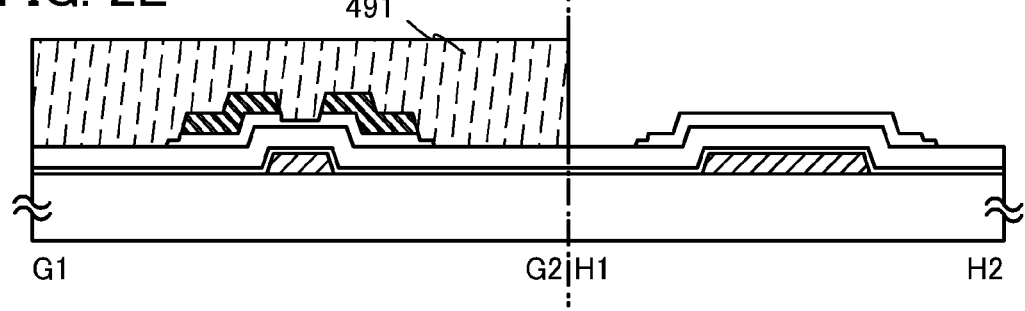

Next, the resist masks 487a and 487b are removed, and a resist mask 491 that covers the oxide semiconductor layer 488 is formed and the metal electrode layer 490 over the oxide semiconductor layer 489 is removed in a third photolithography step (see FIG. 2E).

Note that since the metal electrode layer 490 overlapping with the oxide semiconductor layer 489 is removed in the third photolithography step, each material and etching conditions are adjusted as appropriate so that the oxide semiconductor layer 489 is not removed in etching of the metal electrode layer 490.

An oxide insulating film 492 serving as a protective insulating film is formed in contact with a top surface and a side surface of the oxide semiconductor layer 489 and the groove (the recessed portion) in the oxide semiconductor layer 488.

The oxide insulating film 492 has a thickness of at least 1 nm and can be formed by a method by which impurities such as water and hydrogen are not mixed into the oxide insulating film 492, such as a sputtering method, as appropriate. In this embodiment, a 300-nm-thick silicon oxide film is formed as the oxide insulating film 492 by a sputtering method. The substrate temperature at the film formation is in the range of room temperature to 300° C., and is 100° C. in this embodiment. The silicon oxide film can be deposited by a sputtering method in a rare gas (typically argon) atmosphere, an oxygen atmosphere, or an atmosphere including a rare gas (typically argon) and oxygen. Moreover, a silicon oxide target or a silicon target can be used as a target. For example, the silicon oxide film can be formed using a silicon target in an atmosphere including oxygen and nitrogen by a sputtering method. The oxide insulating film 492 which is formed in contact with the low-resistance oxide semiconductor layer is formed using an inorganic insulating film that does not contain impurities such as moisture, hydrogen ions, and OH⁻ and blocks entry of such impurities from the outside, typically a silicon oxide film, a silicon nitride oxide film, an aluminum oxide film, or an aluminum oxynitride film.

Figure 3A:
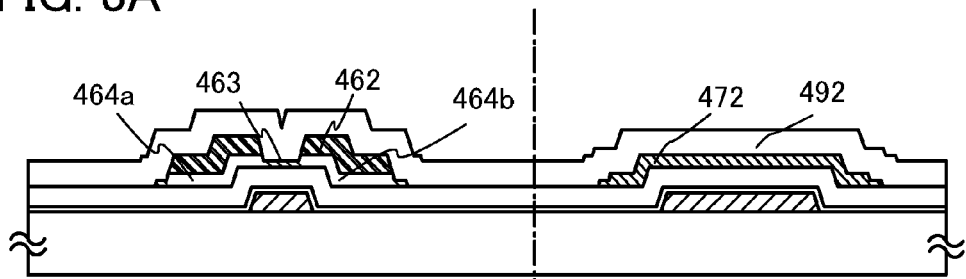
FIGS. 3A to 3E illustrate a method for manufacturing a semiconductor device.

Next, second heat treatment (preferably 200° C. to 400° C., for example, 250° C. to 350° C.) is performed in an inert gas atmosphere or an oxygen gas atmosphere (see FIG. 3A). For example, the second heat treatment is performed at 250° C. for one hour in a nitrogen atmosphere. With the second heat treatment, heat is applied while the groove in the oxide semiconductor layer 488 and the top surface and the side surface of the oxide semiconductor layer 489 are in contact with the oxide insulating film 492.

Through the above-described steps, heat treatment for dehydration or dehydrogenation is performed on the oxide semiconductor film after deposition to reduce the resistance, and then, part of the oxide semiconductor film is selectively made to be in an oxygen-excess state. As a result, the channel formation region 463 overlapping with the gate electrode layer 461 becomes intrinsic, and the first high-resistance drain region 464a which overlaps with the source electrode layer 465a and the second high-resistance drain region 464b which overlaps with the drain electrode layer 465b are formed in a self-aligned manner. Moreover, the entire oxide semiconductor layer 472 which overlaps with the gate electrode layer 471 becomes intrinsic.

However, when heat treatment is performed in a nitrogen atmosphere or an inert gas atmosphere or under a reduced pressure while the high-resistance (i-type) oxide semiconductor layer 472 is exposed, the resistance of the high-resistance (i-type) oxide semiconductor layer 472 is reduced. For that reason, heat treatment performed when the oxide semiconductor layer 472 is exposed is carried out in an oxygen gas, a N₂O gas atmosphere, or an ultra-dry air (with a dew point of −40° C. or less, preferably −60° C. or less).

Note that the second high-resistance drain region 464b (or the first high-resistance drain region 464a) is formed in the oxide semiconductor layer overlapping with the drain electrode layer 465b (or the source electrode layer 465a), so that the reliability of a driver circuit to be formed can be increased. Specifically, with the formation of the second high-resistance drain region 464b, the conductivity can vary from the drain electrode layer to the second high-resistance drain region 464b and the channel formation region. Thus, when operation is performed with the drain electrode layer 465b connected to a wiring that supplies a high power supply potential VDD, the thin film transistor can have increased withstand voltage since the high-resistance drain region serves as a buffer so that a localized high electric field is not applied even when a high electric field is applied between the gate electrode layer 461 and the drain electrode layer 465b.

When the second high-resistance drain region 464b (or the first high-resistance drain region 464a) is formed in the oxide semiconductor layer overlapping with the drain electrode layer 465b (or the source electrode layer 465a), the amount of leakage current in the channel formation region 463 in a driver circuit to be formed can be reduced.

Figure 3B:
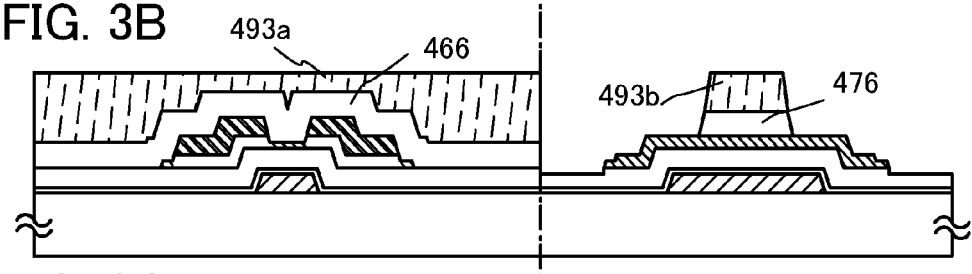

Then, in a fourth photolithography step, resist masks 493a and 493b are formed and the oxide insulating film 492 is selectively etched to form the oxide insulating layers 466 and 476 (see FIG. 3B). The oxide insulating layer 476 is provided over the channel formation region in the oxide semiconductor layer 472 and functions as a channel protective film. Note that when an oxide insulating layer is used as the gate insulating layer 452b as in this embodiment, part of the gate insulating layer 452b is also etched in the etching step of the oxide insulating film 492 so that the thickness of the gate insulating layer 452b is reduced in some cases. When a nitride insulating film that has lower etching rate than the oxide insulating film 492 is used as the gate insulating layer 452b, the gate insulating layer 452b can be prevented from being partly etched.

Figure 3C:
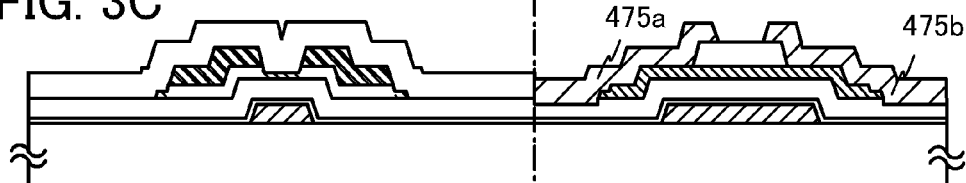

Next, after a light-transmitting conductive film is formed over the oxide semiconductor layer 472 and the oxide insulating layer 476, the source electrode layer 475a and the drain electrode layer 475b are formed in a fifth photolithography step (see FIG. 3C). The light-transmitting conductive film is deposited by a sputtering method, a vacuum evaporation method (e.g., an electron beam evaporation method), an arc discharge ion plating method, or a spray method. As a material for the conductive layer, a conductive material that transmits visible light, for example, any of the following metal oxides can be used: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. The thickness of the source electrode layer 475a and the drain electrode layer 475b is set within the range of 50 nm to 300 nm as appropriate. When a sputtering method is employed, it is preferable that deposition be performed using a target containing SiO₂ of 2 wt % to 10 wt % and SiOx (x>0) which inhibits crystallization be contained in the oxide semiconductor film 480 so as to prevent crystallization in the case where heat treatment in a later step.

Note that a resist mask for forming the source electrode layer 475a and the drain electrode layer 475b may be formed by an inkjet method. A photomask is not used when the resist mask is formed by an inkjet method, which results in reducing manufacturing costs.

Then, the protective insulating layer 453 is formed over the oxide insulating layers 466 and 476, the source electrode layer 475a, and the drain electrode layer 475b. In this embodiment, a silicon nitride film is formed by an RF sputtering method. Since an RF sputtering method has high productivity, it is preferably used for depositing the protective insulating layer 453. The protective insulating layer 453 is formed using an inorganic insulating film that does not contain impurities such as moisture, hydrogen ions, and OH⁻ and blocks entry of such impurities from the outside, typically a silicon nitride film, an aluminum nitride film, a silicon nitride oxide film, or an aluminum oxynitride film. Needless to say, the protective insulating layer 453 is a light-transmitting insulating film.

The protective insulating layer 453 is preferably in contact with the first gate insulating layer 452a provided below the protective insulating layer 453 or an insulating film serving as a base, and blocks entry of impurities such as moisture, a hydrogen ion, and OH⁻ from the vicinity of a side surface of the substrate. It is particularly effective to use a silicon nitride film as the first gate insulating layer 452a or the insulating film serving as the base, which is in contact with the protective insulating layer 453. In other words, a silicon nitride film is provided so as to surround a bottom surface, a top surface, and a side surface of the oxide semiconductor layer, whereby the reliability of a display device is increased.

Next, the planarization insulating layer 454 is formed over the protective insulating layer 453. The planarization insulating layer 454 can be formed from an organic material having heat resistance, such as polyimide, an acrylic resin, a benzocyclobutene-based resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer 454 may be formed by stacking a plurality of insulating films formed from these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating layer 454, and the following method or means can be employed depending on the material: a sputtering method, an SOG method, a spin coating method, a dipping method, a spray coating method, a droplet discharge method (e.g., an inkjet method, screen printing, or offset printing), a roll coating method, a curtain coating method, a knife coating method, or the like.

Figure 3D:
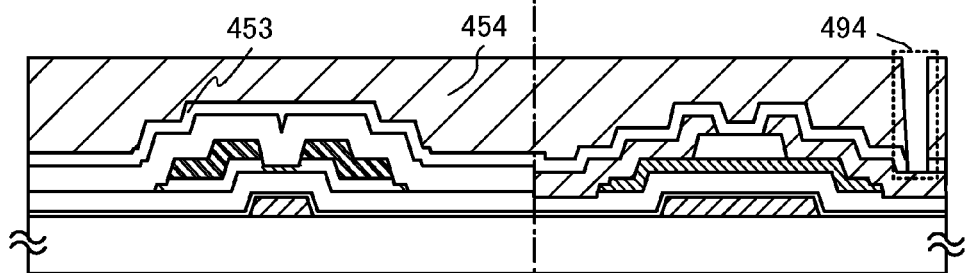

Then, a sixth photolithography step is performed so that a resist mask is formed and a contact hole 494 that reaches the drain electrode layer 475b is formed by etching of the planarization insulating layer 454 and the protective insulating layer 453 (see FIG. 3D). Moreover, contact holes that reach the gate electrode layers 461 and 471 are also formed with that etching. Alternatively, a resist mask for forming the contact hole that reaches the drain electrode layer 475b may be formed by an inkjet method. A photomask is not used when the resist mask is formed by an inkjet method, which results in reducing manufacturing costs.

Next, the resist mask is removed and then a light-transmitting conductive film is formed. The light-transmitting conductive film can be formed from indium oxide ($In_2O_3$), an alloy of indium oxide and tin oxide ($In_2O_3$—$SnO_2$, abbreviated as ITO), or the like by a sputtering method, a vacuum evaporation method, or the like. Alternatively, an Al—Zn—O-based non-single-crystal film containing nitrogen (i.e., an Al—Zn—O—N-based non-single-crystal film), a Zn—O-based non-single-crystal film containing nitrogen, or a Sn—Zn—O-based non-single-crystal film containing nitrogen may be used. Note that the percentage (atomic %) of zinc in the Al—Zn—O—N-based non-single-crystal film is 47 atomic % or less and is higher than that of aluminum in the non-single-crystal film; the percentage (atomic %) of aluminum in the non-single-crystal film is higher than that of nitrogen in the non-single-crystal film. Such a material is etched with a hydrochloric acid-based solution. However, since a residue is easily generated particularly in etching ITO, an alloy of indium oxide and zinc oxide ($In_2O_3$—$ZnO$) may be used to improve etching processability.

Note that the unit of the percentage of components in the light-transmitting conductive film is atomic percent (atomic %), and the percentage of components is evaluated by analysis using an electron probe X-ray microanalyzer (EPMA).

Figure 3E:
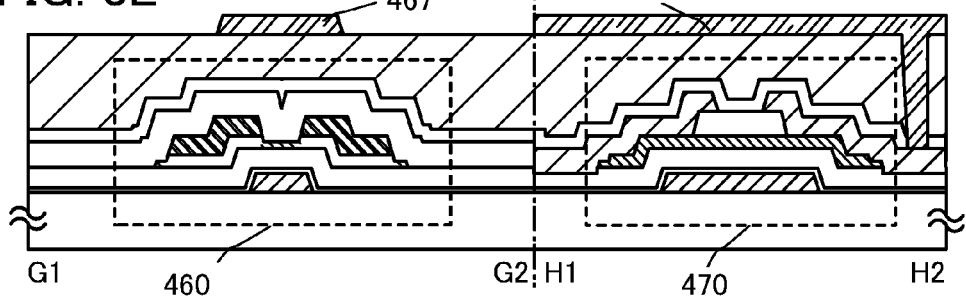

Next, a seventh photolithography step is performed so that a resist mask is formed and unnecessary portions are removed by etching to form the pixel electrode layer 477 and the conductive layer 467 (see FIG. 3E).

Through the above-described steps, the thin film transistor 460 and the thin film transistor 470 can be separately formed in the driver circuit and the pixel portion, respectively, over one substrate with the use of seven masks. The thin film transistor 460 for the driver circuit is the channel-etched thin film transistor including the oxide semiconductor layer 462 including the first high-resistance drain region 464a, the second high-resistance drain region 464b, and the channel formation region 463. The thin film transistor 470 for the pixel is the channel protection thin film transistor including the oxide semiconductor layer 472 which is entirely intrinsic.

The use of a resist mask having regions of plural thicknesses (typically, two kinds of thicknesses) formed with a multi-tone mask as in this embodiment enables the number of resist masks to be reduced; thus, the process can be simplified and costs can be reduced. Consequently, a semiconductor device can be manufactured at low cost with high productivity.

In addition, a storage capacitor that is constituted by a capacitor wiring layer and a capacitor electrode with the first gate insulating layer 452a and the second gate insulating layer 452b as dielectrics can be formed over the same substrate. The thin film transistors 470 and storage capacitors are arranged in matrix to correspond to individual pixels so that a pixel portion is formed and a driver circuit including the thin film transistor 460 is arranged around the pixel portion, whereby one of the substrates for manufacturing an active matrix display device can be obtained. In this specification, such a substrate is referred to as an active matrix substrate for convenience.

The pixel electrode layer 477 is electrically connected to the capacitor electrode layer through the contact hole formed in the planarization insulating layer 454 and the protective insulating layer 453. Note that the capacitor electrode layer can be formed from the same light-transmitting material in the same step as the source electrode layer 475a and the drain electrode layer 475b.

The conductive layer 467 is provided so as to overlap with the channel formation region 463 in the oxide semiconductor layer, whereby in a bias-temperature stress test (referred to as a BT test) for examining the reliability of a thin film transistor, the amount of change in threshold voltage of the thin film transistor 460 before and after the BT test can be reduced. A potential of the conductive layer 467 may be the same or different from that of the gate electrode layer 461. The conductive layer 467 can also function as a second gate electrode layer. Alternatively, the potential of the conductive layer 467 may be GND or 0 V, or the conductive layer 467 may be in a floating state.

Note that the resist mask for forming the pixel electrode layer 477 may be formed by an inkjet method. A photomask is not used when the resist mask is formed by an inkjet method, which results in reducing manufacturing costs.

(Embodiment 2)

In this embodiment, an example where heat treatment for the thin film transistor for a pixel is different from that in Embodiment 1 is illustrated in FIGS. 4A to 4E. Since FIGS. 4A to 4E are the same as FIGS. 1A-1, 1A-2, 1B, and 1C, FIGS. 2A to 2E, and FIGS. 3A to 3E except for part of the steps, the same reference numerals are used for the same portions and detailed description of the same portions is not repeated.

First, according to Embodiment 1, the steps up to and including the step in FIG. 3B in Embodiment 1 are performed.

Figure 4A:
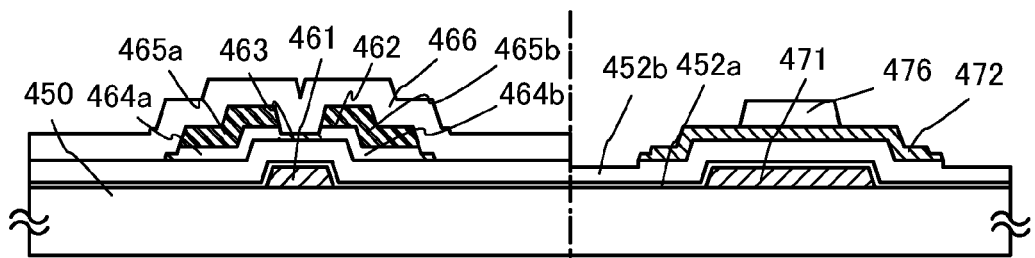
FIGS. 4A to 4E illustrate a method for manufacturing a semiconductor device.
Figure 4B:
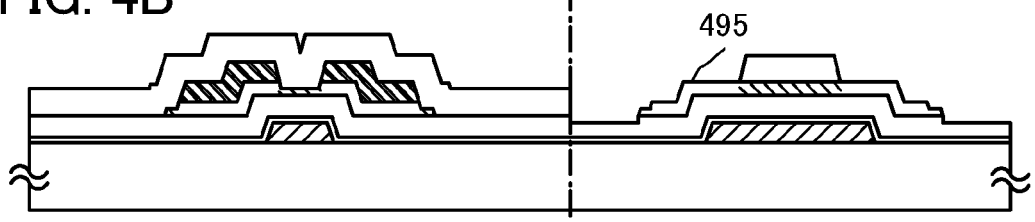

FIG. 4A illustrates a state where the resist masks 493a and 493b are removed after the step in FIG. 3B.

The gate electrode layers 461 and 471, the first gate insulating layer 452a, and the second gate insulating layer 452b are formed over the substrate 450 having an insulating surface. In the driver circuit portion, the oxide semiconductor layer 462 including the channel formation region 463, the first high-resistance drain region 464a, and the second high-resistance drain region 464b; the source electrode layer 465a; the drain electrode layer 465b; and the oxide insulating layer 466 are formed. In the pixel portion, the oxide semiconductor layer 472 and the oxide insulating layer 476 are formed (see FIG. 4A). The oxide semiconductor layer 472 is an i-type oxide semiconductor layer with increased resistance.

In this embodiment, heat treatment is performed in nitrogen or an inert gas atmosphere or under a reduced pressure while at least part of the oxide semiconductor layer 472 is exposed. When heat treatment is performed in nitrogen or an inert gas atmosphere or under a reduced pressure in a state where the high-resistance (i-type) oxide semiconductor layer 472 is exposed, the resistance of the high-resistance (i-type) exposed region of the oxide semiconductor layer 472 can be reduced.

Heat treatment for reducing the resistance of the high-resistance (i-type) region of the oxide semiconductor layer 472 is preferably performed at 200° C. to 400° C., for example, 250° C. to 350° C. For example, heat treatment is performed at 250° C. for one hour in a nitrogen atmosphere.

In this embodiment, the substrate is put in an electric furnace which is a kind of heat treatment apparatus and heat treatment is performed on the oxide semiconductor layer 472 in a nitrogen atmosphere, and then slow cooling is performed in a nitrogen atmosphere so that the temperature drops by 100° C. or more from the heat temperature T, with the oxide semiconductor layer 472 not exposed to the air. Moreover, without limitation to a nitrogen atmosphere, dehydration or dehydrogenation may be performed in a rare gas atmosphere (e.g., helium, neon, or argon) or under a reduced pressure. Note that in the heat treatment, it is preferable that water, hydrogen, and the like be not included in nitrogen or a rare gas such as helium, neon, or argon. Alternatively, the purity of nitrogen or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

With the heat treatment for the oxide semiconductor layer 472 in nitrogen or an inert gas atmosphere or under a reduced pressure, the resistance of the exposed region of the oxide semiconductor layer 472 is reduced, and an oxide semiconductor layer 495 including regions with different resistances (indicated as a shaded region and a white region in FIG. 4B) is formed.

Figure 4C:
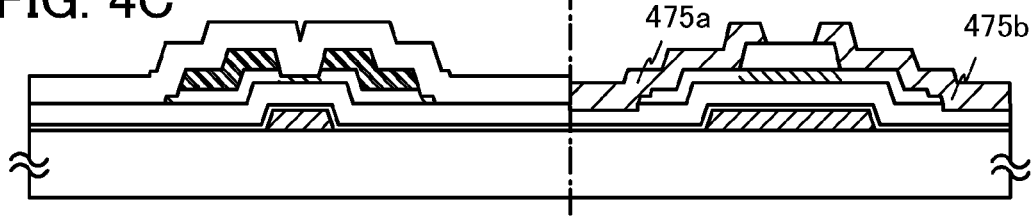

Next, after a light-transmitting conductive film is formed over the oxide semiconductor layer 495 and the oxide insulating layer 476, the source electrode layer 475a and the drain electrode layer 475b are formed in a fifth photolithography step (see FIG. 4C).

Then, the protective insulating layer 453 and the planarization insulating layer 454 are stacked over the oxide insulating layers 466 and 476, the source electrode layer 475a, and the drain electrode layer 475b.

Figure 4D:
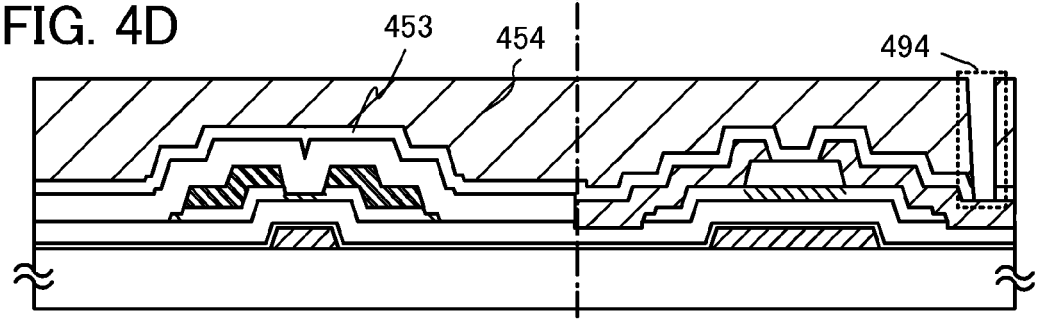

Next, a sixth photolithography step is performed so that a resist mask is formed and the contact hole 494 that reaches the drain electrode layer 475b is formed by etching of the planarization insulating layer 454 and the protective insulating layer 453 (see FIG. 4D).

Then, the resist mask is removed and then a light-transmitting conductive film is formed.

Figure 4E:
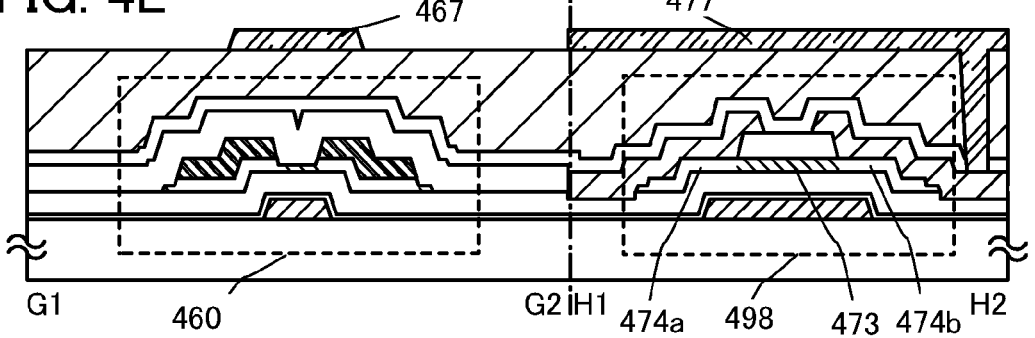

Next, a seventh photolithography step is performed so that a resist mask is formed and unnecessary portions are removed by etching to form the pixel electrode layer 477 and the conductive layer 467 (see FIG. 4E).

Through the above-described steps, the thin film transistor 460 and a thin film transistor 498 can be separately formed in the driver circuit and the pixel portion, respectively, over one substrate with the use of seven masks. The thin film transistor 460 for the driver circuit is the channel-etched thin film transistor including the oxide semiconductor layer 462 including the first high-resistance drain region 464a, the second high-resistance drain region 464b, and the channel formation region 463. The thin film transistor 498 for a pixel is a channel protection thin film transistor including the oxide semiconductor layer 495 including a first high-resistance drain region 474a, a second high-resistance drain region 474b, and a channel formation region 473. Consequently, the thin film transistors 460 and 498 have increased withstand voltage since the high-resistance drain region serves as a buffer so that a localized high electric field is not applied even when a high electric field is applied to the thin film transistors 460 and 498.

The use of a resist mask having regions of plural thicknesses (typically, two kinds of thicknesses) formed with a multi-tone mask as in this embodiment enables the number of resist masks to be reduced; thus, the process can be simplified and costs can be reduced. Consequently, a semiconductor device can be manufactured at low cost with high productivity.

In addition, a storage capacitor that is constituted by a capacitor wiring layer and a capacitor electrode with the first gate insulating layer 452a and the second gate insulating layer 452b as dielectrics can be formed over the same substrate. The thin film transistors 498 and storage capacitors are arranged in matrix to correspond to individual pixels so that a pixel portion is formed and a driver circuit including the thin film transistor 460 is arranged around the pixel portion, whereby one of the substrates for manufacturing an active matrix display device can be obtained.

The conductive layer 467 is provided so as to overlap with the channel formation region in the oxide semiconductor layer 462, whereby in a bias-temperature stress test (referred to as a BT test) for examining the reliability of a thin film transistor, the amount of change in threshold voltage of the thin film transistor 460 before and after the BT test can be reduced. A potential of the conductive layer 467 may be the same or different from that of the gate electrode layer 461. The conductive layer 467 can also function as a second gate electrode layer. Alternatively, the potential of the conductive layer 467 may be GND or 0 V, or the conductive layer 467 may be in a floating state.

(Embodiment 3)

Figure 5A:
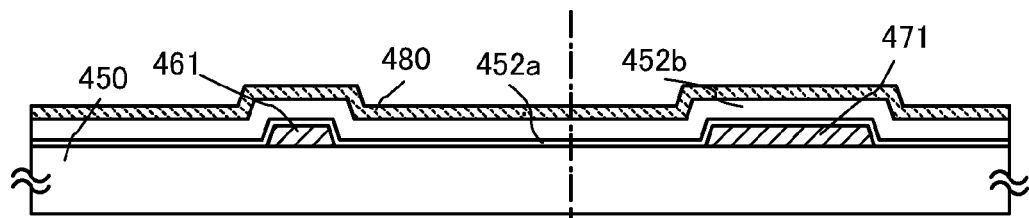
FIGS. 5A to 5C illustrate a method for manufacturing a semiconductor device.
Figure 5B:
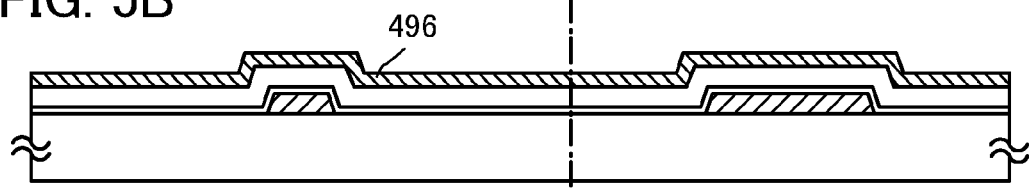
Figure 5C:
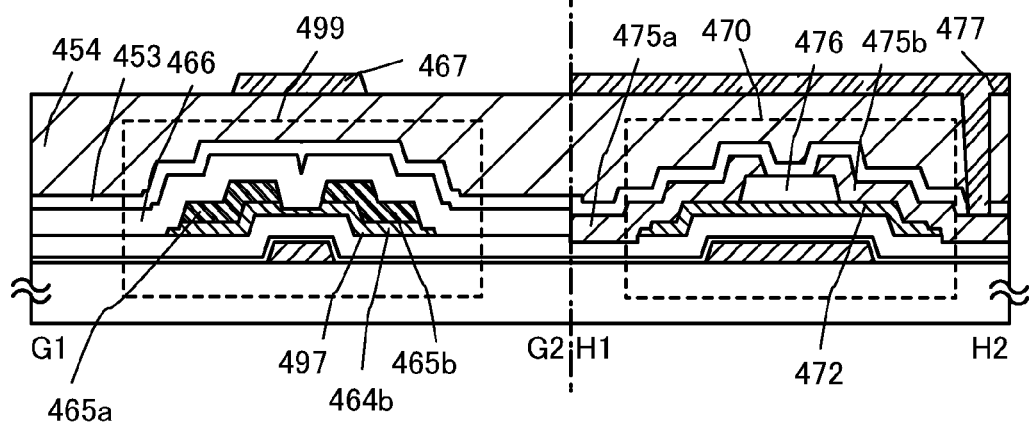

In this embodiment, an example where the first heat treatment is different from that in Embodiment 1 is illustrated in FIGS. 5A to 5C. Since FIGS. 5A to 5C are the same as FIGS. 1A-1, 1A-2, 1B, and 1C, FIGS. 2A to 2E, and FIGS. 3A to 3E except for part of the steps, the same reference numerals are used for the same portions and detailed description of the same portions is not repeated.

First, according to Embodiment 1, a light-transmitting conductive film is formed over the substrate 450 having an insulating surface, and then, the gate electrode layers 461 and 471 are formed in a first photolithography step.

Next, a stack of the first gate insulating layer 452a and the second gate insulating layer 452b is formed over the gate electrode layers 461 and 471.

Then, the oxide semiconductor film 480 with a thickness of 2 nm to 200 nm is formed over the second gate insulating layer 452b (see FIG. 5A). Note that the steps so far are the same as the steps in Embodiment 1; FIG. 5A corresponds to FIG. 2A.

Next, the oxide semiconductor film 480 is subjected to dehydration or dehydrogenation in an inert gas atmosphere or under a reduced pressure. The temperature of the first heat treatment for dehydration or dehydrogenation is 350° C. or higher and lower than the strain point of the substrate, preferably 400° C. or higher. Here, the substrate is put in an electric furnace which is a kind of heat treatment apparatus and heat treatment is performed on the oxide semiconductor film 480 in a nitrogen atmosphere, and then, the oxide semiconductor film 480 is not exposed to the air so that water and hydrogen are prevented from being mixed into the oxide semiconductor film. Thus, the oxide semiconductor film 480 is changed into a low-resistance oxide semiconductor film, that is, an n-type (e.g., n$^-$-type) oxide semiconductor film as an oxygen-deficient oxide semiconductor film. After that, a high-purity oxygen gas, a high-purity $N_2O$ gas, or an ultra-dry air (with a dew point of −40° C. or less, preferably −60° C. or less) is introduced into the same furnace and cooling is performed. It is preferable that water, hydrogen, and the like be not included in an oxygen gas or a $N_2O$ gas. Alternatively, the purity of an oxygen gas or a $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Moreover, after the first heat treatment for dehydration or dehydrogenation, heat treatment may be performed at 200° C. to 400° C., preferably 200° C. to 300° C., in an oxygen gas atmosphere or a $N_2O$ gas atmosphere.

The entire film is made to contain an excess amount of oxygen through the above steps; thus, a high-resistance (i-type) oxide semiconductor film 496 is obtained (see FIG. 5B).

Consequently, the reliability of a thin film transistor to be formed later can be increased.

However, when heat treatment is performed in nitrogen or an inert gas atmosphere or under a reduced pressure while the high-resistance (i-type) oxide semiconductor film 496 is exposed, the resistance of the high-resistance (i-type) oxide semiconductor film 496 is reduced. For that reason, heat treatment performed when the oxide semiconductor film 496 is exposed is carried out in an oxygen gas, a $N_2O$ gas atmosphere, or an ultra-dry air (with a dew point of −40° C. or less, preferably −60° C. or less).

Then, as in FIGS. 2C to 2E and FIGS. 3A to 3E in Embodiment 1, a metal conductive film is formed over the oxide semiconductor film 496; a photolithography step is performed on the oxide semiconductor film 496 and the metal conductive film by using a multi-tone mask, so that island-shaped oxide semiconductor layers and metal conductive layers are formed. Moreover, in a peripheral driver circuit portion, only part of the oxide semiconductor layer is etched to form an oxide semiconductor layer 497 having a groove (a recessed portion); the oxide insulating layer 466 is formed in contact with the oxide semiconductor layer 497 and the source and drain electrode layers 465a and 465b, each of which is the metal conductive layer; thus, a thin film transistor 499 for a driver circuit is manufactured. On the other hand, in a pixel portion, the oxide insulating layer 476 is formed over a channel formation region in the oxide semiconductor layer 472 formed by the photolithography step using the multi-tone mask, and the source electrode layer 475a and the drain electrode layer 475b, each of which is a light-transmitting conductive layer, are formed; thus, the thin film transistor 470 for a pixel is manufactured.

Note that the oxide semiconductor layer 472 in FIG. 5C is a high-resistance (i-type) oxide semiconductor layer which is the same as the oxide semiconductor layer 472 in FIG. 3A; therefore, the same reference numeral is used. Similarly, in this specification, even thin films formed with different methods are sometimes denoted by the same reference numeral when they have equivalent functions or properties (e.g., resistance).

Next, second heat treatment (preferably 200° C. to 400° C., for example, 250° C. to 350° C.) is performed in an inert gas atmosphere or an oxygen gas atmosphere. For example, the second heat treatment is performed at 250° C. for one hour in a nitrogen atmosphere.

Then, the protective insulating layer 453 is formed so as to cover the thin film transistors 499 and 470 and to be in contact with the oxide insulating layers 466 and 476, the source electrode layer 475a, and the drain electrode layer 475b, and the planarization insulating layer 454 is stacked over the protective insulating layer 453. A contact hole that reaches the drain electrode layer 475b is formed in the planarization insulating layer 454 and the protective insulating layer 453, and a light-transmitting conductive film is formed in the contact hole and over the planarization insulating layer 454. The light-transmitting conductive film is selectively etched to form the conductive layer 467 and the pixel electrode layer 477 that is electrically connected to the thin film transistor 470.

Through the above-described steps, the thin film transistor 499 and the thin film transistor 470 can be separately formed in the driver circuit and the pixel portion, respectively, over one substrate with the use of seven masks. The thin film transistor 499 for the driver circuit is a channel-etched thin film transistor including the oxide semiconductor layer 497 which is entirely intrinsic. The thin film transistor 470 for the pixel is the channel protection thin film transistor including the oxide semiconductor layer 472 which is entirely intrinsic.

The use of a resist mask having regions of plural thicknesses (typically, two kinds of thicknesses) formed with a multi-tone mask as in this embodiment enables the number of resist masks to be reduced; thus, the process can be simplified and costs can be reduced. Consequently, a semiconductor device can be manufactured at low cost with high productivity.

In addition, a storage capacitor that is constituted by a capacitor wiring layer and a capacitor electrode with the first gate insulating layer 452a and the second gate insulating layer 452b as dielectrics can be formed over the same substrate. The thin film transistors 470 and storage capacitors are arranged in matrix so as to correspond to individual pixels so that a pixel portion is formed and a driver circuit including the thin film transistor 499 is arranged around the pixel portion, whereby one of the substrates for manufacturing an active matrix display device can be obtained.

The conductive layer 467 is provided so as to overlap with a channel formation region in the oxide semiconductor layer 497, whereby in a bias-temperature stress test (referred to as a BT test) for examining the reliability of a thin film transistor, the amount of change in threshold voltage of the thin film transistor 499 before and after the BT test can be reduced. A potential of the conductive layer 467 may be the same as or different from that of the gate electrode layer 461. The conductive layer 467 can also function as a second gate electrode layer. Alternatively, the potential of the conductive layer 467 may be GND or 0 V, or the conductive layer 467 may be in a floating state.

(Embodiment 4)

In this embodiment, an example where the first heat treatment for the thin film transistor for a pixel is different from that in Embodiment 3 is illustrated in FIGS. 6A to 6D. Since FIGS. 6A to 6D are the same as FIGS. 1A-1, 1A-2, 1B, 1C, FIGS. 2A to 2E, FIGS. 3A to 3E, FIGS. 4A to 4E, and FIGS. 5A to 5C except for part of the steps, the same reference numerals are used for the same portions and detailed description of the same portions is not repeated.

Figure 6A:
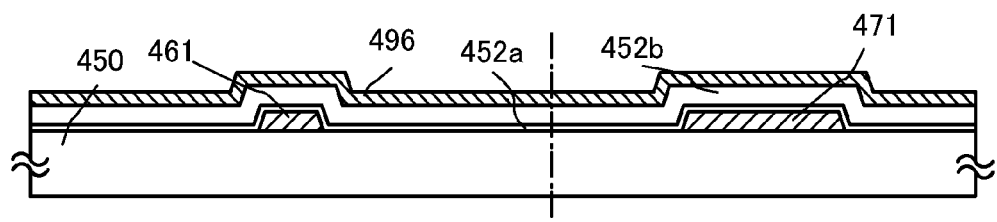
FIGS. 6A to 6D illustrate a method for manufacturing a semiconductor device.
Figure 6B:
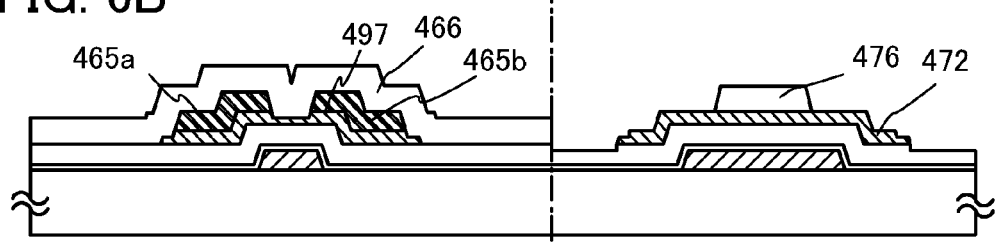
Figure 6C:
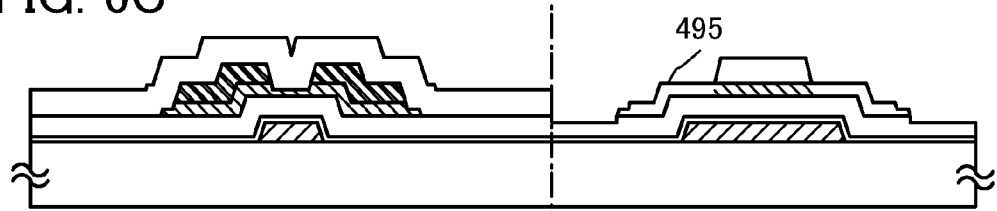
Figure 6D:
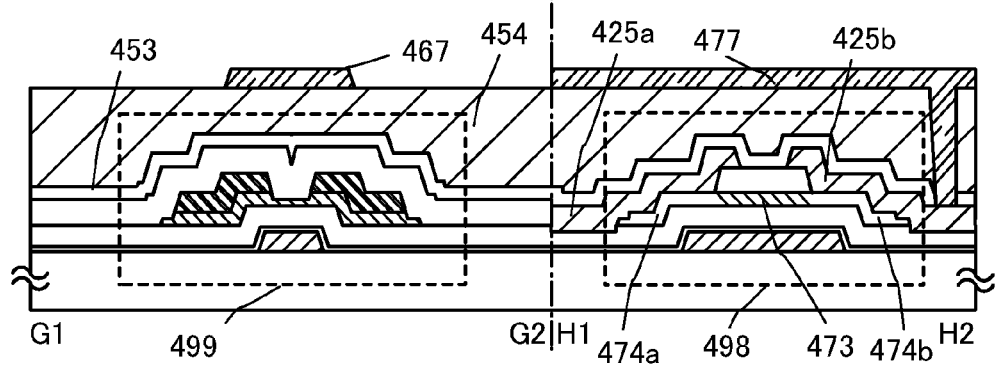

First, according to Embodiment 3, the steps up to and including the step in FIG. 5B in Embodiment 3 are performed. FIG. 6A illustrates the same step as in FIG. 5B.

The gate electrode layers 461 and 471, the first gate insulating layer 452a, and the second gate electrode layer 452b are formed over the substrate 450 having an insulating surface; the oxide semiconductor film 496 is formed over the second gate insulating layer 452b (see FIG. 6A). The oxide semiconductor film 496 is an i-type oxide semiconductor film with increased resistance.

A metal conductive film is formed over the oxide semiconductor film 496, and the oxide semiconductor film 496 and the metal conductive film are subjected to a photolithography step with a resist mask formed using a multi-tone mask, like the photolithography step with the resist masks 482a and 482b described in Embodiment 1.

In a peripheral driver circuit portion, an island-shaped oxide semiconductor layer is formed and only part of the oxide semiconductor layer is etched to form the oxide semiconductor layer 497 having a groove (a recessed portion); the oxide insulating layer 466 is formed in contact with the oxide semiconductor layer 497 and the source and drain electrode layers 465a and 465b, each of which is a metal conductive layer; thus, the thin film transistor 499 for a driver circuit is manufactured. On the other hand, in a pixel portion, the oxide insulating layer 476 is formed over a channel formation region in the oxide semiconductor layer 472 (see FIG. 6B).

In this embodiment, heat treatment is performed in nitrogen or an inert gas atmosphere or under a reduced pressure while at least part of the oxide semiconductor layer 472 is exposed, as in Embodiment 2. When heat treatment is performed in nitrogen or an inert gas atmosphere or under a reduced pressure in a state where the high-resistance (i-type) oxide semiconductor layer 472 is exposed, the resistance of the high-resistance (i-type) exposed region in the oxide semiconductor layer 472 can be reduced.

Heat treatment for reducing the resistance of the high-resistance (i-type) region in the oxide semiconductor layer 472 is preferably performed at 200° C. to 400° C., for example, 250° C. to 350° C. For example, heat treatment is performed at 250° C. for one hour in a nitrogen atmosphere.

In this embodiment, the substrate is put in an electric furnace which is a kind of heat treatment apparatus and heat treatment is performed on the oxide semiconductor layer 472 in a nitrogen atmosphere, and then slow cooling is performed in a nitrogen atmosphere so that the temperature drops by 100° C. or more from the heat temperature T, with the oxide semiconductor layer 472 not exposed to the air. Moreover, without limitation to a nitrogen atmosphere, dehydration or dehydrogenation may be performed in a rare gas atmosphere (e.g., helium, neon, or argon) or under a reduced pressure. Note that in the heat treatment, it is preferable that water, hydrogen, and the like be not included in nitrogen or a rare gas such as helium, neon, or argon. Alternatively, the purity of nitrogen or a rare gas such as helium, neon, or argon which is introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

With the heat treatment for the oxide semiconductor layer 472 in nitrogen or an inert gas atmosphere or under a reduced pressure, the resistance of the exposed region of the oxide semiconductor layer 472 is reduced, and the oxide semiconductor layer 495 including regions with different resistances (shown as a shaded region and a white region in FIG. 6C) is formed.

Next, after a light-transmitting conductive film is formed over the oxide semiconductor layer 495 and the oxide insulating layer 476, the source electrode layer 475a and the drain electrode layer 475b are formed in a fifth photolithography step.

Then, the protective insulating layer 453 and the planarization insulating layer 454 are stacked over the oxide insulating layers 466 and 476, the source electrode layer 475a, and the drain electrode layer 475b.

A contact hole that reaches the drain electrode layer 475b is formed in the planarization insulating layer 454 and the protective insulating layer 453, and a light-transmitting conductive film is formed in the contact hole and over the planarization insulating layer 454. The light-transmitting conductive film is selectively etched to form the conductive layer 467 and the pixel electrode layer 477 that is electrically connected to the thin film transistor 498 (see FIG. 6D).

Through the above-described steps, the thin film transistor 499 and the thin film transistor 498 can be separately formed in the driver circuit and the pixel portion, respectively, over one substrate with the use of seven masks. The thin film transistor 499 for the driver circuit is the channel-etched thin film transistor including the oxide semiconductor layer 497 which is entirely intrinsic. The thin film transistor 498 for a pixel is the channel protection thin film transistor including the oxide semiconductor layer 495 including the first high-resistance drain region 474a, the second high-resistance drain region 474b, and the channel formation region 473. Consequently, the thin film transistor 498 has increased withstand voltage since the high-resistance drain region serves as a buffer so that a localized high electric field is not applied even when a high electric field is applied to the thin film transistor 498.

The use of a resist mask having regions of plural thicknesses (typically, two kinds of thicknesses) formed with a multi-tone mask as in this embodiment enables the number of resist masks to be reduced; thus, the process can be simplified and costs can be reduced. Consequently, a semiconductor device can be manufactured at low cost with high productivity.

In addition, a storage capacitor that is constituted by a capacitor wiring layer and a capacitor electrode with the first gate insulating layer 452a and the second gate insulating layer 452b as dielectrics can be formed over the same substrate. The thin film transistors 498 and storage capacitors are arranged in matrix so as to correspond to individual pixels so that a pixel portion is formed and a driver circuit including the thin film transistor 499 is arranged around the pixel portion, whereby one of the substrates for manufacturing an active matrix display device can be obtained.

The conductive layer 467 is provided so as to overlap with a channel formation region in the oxide semiconductor layer 497, whereby in a bias-temperature stress test (referred to as a BT test) for examining the reliability of a thin film transistor, the amount of change in threshold voltage of the thin film transistor 499 before and after the BT test can be reduced. A potential of the conductive layer 467 may be the same or different from that of the gate electrode layer 461. The conductive layer 467 can also function as a second gate electrode layer. Alternatively, the potential of the conductive layer 467 may be GND or 0 V, or the conductive layer 467 may be in a floating state.

(Embodiment 5)

This embodiment will show an example where an active matrix liquid crystal display device is manufactured with the active matrix substrate described in Embodiment 1. Note that this embodiment can also be applied to any of the active matrix substrates described in Embodiments 2 to 4.

FIG. 7A illustrates an example of a cross-sectional structure of an active matrix substrate.

The thin film transistor in the driver circuit and the thin film transistor in the pixel portion over one substrate are shown in Embodiment 1; in this embodiment, a storage capacitor, a gate wiring, and a terminal portion of a source wiring are shown in addition to these thin film transistors for description. The capacitor, the gate wiring, and the terminal portion of the source wiring can be formed in the same manufacturing steps as in Embodiment 1 and can be manufactured without an increase in the number of photomasks and an increase in the number of steps. Moreover, in a portion to serve as a display region in a pixel portion, all the gate wiring, the source wiring, and a capacitor wiring layer are formed from a light-transmitting conductive film, resulting in a high aperture ratio. Furthermore, a metal wiring can be used for the source wiring layer in a portion that is not the display region in order to reduce the wiring resistance.

In FIG. 7A, a thin film transistor 210 is a channel-etched thin film transistor provided in a driver circuit, and in this embodiment, has the same structure as the thin film transistor 460 in Embodiment 1. A thin film transistor 220 that is electrically connected to a pixel electrode layer 227 is a channel protection thin film transistor provided in a pixel portion, and in this embodiment, has the same structure as the thin film transistor 470 in Embodiment 1.

A capacitor wiring layer 230 which is formed from the same light-transmitting material in the same step as a gate electrode layer of the thin film transistor 220 overlaps with a capacitor electrode 231, with a first gate insulating layer 202a and a second gate insulating layer 202b serving as dielectrics placed therebetween; thus, a storage capacitor is formed. The capacitor electrode 231 is formed from the same light-transmitting material in the same step as a source electrode layer and a drain electrode layer of the thin film transistor 220. Since the storage capacitor has light-transmitting properties as well as the thin film transistor 220, the aperture ratio can be increased.

The light-transmitting properties of the storage capacitor are important in increasing the aperture ratio. For small liquid crystal display panels of 10 inches or smaller in particular, a high aperture ratio can be achieved even when the size of a pixel is decreased in order to realize higher definition of display images by increasing the number of gate wirings, for example. Moreover, by using a light-transmitting film for components in the thin film transistor 220 and the storage capacitor, a high aperture ratio can be achieved even when one pixel is divided into a plurality of subpixels in order to realize a wide viewing angle. That is, a high aperture ratio can be maintained even when a group of high-density thin film transistors is arranged, and the display region can have a sufficient area. For example, when one pixel includes two to four subpixels and storage capacitors, the storage capacitors have light-transmitting properties as well as the thin film transistors, so that the aperture ratio can be increased.

Note that the storage capacitor is provided below the pixel electrode layer 227, and the capacitor electrode 231 is electrically connected to the pixel electrode layer 227.

This embodiment shows the example in which the storage capacitor is constituted by the capacitor electrode 231 and the capacitor wiring layer 230; however, there is no particular limitation on the structure of the storage capacitor. For example, a storage capacitor may be formed in such a manner that, without providing a capacitor wiring layer, a pixel electrode layer overlaps with a gate wiring in an adjacent pixel, with a planarization insulating layer, a protective insulating layer, a first gate insulating layer, and a second gate insulating layer placed therebetween.

A plurality of gate wirings, source wirings, and capacitor wiring layers are provided in accordance with the pixel density. In the terminal portion, a plurality of first terminal electrodes at the same potential as the gate wiring, a plurality of second terminal electrodes at the same potential as the source wiring, a plurality of third terminal electrodes at the same potential as the capacitor wiring layer, and the like are arranged. There is no particular limitation on number of each of the terminal electrodes, and the number of the terminals can be determined by a practitioner as appropriate.

In the terminal portion, the first terminal electrode which has the same potential as the gate wiring can be formed from the same light-transmitting material as the pixel electrode layer 227. The first terminal electrode is electrically connected to the gate wiring through a contact hole that reaches the gate wiring. The contact hole that reaches the gate wiring is formed by selective etching of a planarization insulating layer 204, a protective insulating layer 203, an oxide insulating layer 216, the second gate insulating layer 202b, and the first gate insulating layer 202a with the use of a photomask used for forming a contact hole for electrically connecting the drain electrode layer of the thin film transistor 220 and the pixel electrode layer 227.

A gate electrode layer of the thin film transistor 210 in the driver circuit may be electrically connected to a conductive layer 217 provided above an oxide semiconductor layer. In that case, a contact hole is formed by selective etching of the planarization insulating layer 204, the protective insulating layer 203, the oxide insulating layer 216, the second gate insulating layer 202b, and the first gate insulating layer 202a with the use of the photomask used for forming the contact hole for electrically connecting the drain electrode layer of the thin film transistor 220 and the pixel electrode layer 227. The conductive layer 217 and the gate electrode layer of the thin film transistor 210 in the driver circuit are electrically connected through the contact hole.

A second terminal electrode 235 which has the same potential as a source wiring 234 in the driver circuit can be formed from the same light-transmitting material as the pixel electrode layer 227. The second terminal electrode 235 is electrically connected to the source wiring 234 through a contact hole that reaches the source wiring 234. The source wiring is a metal wiring, is formed from the same material in the same step as a source electrode layer of the thin film transistor 210, and has the same potential as the source electrode layer of the thin film transistor 210.

The source wiring 234 is stacked over an oxide semiconductor layer 239. The source wiring 234 and the oxide semiconductor layer 239 are formed in a photolithography step with a resist mask formed using a multi-tone mask.

The third terminal electrode which has the same potential as the capacitor wiring layer 230 can be formed from the same light-transmitting material as the pixel electrode layer 227. Moreover, a contact hole that reaches the capacitor wiring layer 230 can be formed in the same step using the same photomask as those for forming a contact hole for electrically connecting the capacitor electrode 231 to the pixel electrode layer 227.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed to each other. A common electrode electrically connected to the counter electrode on the counter substrate is provided over the active matrix substrate, and a fourth terminal electrode electrically connected to the common electrode is provided in the terminal portion. The fourth terminal electrode is used for setting the common electrode to a fixed potential such as GND or 0 V. The fourth terminal electrode can be formed from the same light-transmitting material as the pixel electrode layer 227.

There is no particular limitation on the structure where the source electrode layer of the thin film transistor 220 and the source electrode layer of the thin film transistor 210 are electrically connected to each other; for example, a connection electrode for connecting the source electrode layer of the thin film transistor 220 and the source electrode layer of the thin film transistor 210 may be formed in the same step as the pixel electrode layer 227. Furthermore, in the portion that is not the display region, the source electrode layer of the thin film transistor 220 and the source electrode layer of the thin film transistor 210 may be in contact with each other to overlap with each other.

Note that FIG. 7A illustrates a cross-sectional structure of the gate wiring 232 in the driver circuit. Since this embodiment shows an example of a small liquid crystal display panel of 10 inches or smaller, the gate wiring 232 in the driver circuit is formed from the same light-transmitting material as the gate electrode layer of the thin film transistor 220.

When the same material is used for the gate electrode layer, the source electrode layer, the drain electrode layer, the pixel electrode layer, another electrode layer, and another wiring layer, a common sputtering target and a common manufacturing apparatus can be used, and thus the material costs and costs of an etchant (or an etching gas) used for etching can be reduced. As a result, manufacturing costs can be reduced.

When a photosensitive resin material is used for the planarization insulating layer 204 in the structure in FIG. 7A, the step for forming a resist mask can be omitted.

FIG. 7B illustrates a cross-sectional structure, part of which is different from the structure in FIG. 7A. FIG. 7B is the same as FIG. 7A except that the planarization insulating layer 204 is not provided; therefore, the same portions are denoted by the same reference numerals and detailed description of the same portions is not repeated. In FIG. 7B, the pixel electrode layer 227, the conductive layer 217, and the second terminal electrode 235 are formed on and in contact with the protective insulating layer 203.

With the structure in FIG. 7B, the step for forming the planarization insulating layer 204 can be omitted.

This embodiment can be freely combined with Embodiments 1 to 4.

(Embodiment 6)

This embodiment will show an example where part of a gate wiring is made from a metal wiring so that the wiring resistance is reduced, because there is a possibility that the resistance of a light-transmitting wiring might become a problem in the case where the size of a liquid crystal display panel exceeds 10 inches and reaches 60 inches and even 120 inches.

Figure 8A:
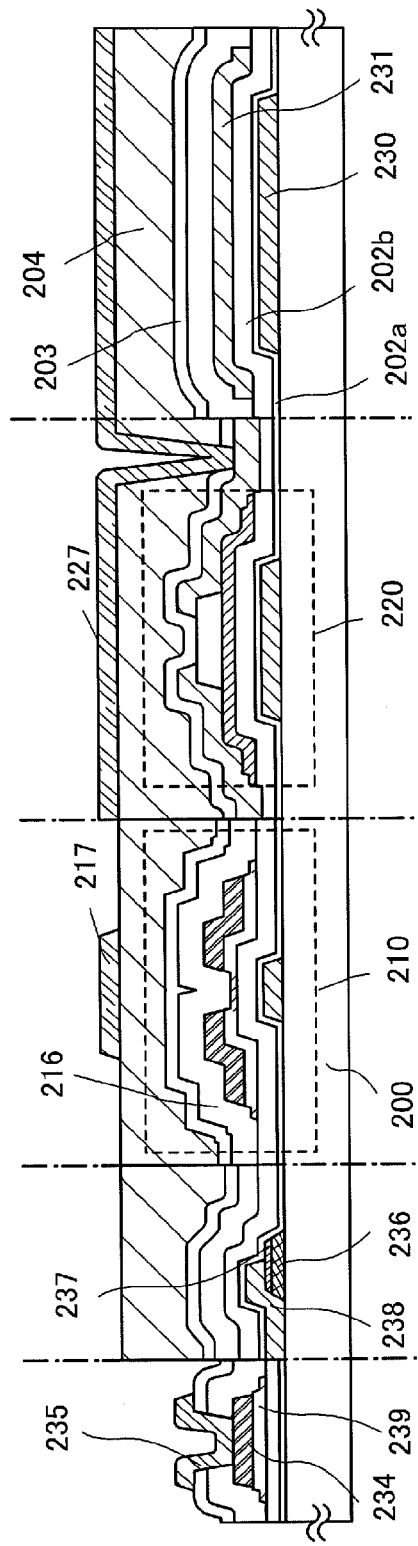
FIGS. 8A and 8B each illustrate a semiconductor device.

Note that in FIG. 8A, the same portions as in FIG. 7A are denoted by the same reference numerals and detailed description of the same portions is not repeated. Note that this embodiment can also be applied to any of the active matrix substrates described in Embodiments 1 to 4.

FIG. 8A illustrates an example where part of a gate wiring in a driver circuit is made from a metal wiring and formed in contact with a light-transmitting wiring which is the same as the gate electrode layer of the thin film transistor 210. Note that the number of photomasks is larger than that in Embodiment 1 since the metal wiring is formed.

First, a heat-resistant conductive material film (with a thickness of 100 nm to 500 nm) that can withstand first heat treatment for dehydration or dehydrogenation is formed over a substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation and the conductive film may be formed from an element selected from Ta, W, Ti, Mo, Al, or Cu; an alloy containing any of these elements as its component, an alloy containing a combination of any of these elements, or a nitride containing any of these elements as its component. The heat-resistant conductive material film is not limited to a single layer containing the above-described element and may be a stack of two or more layers.

In a first photolithography step, metal wirings are formed, so that a first metal wiring layer 236 and a second metal wiring layer 237 are formed. An ICP (inductively coupled plasma) etching method is preferably used for etching of the tungsten film and the tantalum nitride film. The films can be etched into a desired tapered shape with an ICP etching method with appropriate adjustment of etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in forming a light-transmitting conductive film thereon can be reduced.

Then, after the light-transmitting conductive film is formed, a gate wiring layer 238, a gate electrode layer of the thin film transistor 210, and a gate electrode layer of the thin film transistor 220 are formed in a second photolithography step. The light-transmitting conductive film is formed using any of the conductive materials that transmit visible light described in Embodiment 1.

Note that some materials for the light-transmitting conductive film might cause the formation of an oxide film on a surface of the first metal wiring layer 236 or the second metal wiring layer 237, which contacts with the gate wiring layer 238, with later heat treatment or the like, resulting in the increase in contact resistance. Therefore, the second metal wiring layer 237 is preferably formed from a metal nitride film that prevents oxidation of the first metal wiring layer 236.

Next, a gate insulating layer, an oxide semiconductor layer, and the like are formed in the same steps as in Embodiment 1. Subsequent steps are performed as described in Embodiment 1 to complete the active matrix substrate.

This embodiment shows an example in which after the formation of the planarization insulating layer 204, the planarization insulating layer in a terminal portion is selectively removed using a photomask. It is preferable that the planarization insulating layer be not placed in the terminal portion so that the terminal portion can be connected to an FPC in a favorable manner.

In FIG. 8A, the second terminal electrode 235 is formed over the protective insulating layer 203. FIG. 8A illustrates the gate wiring layer 238 which overlaps with part of the second metal wiring layer 237; alternatively, the gate wiring layer may cover all the first metal wiring layer 236 and the second metal wiring layer 237. In other words, the first metal wiring layer 236 and the second metal wiring layer 237 can be referred to as auxiliary wirings for reducing the resistance of the gate wiring layer 238.

In the terminal portion, a first terminal electrode that has the same potential as the gate wiring is formed over the protective insulating layer 203 and electrically connected to the second metal wiring layer 237. A wiring led from the terminal portion is also formed using a metal wiring.

Furthermore, in order to reduce the wiring resistance, the metal wirings (i.e., the first metal wiring layer 236 and the second metal wiring layer 237) can be used as the auxiliary wirings for the gate wiring layer and a capacitor wiring layer in a portion that does not serve as a display region.

Figure 8B:
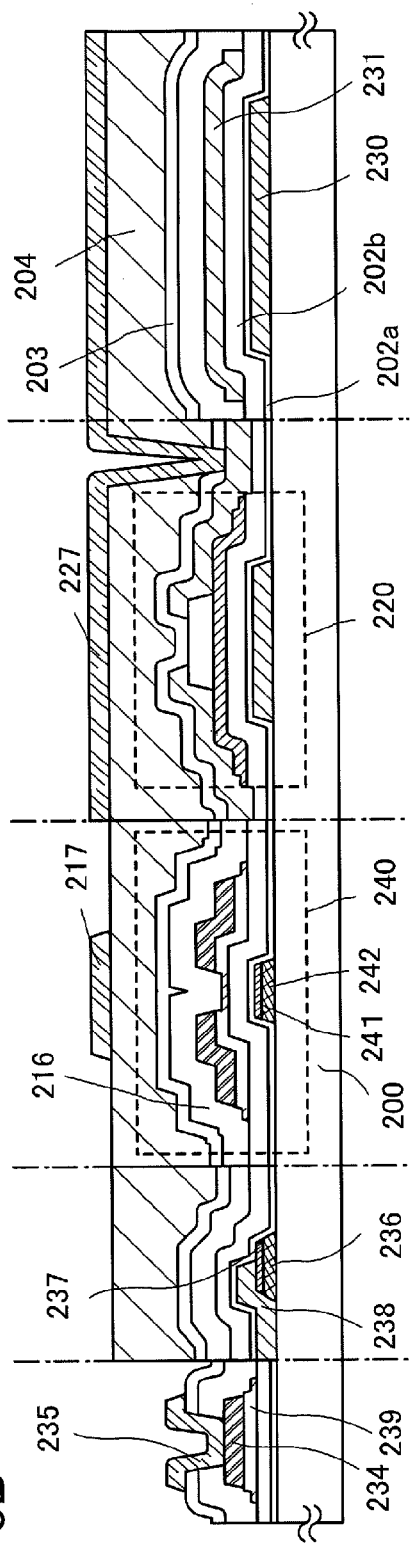

FIG. 8B illustrates a cross-sectional structure, part of which is different from the structure in FIG. 8A. FIG. 8B is the same as FIG. 8A except for a material of the gate electrode layer in the thin film transistor in the driver circuit; therefore, the same portions are denoted by the same reference numerals and detailed description of the same portions is not repeated.

FIG. 8B illustrates an example in which the gate electrode layer in the thin film transistor in the driver circuit is made from a metal wiring. In the driver circuit, a material of the gate electrode layer is not limited to a light-transmitting material.

In FIG. 8B, a thin film transistor 240 in the driver circuit includes a gate electrode layer in which a second metal wiring layer 241 is stacked over a first metal wiring layer 242. Note that the first metal wiring layer 242 can be formed from the same material in the same step as the first metal wiring layer 236. Moreover, the second metal wiring layer 241 can be formed from the same material in the same step as the second metal wiring layer 237.

In the case where the first metal wiring layer 242 is electrically connected to the conductive layer 217, it is preferable to use a metal nitride film as the second metal wiring layer 241 for preventing oxidation of the first metal wiring layer 242.

In this embodiment, a metal wiring is used for some wirings so that the wiring resistance is reduced, and high definition of display images and a high aperture ratio can be achieved even when the size of a liquid crystal display panel exceeds 10 inches and reaches 60 inches and even 120 inches.
(Embodiment 7)

Figure 9A:
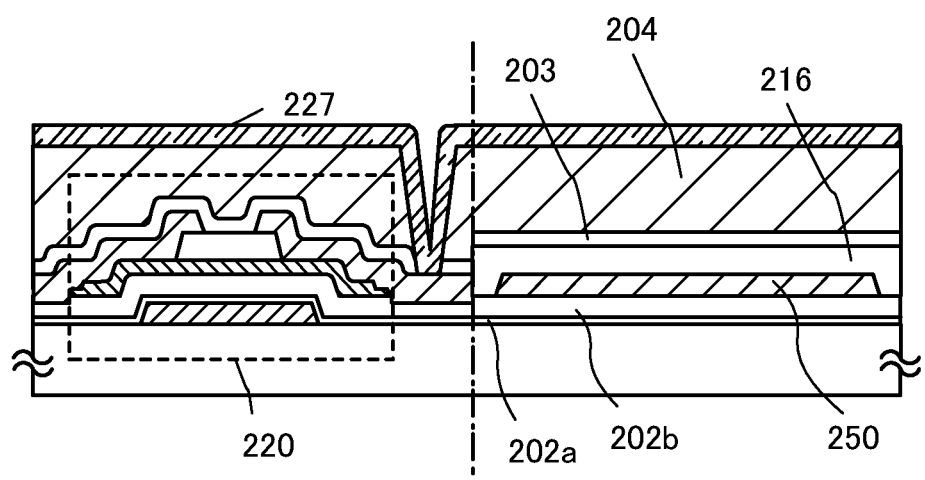
FIGS. 9A and 9B each illustrate a semiconductor device.
Figure 9B:
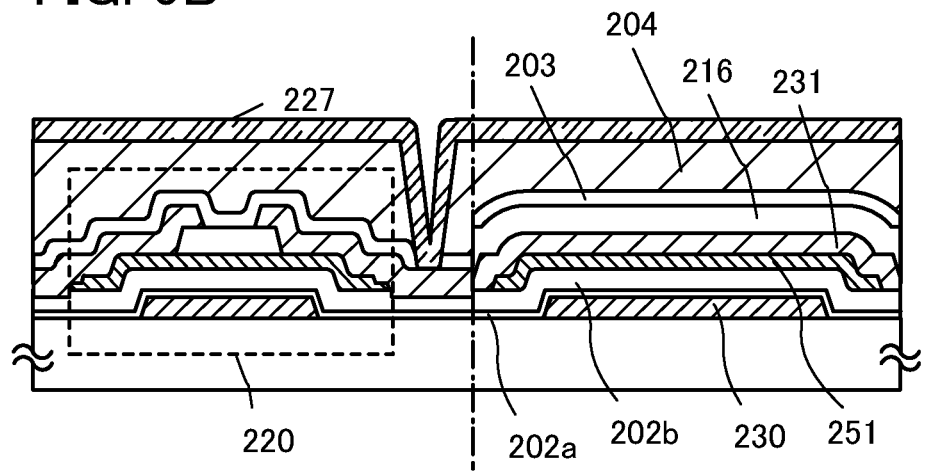

In this embodiment, an example of a structure of a storage capacitor, which is different from that in Embodiment 5, will be illustrated in FIGS. 9A and 9B. FIG. 9A is the same as FIG. 7A except for a structure of the storage capacitor; therefore, the same portions are denoted by the same reference numerals and detailed description of the same portions is not repeated. FIG. 9A illustrates a cross-sectional structure of the thin film transistor 220 in a pixel portion and a storage capacitor.

FIG. 9A illustrates an example in which the storage capacitor is constituted by the pixel electrode layer 227 and a capacitor wiring layer 250 that overlaps with the pixel electrode layer 227, with the oxide insulating layer 216, the protective insulating layer 203, and the planarization insulating layer 204 serving as dielectrics. Since the capacitor wiring layer 250 is formed from the same light-transmitting material in the same step as the source electrode layer of the thin film transistor 220 in the pixel portion, the capacitor wiring layer 250 is arranged so as not to overlap with a source wiring layer of the thin film transistor 220.

In the storage capacitor illustrated in FIG. 9A, a pair of electrodes and the dielectrics have light-transmitting properties, and thus the storage capacitor as a whole has light-transmitting properties.

FIG. 9B illustrates an example of a structure of the storage capacitor, which is different from that in FIG. 9A. FIG. 9B is the same as FIG. 7A except for a structure of the storage capacitor; therefore, the same portions are denoted by the same reference numerals and detailed description of the same portions is not repeated.

FIG. 9B illustrates an example in which the storage capacitor is constituted by the capacitor wiring layer 230 and a stack of an oxide semiconductor layer 251 that overlaps with the capacitor wiring layer 230 and the capacitor electrode 231 with the first gate insulating layer 202a and the second gate insulating layer 202b serving as dielectrics. The capacitor electrode 231 is stacked on and in contact with the oxide semiconductor layer 251 and functions as one electrode of the storage capacitor. Note that the oxide semiconductor layer 251 is formed from the same light-transmitting material in the same step as the source electrode layer and the drain electrode layer of the thin film transistor 220. Moreover, since the capacitor wiring layer 230 is formed from the same light-transmitting material in the same step as the gate electrode layer of the thin film transistor 220, the capacitor wiring layer 230 is arranged so as not to overlap with a gate wiring layer of the thin film transistor 220.

The capacitor electrode 231 is electrically connected to the pixel electrode layer 227.

Also in the storage capacitor illustrated in FIG. 9B, a pair of electrodes and the dielectrics have light-transmitting properties, and thus the storage capacitor as a whole has light-transmitting properties.

Each of the storage capacitors illustrated in FIGS. 9A and 9B has light-transmitting properties; thus, sufficient capacitance and high aperture ratio can be obtained even when the size of a pixel is decreased in order to realize higher definition of display images by increasing the number of gate wirings, for example.

This embodiment can be freely combined with any of other embodiments.
(Embodiment 8)

In this embodiment, an example will be described below in which at least some of driver circuits and a thin film transistor placed in a pixel portion are formed over one substrate.

The thin film transistor placed in the pixel portion is formed as described in any of Embodiments 1 to 4. Since the thin film transistor described in any of Embodiments 1 to 4 is an n-channel TFT, some of driver circuits that can be constituted by n-channel TFTs among the driver circuits are formed over a substrate where the thin film transistor in the pixel portion is formed.

Figure 14A:
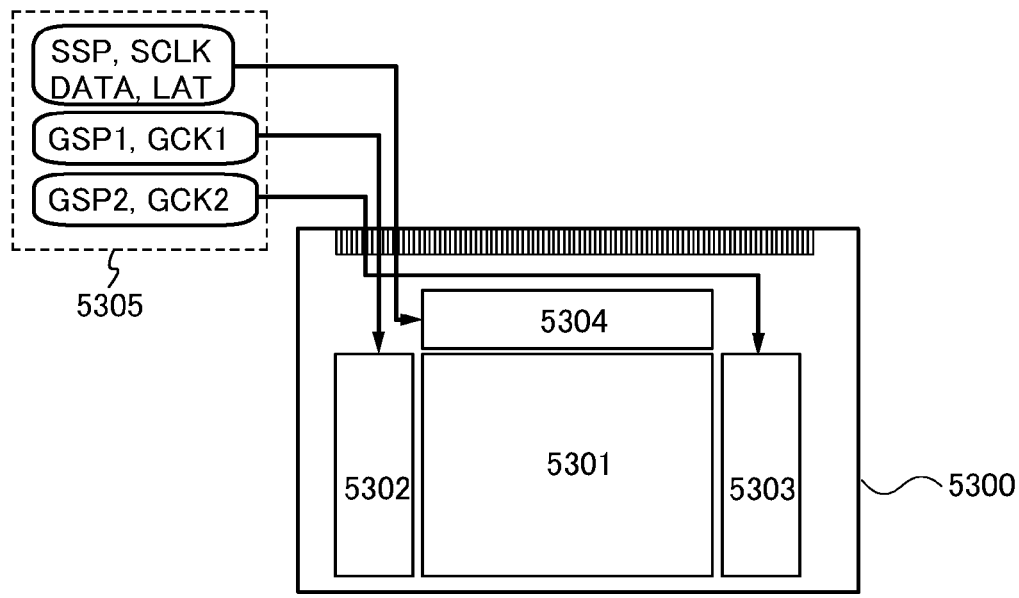
FIGS. 14A and 14B are block diagrams each illustrating a semiconductor device.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as an FPC (flexible printed circuit).

In FIG. 14A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connections in the connection portion in the case where wirings are extended from a driver circuit provided outside the substrate 5300 can be reduced, and the reliability or yield can be increased.

Note that the timing control circuit 5305 supplies, for example, a first scan line driver circuit start signal (GSP1) (a start signal is also referred to as a start pulse) and a scan line driver circuit clock signal (GCK1) to the first scan line driver circuit 5302. Furthermore, the timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
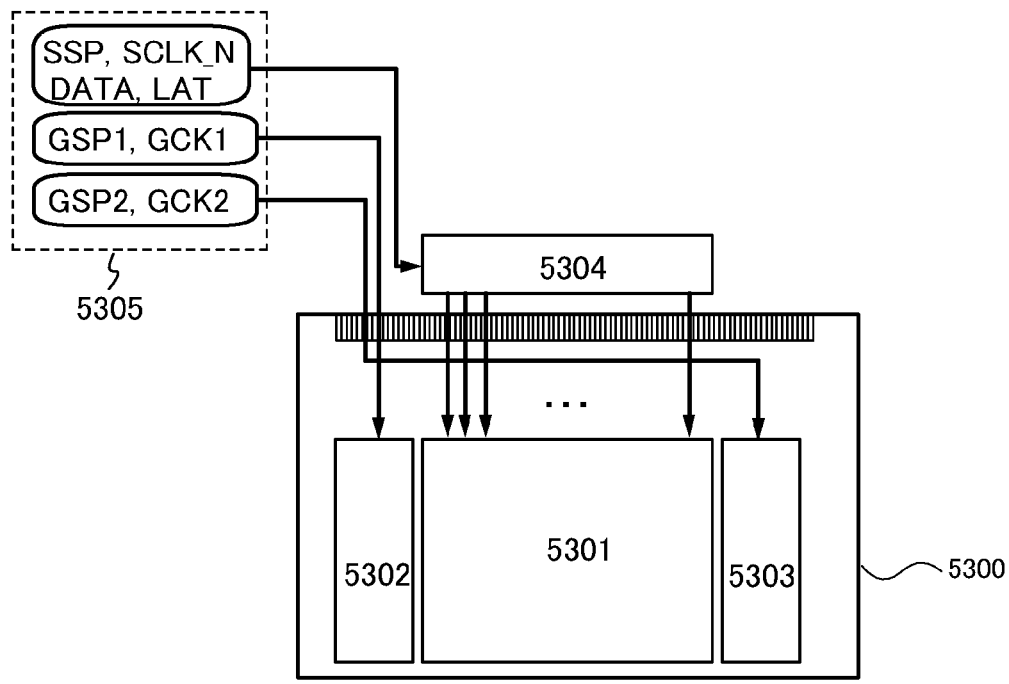

FIG. 14B illustrates a structure in which the first scan line driver circuit 5302 and the second scan line driver circuit 5303 are formed over the substrate 5300 where the pixel portion 5301 is formed, and the signal line driver circuit 5304 is formed over a substrate which is different from the substrate 5300 where the pixel portion 5301 is formed.

Figure 15A:
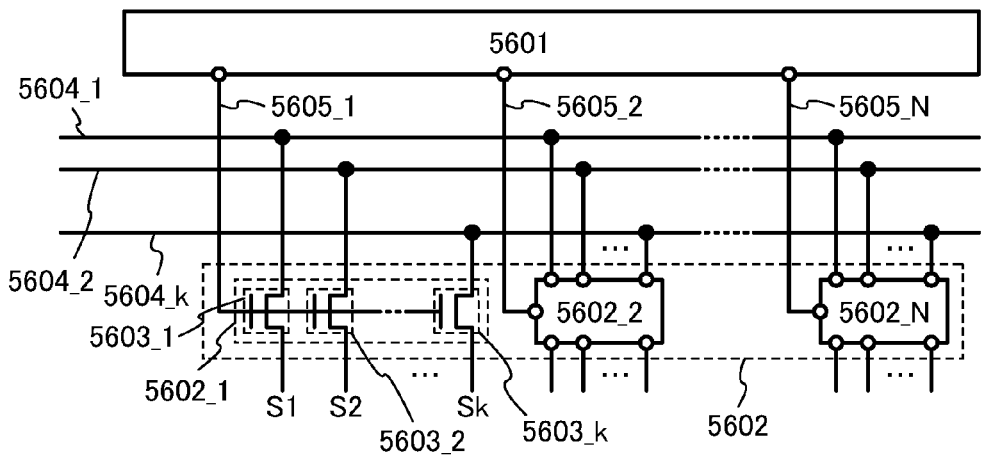
FIGS. 15A and 15B are a circuit diagram and a timing chart of a signal line driver circuit.
Figure 15B:
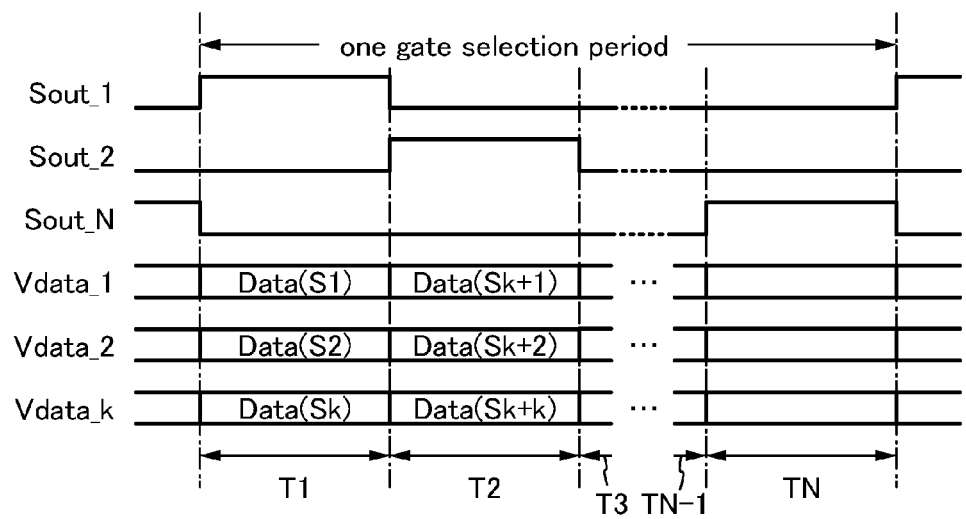

The thin film transistors in Embodiments 1 to 4 are n-channel TFTs. FIGS. 15A and 15B illustrate an example of a structure and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N(N is a natural number). The switching circuits 5602_1 to 5602_N each include a plurality of thin film transistors 5603_1 to 5603_k (k is a natural number). The example where the thin film transistors 5603_1 to 5603_k are n-channel TFTs is described below.

A connection relation in the signal line driver circuit is described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at high power supply potential level) to wirings 5605_1 to 5605_N.

The switching circuit 5602_1 has a function of controlling conduction states between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines S1 to Sk. In this manner, the switching circuit 5602_1 functions as a selector. Moreover, the thin film transistors 5603_1 to 5603_k have functions of controlling conduction states between the wirings 5604_1 to 5604_k and the signal lines S1 to Sk, respectively, that is, functions of supplying potentials of the wirings 5604_1 to 5604_k to the signal lines S1 to Sk, respectively. In this manner, each of the thin film transistors 5603_1 to 5603_k functions as a switch.

The video signal data (DATA) is input to each of the wirings 5604_1 to 5604_k. The video signal data (DATA) is often an analog signal that corresponds to an image signal or image data.

Next, the operation of the signal line driver circuit in FIG. 15A is described with reference to a timing chart in FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawing and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_k are turned on, so that the wirings 5604_1 to 5604_k and the signal lines S1 to Sk are brought into conduction. At this time, Data(S1) to Data(Sk) are input to the wirings 5604_1 to 5604_k, respectively. The Data(S1) to Data(Sk) are written into pixels in a first to kth columns in a selected row through the thin film transistors 5603_1 to 5603_k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the thin film transistors in Embodiments 1 to 4 can be used for the shift register 5601 and the switching circuit 5602. In that case, the shift register 5601 can be constituted by only n-channel transistors.

One embodiment of a shift register which is used for part of the scan line driver circuit and/or the signal line driver circuit is described with reference to FIGS. 16A to 16D and FIGS. 17A and 17B.

The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply a large current is used.

Figure 16A:
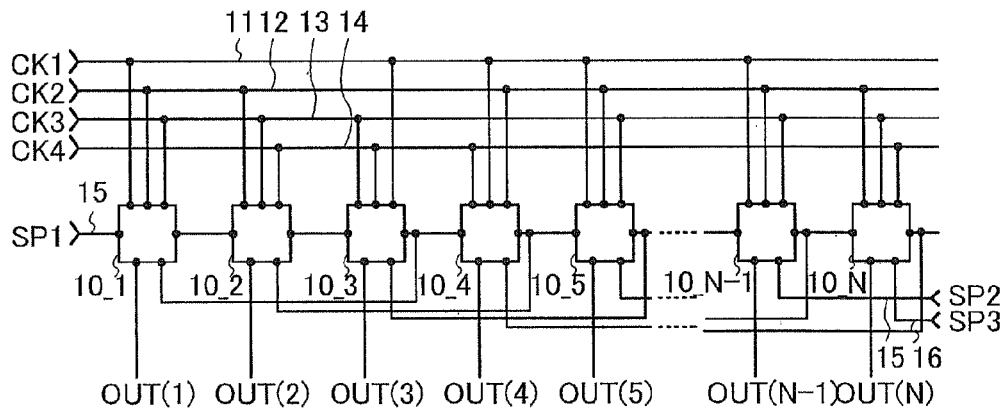
FIGS. 16A to 16D each illustrate a configuration of a shift register.

The shift register includes a first to Nth pulse output circuits 10_1 to 10_N (N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage and second output signals (OUT(1) to OUT(N)) to be input to another wiring or the like. Note that since the subsequent-stage signal OUT(n+2) is not input to the last two stages of the shift register as illustrated in FIG. 16A, a second start pulse SP2 and a third start pulse SP3 may be additionally input to the pulse output circuits of the last two stages, for example.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by 1/4 cycle sequentially (i.e., they are 90° out of phase with each other). In this embodiment, driving of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

Figure 16B:
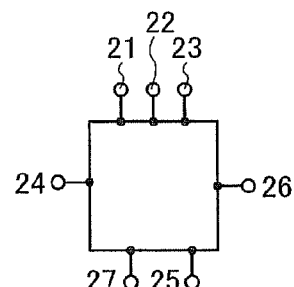
Figure 16C:
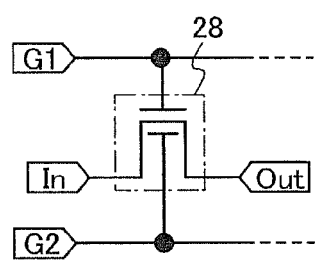

FIG. 16B is one of the pulse output circuits 10_n shown in FIG. 16A. A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

In the first to Nth pulse output circuits 10_1 to 10_N, the thin film transistor (TFT) having four terminals described in the above embodiment can be used in addition to a thin film transistor having three terminals. The symbol of a thin film transistor 28 illustrated in FIG. 16C indicates the thin film transistor having four terminals, which is described in any of Embodiments 1 to 5, and is used in the drawings and the like. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode. The thin film transistor 28 is an element which can control electric current between an IN terminal and an OUT terminal with a first control signal G1 which is input to a lower gate electrode and a second control signal G2 which is input to an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of a thin film transistor with four terminals can be controlled to be a desired value by controlling a potential of the upper gate electrode and/or the lower gate electrode.

Next, an example of a specific circuit configuration of the pulse output circuit illustrated in FIG. 16B will be described with reference to FIG. 16D.

Figure 16D:
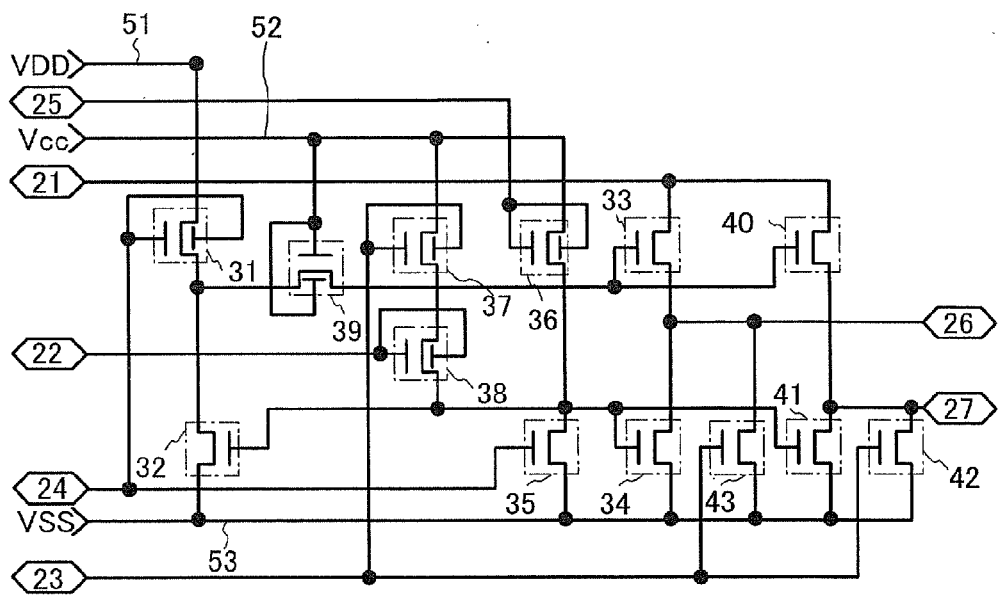

The pulse output circuit illustrated in FIG. 16D includes a first to thirteenth transistors 31 to 43. Signals or power supply potentials are supplied to the first to thirteenth transistors 31 to 43 from a power supply line 51 to which a first high power supply potential VDD is supplied, from a power supply line 52 to which a second high power supply potential VCC is supplied, and from a power supply line 53 to which a low power supply potential VSS is supplied, in addition to the first to fifth input terminals 21 to 25. Signals and the like are output from the first output terminal 26 and the second output terminal 27. The relation of the power supply potentials of the power supply lines in FIG. 16D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in threshold voltage of the transistor can be reduced, and degradation of the transistor can be suppressed without an adverse effect on the operation of the transistor. A thin film transistor with four terminals is preferably used as the first transistor 31 and the sixth to ninth transistors 36 to 39 among the first to thirteenth transistors 31 to 43. The first transistor 31 and the sixth to ninth transistors 36 to 39 need to operate so that a potential of a node to which one electrode serving as a source or a drain is connected is switched with a control signal of the gate electrode, and can further reduce a malfunction of the pulse output circuit since response to the control signal input to the gate electrode is fast (the rise of on-state current is steep). Thus, by using the thin film transistor with four terminals, the threshold voltage can be controlled, and a malfunction of the pulse output circuit can be further reduced.

In FIG. 16D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 16D, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 17A).

Figure 17A:
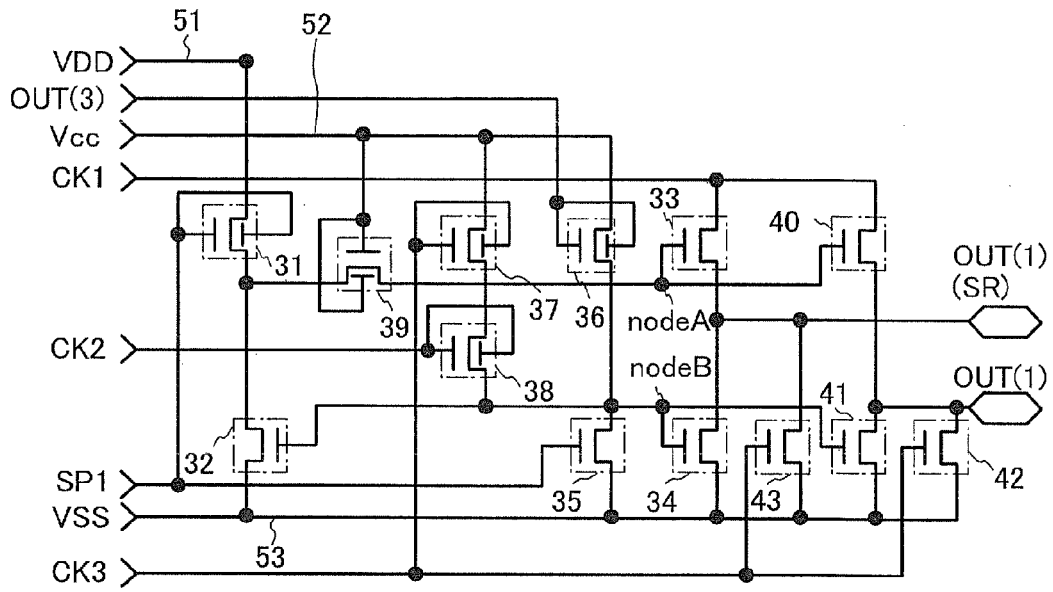
FIGS. 17A and 17B illustrate operation of a shift register.

FIG. 17A illustrates signals that are input to or output from the first to fifth input terminals 21 to 25 and the first and second output terminals 26 and 27 in the case where the pulse output circuit illustrated in FIG. 16D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 16D and FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
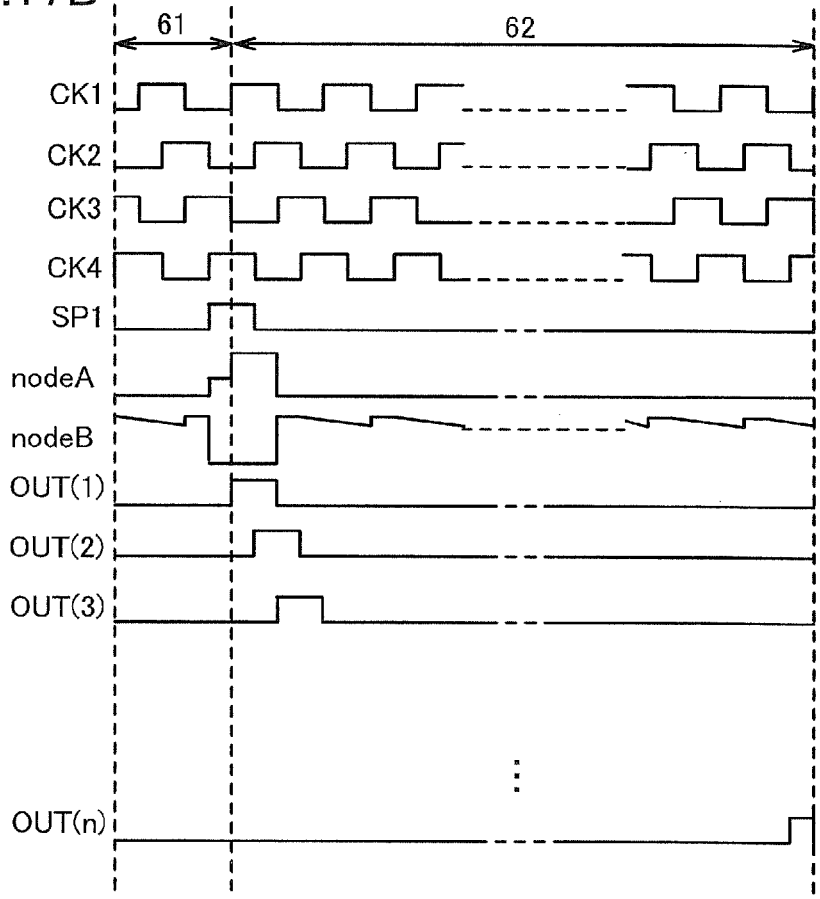

FIG. 17B illustrates a timing chart of a shift register including a plurality of pulse output circuits illustrated in FIG. 17A. Note that when the shift register is included in a scan line driver circuit, a period 61 in FIG. 17B corresponds to a vertical retrace period and a period 62 corresponds to a gate selection period.

Note that the placement of the ninth transistor 39 in which the second power supply potential VCC is applied to the gate as illustrated in FIG. 17A has the following advantages before and after bootstrap operation.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal, that is, the terminal on the power supply line 51 side. Consequently, in the first transistor 31, a high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, the placement of the ninth transistor 39 can lower the level of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 can be omitted, which results in reducing the number of transistors.

Note that an oxide semiconductor is used for semiconductor layers of the first to thirteenth transistors 31 to 43; thus, the off-state current of the thin film transistors can be reduced, the on-state current and field effect mobility can be increased, and the degree of degradation of the transistors can be reduced. As a result, a malfunction in the circuit can be reduced. Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 are supplied from the second input terminal 22 and the third input terminal 23, respectively. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. On the other hand, when a state of the seventh transistor 37 and the eighth transistor 38 in the shift register illustrated in FIG. 17A is changed as in the period in FIG. 17B so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 is caused only once by fall in potential of the gate electrode of the eighth transistor 38. Therefore, it is preferable to employ the connection relation such that the clock signal CK3 is supplied from the third input terminal 23 to the gate electrodes (the lower gate electrode and the upper gate electrode) of the seventh transistor 37 and the clock signal CK2 is supplied from the second input terminal 22 to the gate electrodes (the lower gate electrode and the upper gate electrode) of the eighth transistor 38. This is because the number of times of the change in the potential of the node B can be reduced, whereby the noise can be decreased.

In such a manner, an H-level signal is regularly supplied to the node B in a period during which the potentials of the first output terminal 26 and the second output terminal 27 are held at L level; thus, a malfunction of the pulse output circuit can be suppressed.

(Embodiment 9)

A thin film transistor is manufactured, and a semiconductor device having a display function (also referred to as a display device) can be manufactured using the thin film transistor in a pixel portion and also in a driver circuit. Moreover, some or all of the driver circuits which include thin film transistors can be formed over a substrate where a pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like in its category. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is formed, a state after formation of a conductive film to be a pixel electrode and before etching of the conductive film to form the pixel electrode, or any other states.

Note that a display device in this specification refers to an image display device or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

Figures 1, 10A:
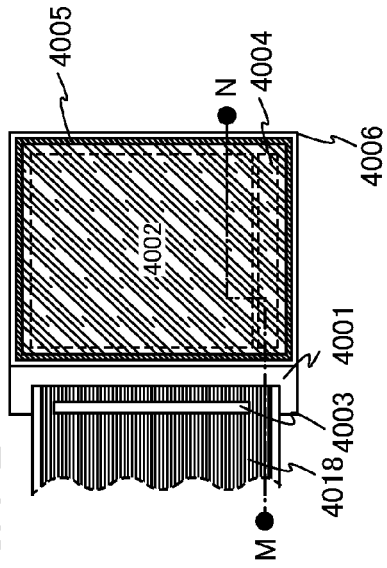
Figures 2, 10A:
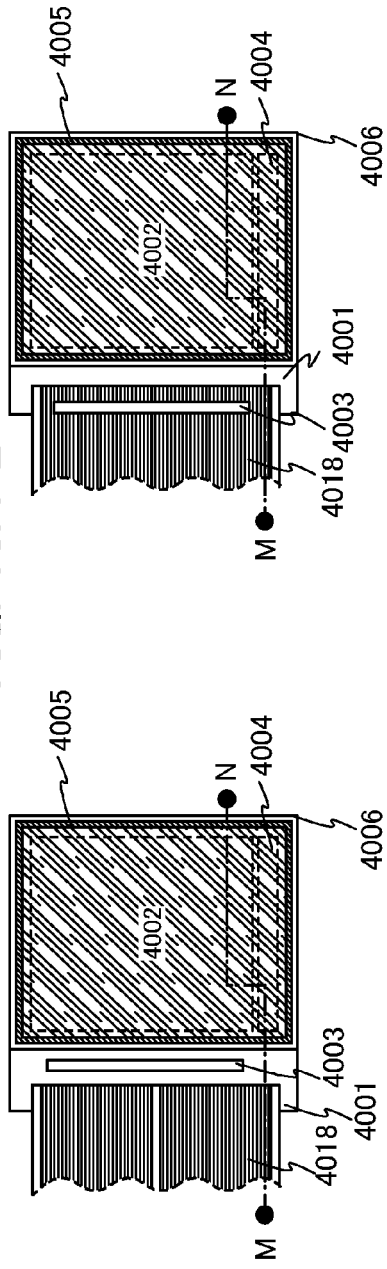
Figure 10B:
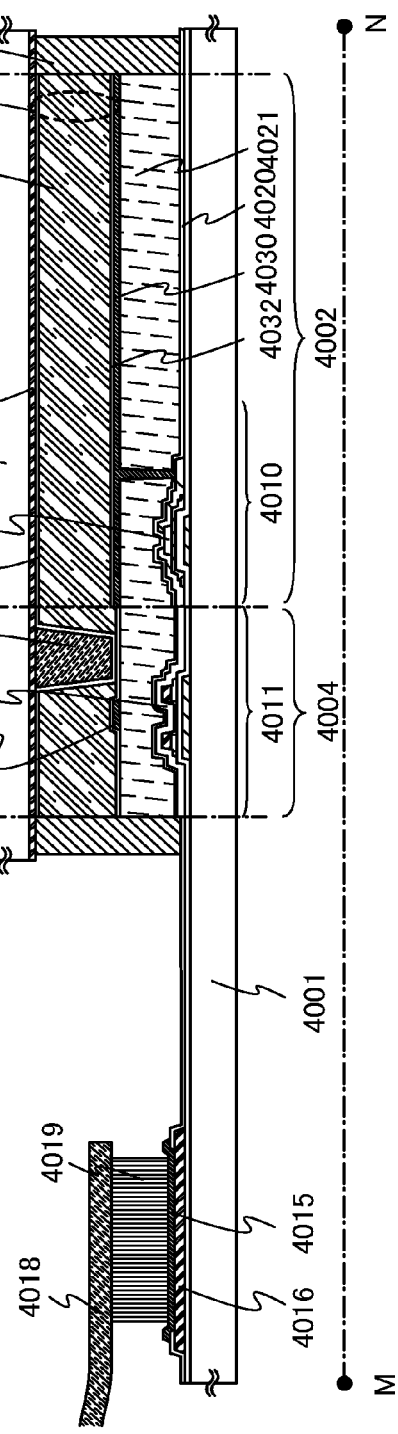

The appearance and a cross section of a liquid crystal display panel, which is one embodiment of a semiconductor device, will be described with reference to FIGS. 10A-1, 10A-2, and 10B. FIGS. 10A-1 and 10A-2 are plan views of panels in which thin film transistors 4010 and 4011 and a liquid crystal element 4013 are sealed between a first substrate 4001 and a second substrate 4006 with a sealant 4005. FIG. 10B is a cross-sectional view along M-N in FIGS. 10A-1 and 10A-2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A-1 illustrates an example in which the signal line driver circuit 4003 is mounted by a COG method. FIG. 10A-2 illustrates an example in which the signal line driver circuit 4003 is mounted by a TAB method.

The pixel portion 4002 and the scan line driver circuit 4004 provided over the first substrate 4001 include a plurality of thin film transistors. FIG. 10B illustrates the thin film transistor 4010 included in the pixel portion 4002 and the thin film transistor 4011 included in the scan line driver circuit 4004, as an example. Insulating layers 4041, 4042, 4020, and 4021 are provided over the thin film transistors 4010 and 4011.

Any of the highly reliable thin film transistors including the oxide semiconductor layers which are described in Embodiments 1 to 4 can be used as the thin film transistors 4010 and 4011. The thin film transistor 460 or the thin film transistor 499 described in Embodiments 1 to 4 can be used as the thin film transistor 4011 for the driver circuit. The thin film transistor 470 or the thin film transistor 498 can be used as the thin film transistor 4010 for a pixel. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. As plastics, a fiberglass-reinforced plastic (FRP) plate, a polyvinyl fluoride (PVF) film, a polyester film, or an acrylic resin film can be used.

A columnar spacer 4035 is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within a relatively narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

In the example of the liquid crystal display device, a polarizing plate is provided on the outer surface of the substrate (on the viewer side) and a coloring layer (a color filter) and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided except in the display portion.

In the thin film transistor 4011, the insulating layer 4041 is formed in contact with the semiconductor layer including the channel formation region, as a protective insulating film. In the thin film transistor 4010, the insulating layer 4042 is formed as a channel protective layer. The insulating layers 4041 and 4042 can be formed using a material and a method which are similar to those of the oxide insulating layers 466 and 476 described in Embodiment 1. Moreover, the insulating layer 4021 functioning as a planarization insulating film covers the thin film transistors in order to reduce surface unevenness of the thin film transistors. Here, as the insulating layers 4041 and 4042, a silicon oxide film is formed by a sputtering method according to Embodiment 1.

The insulating layer 4020 is formed over the insulating layers 4041 and 4042. The insulating layer 4020 can be formed using a material and a method which are similar to those of the protective insulating layer 453 described in Embodiment 1. Here, a silicon nitride film is formed by an RF sputtering method as the insulating layer 4020.

The insulating layer 4021 is formed as the planarization insulating film. The insulating layer 4021 can be formed using a material and a method which are similar to those of the planarization insulating layer 454 described in Embodiment 1, and a heat-resistant organic material such as polyimide, an acrylic resin, a benzocyclobutene-based resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like can be used. Note that the insulating layer 4021 may be formed by stacking a plurality of insulating films formed from these materials.

In this embodiment, a plurality of thin film transistors in the pixel portion may be surrounded together by a nitride insulating film. It is possible to use a nitride insulating film as the insulating layer 4020 and the gate insulating layer and to provide a region where the insulating layer 4020 is in contact with the gate insulating layer so as to surround at least the periphery of the pixel portion over the active matrix substrate as illustrated in FIGS. 10A-1, 10A-2, and 10B. In this manufacturing process, moisture can be prevented from entering from the outside. Moreover, entry of moisture from the outside can be prevented in the long term even after a device is completed as a semiconductor device, for example, as a display device; thus, the long-term reliability of the device can be improved.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the insulating layer 4021, and the following method or means can be employed depending on the material: a sputtering method, an SOG method, a spin coating method, a dipping method, a spray coating method, a droplet discharge method (e.g., an ink-jet method, screen printing, or offset printing), a roll coating method, a curtain coating method, a knife coating method, or the like. The baking step of the insulating layer 4021 also serves as annealing of the semiconductor layer, whereby a semiconductor device can be efficiently manufactured.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more kinds of these materials.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 10A-1, 10A-2, and 10B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
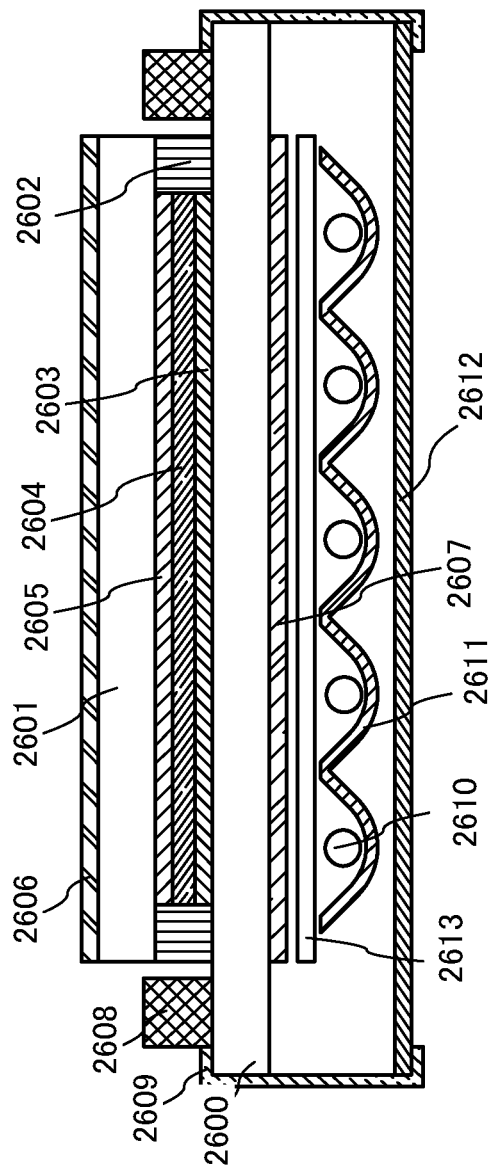
FIG. 19 illustrates a semiconductor device.

FIG. 19 illustrates an example of a liquid crystal display module which is formed as a semiconductor device by using a TFT substrate 2600 manufactured according to the manufacturing method disclosed in this specification.

FIG. 19 shows an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above-described steps, a highly reliable liquid crystal display panel can be manufactured as a semiconductor device.

This embodiment can be implemented in appropriate combination with any of the structures described in the other embodiments.

(Embodiment 10)

In this embodiment, an example of an electronic paper will be described as one embodiment of a semiconductor device.

The semiconductor device can be used for electronic paper in which electronic ink is driven by an element electrically connected to a switching element. The electronic paper is also referred to as an electrophoretic display device (an electrophoretic display) and has advantages in that it has the same level of readability as regular paper, it has lower power consumption than other display devices, and it can be made thin and lightweight.

Electrophoretic displays can have various modes. Electrophoretic displays contain a plurality of microcapsules dispersed in a solvent or a solute, each of which contains first particles that are positively charged and second particles that are negatively charged. By applying an electric field to the microcapsules, the particles in the microcapsules move in opposite directions to each other and only the color of the particles gathering on one side is displayed. Note that the first particles and the second particles contain a pigment and do not move without an electric field. Moreover, the first particles and the second particles have different colors (which may be colorless).

In this way, an electrophoretic display utilizes a so-called dielectrophoretic effect by which a substance having a high dielectric constant moves to a high-electric field region. An electrophoretic display device does not need to use a polarizing plate which is required in a liquid crystal display device.

A solution in which the above-described microcapsules are dispersed in a solvent is referred to as electronic ink. This electronic ink can be printed on a surface of glass, plastic, cloth, paper, or the like. Furthermore, color display can be achieved with a color filter or particles including a pigment.

When a plurality of the above-described microcapsules are arranged as appropriate over an active matrix substrate so as to be sandwiched between two electrodes, an active matrix display device can be completed, and display can be performed by application of an electric field to the microcapsules. For example, the active matrix substrate including the thin film transistor in any of Embodiments 1 to 4 can be used.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 18:
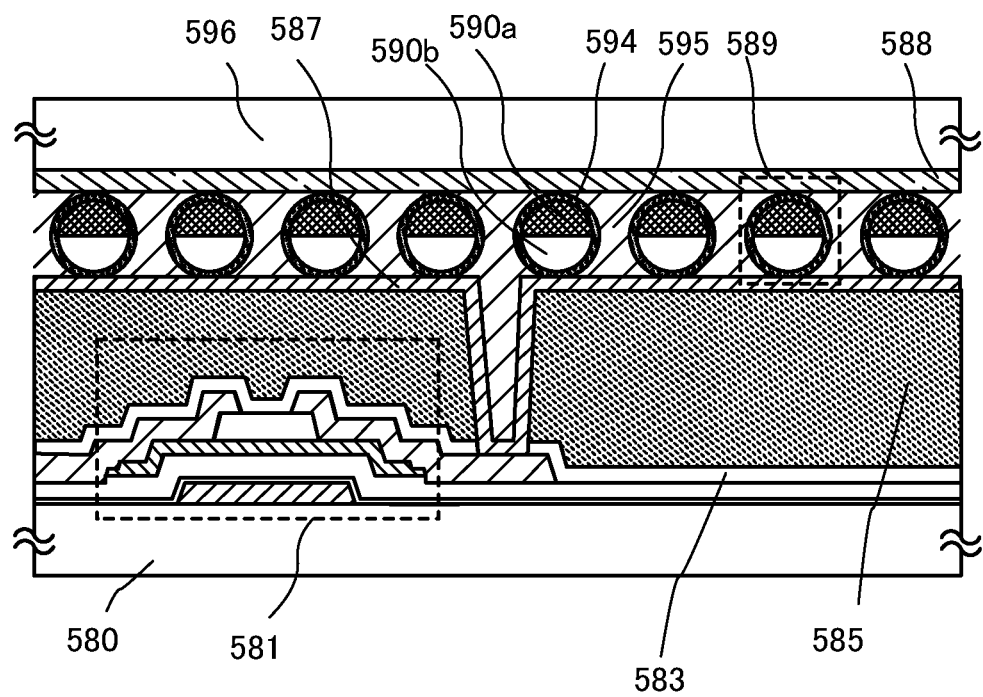
FIG. 18 illustrates a semiconductor device.

FIG. 18 illustrates an active matrix electronic paper as an example of a semiconductor device. A thin film transistor 581 used for the semiconductor device can be formed in a manner similar to the thin film transistor described in Embodiment 1 and is a highly reliable thin film transistor including an oxide semiconductor layer. Moreover, any of the thin film transistors described in Embodiments 2 to 4 can also be used as the thin film transistor 581 in this embodiment.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and covered with an insulating film 583 that is in contact with a semiconductor layer. A source electrode layer or a drain electrode layer of the thin film transistor 581 is in contact with a first electrode layer 587 at an opening formed in the insulating film 583 and an insulating layer 585, whereby the thin film transistor 581 is electrically connected to the first electrode layer 587. Spherical particles 589 are provided between the first electrode layer 587 and a second electrode layer 588 formed on a second substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the substrate where the thin film transistor 581 is formed. With the use of a common connection portion, the second electrode layer 588 and the common potential line can be electrically connected to each other through conductive particles provided between a pair of substrates.

Alternatively, it is possible to use an electrophoretic element instead of the element using the twisting ball. A microcapsule having a diameter of approximately 10 µm to 200 µm, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and a device including the electrophoretic display element is called electronic paper in general. The electrophoretic display element has higher reflectance than a liquid crystal display element; thus, an auxiliary light is unnecessary, power consumption is low, and a display portion can be recognized in a dim environment. In addition, even when power is not supplied to the display portion, an image which has been displayed once can be maintained. Consequently, a displayed image can be stored even if a semiconductor device having a display function (which may be referred to as a display device simply or a semiconductor device provided with a display device) is disconnected from a power supply.

Through the above-described steps, a highly reliable electronic paper can be manufactured as a semiconductor device.

This embodiment can be implemented in appropriate combination with any of the structures described in the other embodiments.

(Embodiment 11)

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that here, an organic EL element is described as a light-emitting element.

Figure 12:
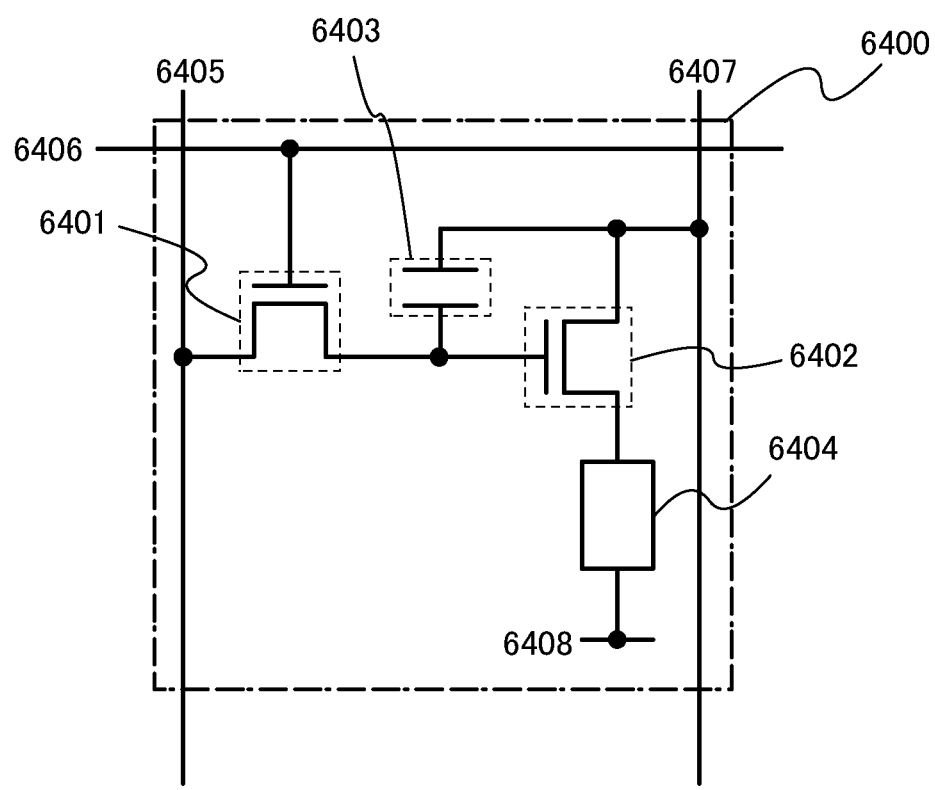
FIG. 12 illustrates an equivalent circuit of a pixel in a semiconductor device.

FIG. 12 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a transistor 6402 for driving a light-emitting element (hereinafter referred to as the driving transistor 6402), a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is lower than a high power supply potential that is set to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. In order to make the light-emitting element 6404 emit light, each potential is set so that the potential difference between the high power supply potential and the low power supply potential is higher than or equal to the forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed with the channel region and the gate electrode.

In the case of employing a voltage-input voltage-driving method, a video signal is input to the gate of the driving transistor 6402 so that the driving transistor 6402 is in either of two states of being sufficiently turned on or turned off. That is, the driving transistor 6402 operates in a linear region. Since the driving transistor 6402 operates in the linear region, a voltage higher than the voltage of the power supply line 6407 is applied to the gate of the driving transistor 6402. Note that a voltage higher than or equal to the sum of the power supply line voltage and Vth of the driving transistor 6402 is applied to the signal line 6405.

In the case of employing an analog grayscale method instead of the digital time grayscale method, the same pixel structure as in FIG. 12 can be employed by changing signal input.

In the case of performing analog grayscale driving, a voltage higher than or equal to voltage which is the sum of the forward voltage of the light-emitting element 6404 and Vth of the driving transistor 6402 is applied to the gate of the driving transistor 6402. The forward voltage of the light-emitting element 6404 indicates a voltage at which a desired luminance is obtained, and is larger than at least a forward threshold voltage. The video signal by which the driving transistor 6402 operates in a saturation region is input, so that current can be supplied to the light-emitting element 6404. In order to operate the driving transistor 6402 in the saturation region, the potential of the power supply line 6407 is set higher than the gate potential of the driving transistor 6402. When an analog video signal is used, a current corresponding to the video signal can be supplied to the light-emitting element 6404, so that analog grayscale driving can be performed.

Note that the pixel structure is not limited to that illustrated in FIG. 12. For example, a switch, a resistor, a capacitor, a transistor, a logic circuit, or the like may be added to the pixel illustrated in FIG. 12.

Next, a structure of a light-emitting element will be described with reference to FIGS. 13A to 13C. Here, a cross-sectional structure of a pixel will be described using an n-channel driving TFT as an example. TFTs 7001, 7011, and 7021 serving as driving TFTs used in semiconductor devices illustrated in FIGS. 13A, 13B, and 13C can be formed in a manner similar to the thin film transistor described in Embodiment 1 and are highly reliable thin film transistors each including an oxide semiconductor layer. Alternatively, any of the thin film transistors described in Embodiments 2 to 4 can be employed as the TFTs 7001, 7011, and 7021.

In order to extract light emitted from the light-emitting element, at least one of an anode and a cathode needs to transmit light. A thin film transistor and a light-emitting element are formed over a substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element having the top emission structure is described with reference to FIG. 13A.

Figure 13A:
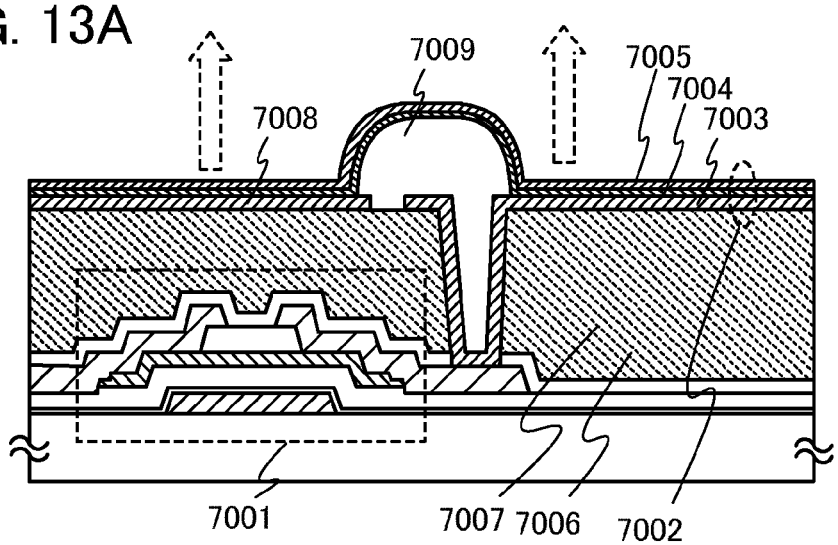
FIGS. 13A to 13C each illustrate a semiconductor device.

FIG. 13A is a cross-sectional view of a pixel in the case where the TFT 7001 serving as the driving TFT is an n-channel TFT and light emitted from a light-emitting element 7002 passes through an anode 7005. In FIG. 13A, a cathode 7003 of the light-emitting element 7002 is electrically connected to the TFT 7001 serving as the driving TFT, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron injection layer, an electron transport layer, a light-emitting layer, a hole transport layer, and a hole injection layer in this order over the cathode 7003. Note that it is not necessary to form all of these layers. The anode 7005 is formed using a light-transmitting conductive film, for example, a film of indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Moreover, a bank 7009 is provided between the cathode 7003 and a cathode 7008 in an adjacent pixel so as to cover edges of the cathodes 7003 and 7008. The bank 7009 can be formed using an organic resin film of polyimide, an acrylic resin, polyamide, an epoxy resin, or the like; an inorganic insulating film; or a polysiloxane. It is particularly preferable that the bank 7009 be formed using a photosensitive resin material so that its side surface is an inclined surface with continuous curvature. When a photosensitive resin material is used for the bank 7009, a step of forming a resist mask can be omitted.

The light-emitting element 7002 corresponds to a region where the light-emitting layer 7004 is sandwiched between the cathode 7003 and the anode 7005. In the pixel illustrated in FIG. 13A, light is emitted from the light-emitting element 7002 to the anode 7005 side as indicated by arrows.

Next, a light-emitting element having the bottom emission structure is described with reference to FIG. 13B. FIG. 13B is a cross-sectional view of a pixel in the case where the driving TFT 7011 is an n-channel TFT and light is emitted from a light-emitting element 7012 to a cathode 7013 side. In FIG. 13B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has light-transmitting properties. The cathode 7013 can be formed using a variety of conductive materials as in the case of FIG. 13A as long as they have a low work function. Note that the cathode 7013 is formed to a thickness that can transmit light (preferably approximately 5 nm to 30 nm). For example, a 20-nm-thick aluminum film can be used as the cathode 7013. As in the case of FIG. 13A, the light-emitting layer 7014 may be formed using a single layer or a plurality of layers stacked. The anode 7015 is not necessary to transmit light, but can be formed using a light-transmitting conductive material as in the case of FIG. 13A. For the light-blocking film 7016, a metal or the like that reflects light can be used, for example; however, the light-blocking film 7016 is not limited to a metal film. For example, a resin or the like to which a black pigment is added can be used.

Moreover, a bank 7019 is provided between the conductive film 7017 and a conductive film 7018 in an adjacent pixel so as to cover edges of the conductive films 7017 and 7018. The bank 7019 can be formed using an organic resin film of polyimide, an acrylic resin, polyamide, an epoxy resin, or the like; an inorganic insulating film; or a polysiloxane. It is particularly preferable that the bank 7019 be formed using a photosensitive resin material so that its side surface is an inclined surface with continuous curvature. When a photosensitive resin material is used for the bank 7019, a step of forming a resist mask can be omitted.

The light-emitting element 7012 corresponds to a region where the light-emitting layer 7014 is sandwiched between the cathode 7013 and the anode 7015. In the pixel illustrated in FIG. 13B, light is emitted from the light-emitting element 7012 to the cathode 7013 side as indicated by arrows.

Next, a light-emitting element having the dual emission structure is described with reference to FIG. 13C. In FIG. 13C, a cathode 7023 of a light-emitting element 7022 is formed over a light-transmitting conductive film 7027 that is electrically connected to the driving TFT 7021, and a light-emitting layer 7024 and an anode 7025 are sequentially stacked over the cathode 7023. As in the case of FIG. 13A, the cathode 7023 can be formed using any of a variety of materials as long as it is a conductive material having a low work function. Note that the cathode 7023 is formed to a thickness that can transmit light. For example, a 20-nm-thick film of Al can be used as the cathode 7023. As in the case of FIG. 13A, the light-emitting layer 7024 may be formed using a single layer or a plurality of layers stacked. The anode 7025 can be formed using a light-transmitting conductive material as in the case of FIG. 13A.

Moreover, a bank 7029 is provided between the conductive film 7027 and a conductive film 7028 in an adjacent pixel so as to cover edges of the conductive films 7027 and 7028. The bank 7029 can be formed using an organic resin film of polyimide, an acrylic resin, polyamide, an epoxy resin, or the like; an inorganic insulating film; or a polysiloxane. It is particularly preferable that the bank 7029 be formed using a photosensitive resin material so that its side surface is an inclined surface with continuous curvature. When a photosensitive resin material is used for the bank 7029, a step of forming a resist mask can be omitted.

The light-emitting element 7022 corresponds to a portion where the cathode 7023, the light-emitting layer 7024, and the anode 7025 overlap with one another. In the pixel illustrated in FIG. 13C, light is emitted from the light-emitting element 7022 to both the anode 7025 side and the cathode 7023 side as indicated by arrows.

Note that although the organic EL elements are described here as the light-emitting elements, an inorganic EL element can also be provided as a light-emitting element.

Note that the example is described in which the thin film transistor (the driving TFT) which controls the driving of a light-emitting element is electrically connected to the light-emitting element; alternatively, a structure may be employed in which a TFT for current control is connected between the driving TFT and the light-emitting element.

Figure 13B:
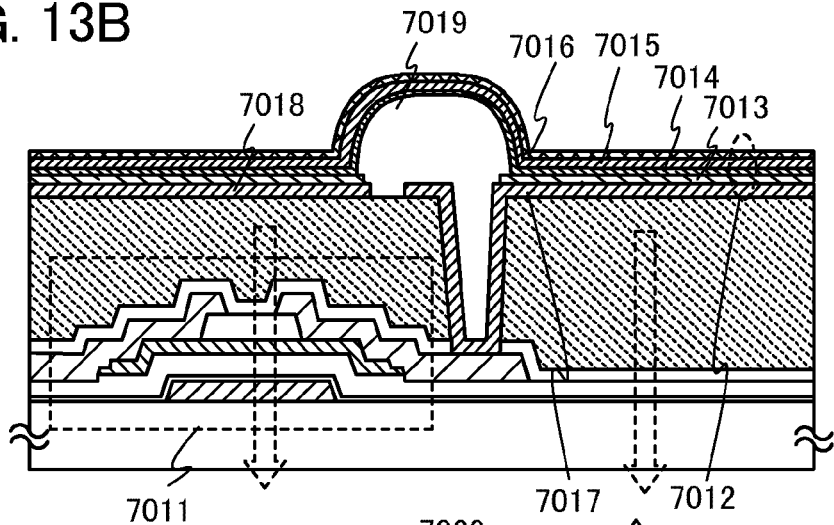
Figure 13C:
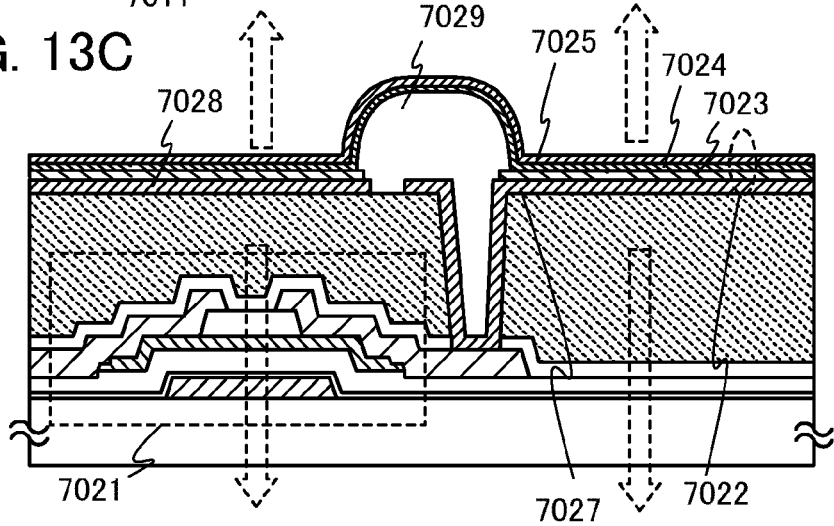

Note that the structure of the semiconductor device is not limited to those illustrated in FIGS. 13A to 13C and can be modified in various ways based on techniques disclosed in this specification.

Next, the appearance and a cross section of a light-emitting display panel (also referred to as a light-emitting panel) which is one embodiment of a semiconductor device will be described with reference to FIGS. 11A and 11B. FIG. 11A is a plan view of a panel in which a thin film transistor and a light-emitting element that are formed over a first substrate are sealed between the first substrate and a second substrate with a sealant. FIG. 11B is a cross-sectional view along H-I in FIG. 11A.

A sealant 4505 is provided so as to surround a pixel portion 4502, signal line driver circuits 4503*a* and 4503*b*, and scan line driver circuits 4504*a* and 4504*b* which are provided over a first substrate 4501. Moreover, a second substrate 4506 is provided over the pixel portion 4502, the signal line driver circuits 4503*a* and 4503*b*, and the scan line driver circuits 4504*a* and 4504*b*. Consequently, the pixel portion 4502, the signal line driver circuits 4503*a* and 4503*b*, and the scan line driver circuits 4504*a* and 4504*b* are sealed together with a filler 4507 by the first substrate 4501, the sealant 4505, and the second substrate 4506. In this manner, a panel is preferably packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 11B.

Any of the highly reliable thin film transistors including the oxide semiconductor layers described in any of Embodiments 1 to 4 can be used as the thin film transistors 4509 and 4510. The thin film transistor 460 or the thin film transistor 499 described in Embodiments 1 to 4 can be used as the thin film transistor 4509 for the driver circuit. The thin film transistor 470 or the thin film transistor 498 can be used as the thin film transistor 4510 for a pixel. In this embodiment, the thin film transistors 4509 and 4510 are n-channel thin film transistors.

A conductive layer 4540 is provided over part of an insulating layer 4544, which overlaps with a channel formation region of an oxide semiconductor layer in the thin film transistor 4509 for the driver circuit. The conductive layer 4540 is provided at the position overlapping with the channel formation region of the oxide semiconductor layer, whereby the amount of change in threshold voltage of the thin film transistor 4509 before and after the BT test can be reduced. A potential of the conductive layer 4540 may be the same or different from that of a gate electrode layer in the thin film transistor 4509. The conductive layer 4540 can also function as a second gate electrode layer. Alternatively, the potential of the conductive layer 4540 may be GND or 0 V, or the conductive layer 4540 may be in a floating state.

In the thin film transistor 4509, the insulating layer 4541 is formed in contact with the semiconductor layer including the channel formation region, as a protective insulating film. In the thin film transistor 4510, an insulating layer 4542 is formed as a channel protective layer. The insulating layers 4541 and 4542 can be formed using a material and a method which are similar to those of the oxide insulating layers 466 and 476 described in Embodiment 1. Moreover, the insulating layer 4544 functioning as a planarization insulating film covers the thin film transistors in order to reduce surface unevenness of the thin film transistors. Here, as the insulating layers 4541 and 4542, a silicon oxide film is formed by a sputtering method according to Embodiment 1.

Furthermore, an insulating layer 4543 is formed over the insulating layers 4541 and 4542. The insulating layer 4543 can be formed using a material and a method which are similar to those of the protective insulating layer 453 described in Embodiment 1. Here, a silicon nitride film is formed by an RF sputtering method as the insulating layer 4543.

The insulating layer 4544 is formed as the planarization insulating film. The insulating layer 4544 can be formed using a material and a method which are similar to those of the planarization insulating layer 454 described in Embodiment 1. Here, an acrylic resin is used for the insulating layer 4544.

In this embodiment, a plurality of thin film transistors in the pixel portion may be surrounded together by a nitride insulating film. It is possible to use a nitride insulating film as the insulating layer 4543 and a gate insulating layer and to provide a region where the insulating layer 4543 is in contact with the gate insulating layer so as to surround at least the periphery of the pixel portion over the active matrix substrate as illustrated in FIGS. 11A and 11B. In this manufacturing process, moisture can be prevented from entering from the outside. Moreover, entry of moisture from the outside can be prevented in the long term even after a device is completed as a semiconductor device, for example, as a display device; thus, the long-term reliability of the device can be improved.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to a layered structure of the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A bank 4520 is formed using an organic resin film, an inorganic insulating film, or a polysiloxane. It is particularly preferable that the bank 4520 be formed using a photosensitive material and an opening portion be formed over the first electrode layer 4517 so that a sidewall of the opening portion is formed as an inclined surface with continuous curvature.

The electroluminescent layer 4512 may be formed with a single layer or a plurality of layers stacked.

A protective film may be formed over the second electrode layer 4513 and the bank 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate positioned in the direction in which light is extracted from the light-emitting element 4511 needs to have light-transmitting properties. In that case, a light-transmitting material such as a glass plate, a plastic plate, a polyester film, or an acrylic film is used for the second substrate.

As the filler 4507, an ultraviolet curable resin or a thermosetting resin can be used in addition to an inert gas such as nitrogen or argon. For example, PVC (polyvinyl chloride), an acrylic resin, polyimide, an epoxy resin, a silicone resin, PVB (polyvinyl butyral), or EVA (a copolymer of ethylene with vinyl acetate) can be used. For example, nitrogen is used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment can be performed by which reflected light can be diffused by projections and depressions on the surface so as to reduce glare.

Alternatively, only the signal line driver circuits or part thereof, or only the scan line driver circuits or part thereof may be separately formed and mounted. This embodiment is not limited to the structure illustrated in FIGS. 11A and 11B.

Through the above-described steps, a highly reliable light-emitting display device (display panel) can be manufactured as a semiconductor device.

This embodiment can be implemented in appropriate combination with any of the structures described in the other embodiments.

(Embodiment 12)

Figure 20:
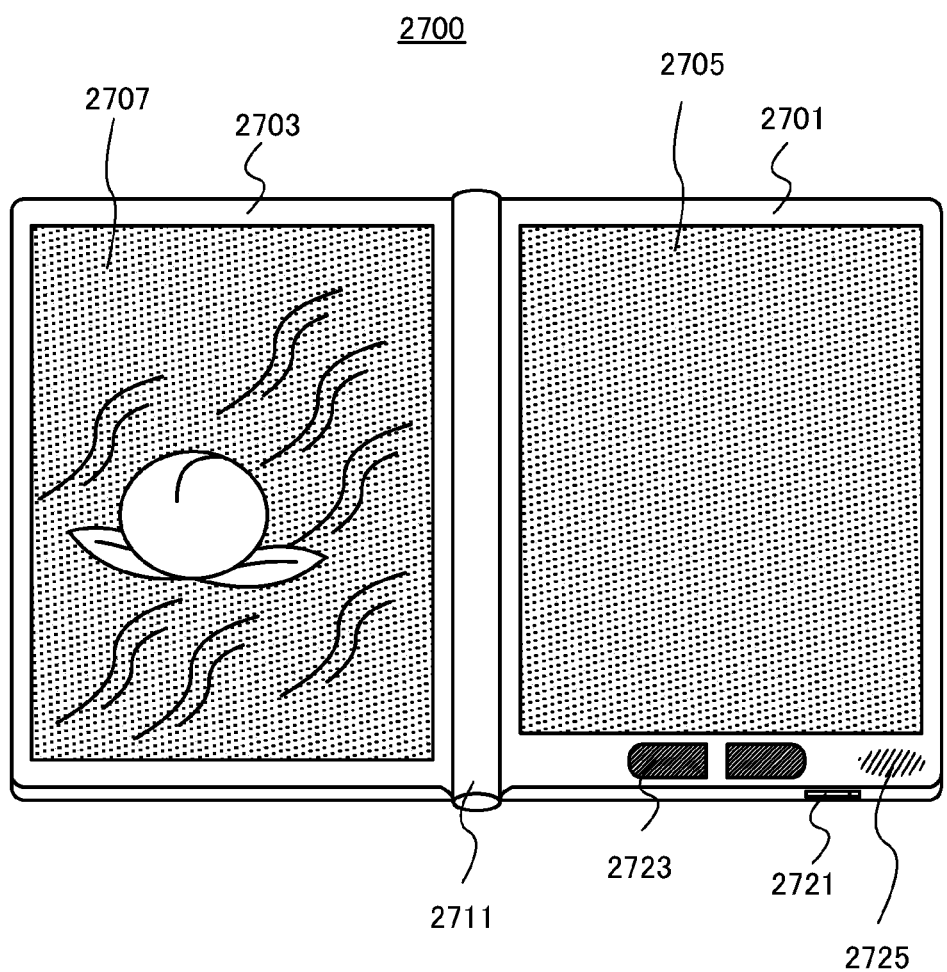
FIG. 20 is an external view illustrating an example of an e-book reader.

A semiconductor device disclosed in this specification can be applied to electronic paper. Electronic paper can be used for electronic devices in a variety of fields as long as they display data. For example, electronic paper can be applied to an e-book reader (an electronic book), a poster, an advertisement in a vehicle such as a train, or displays of a variety of cards such as a credit card. FIG. 20 illustrates an example of the electronic device.

FIG. 20 illustrates an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. When the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 20 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (e.g., an earphone terminal, a USB terminal, or a terminal connectable to a variety of cables such as an AC adapter and a USB cable), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

(Embodiment 13)

A semiconductor device disclosed in this specification can be applied to a variety of electronic devices (including game machines). Examples of such electronic devices are a television set (also referred to as a television or a television receiver), a monitor of a computer and the like, a camera such as a digital camera and a digital video camera, a digital photo frame, a mobile phone handset (also referred to as a mobile phone or a mobile phone device), a portable game machine, a portable information terminal, an audio reproducing device, and a large-sized game machine such as a pinball machine.

Figure 21A:
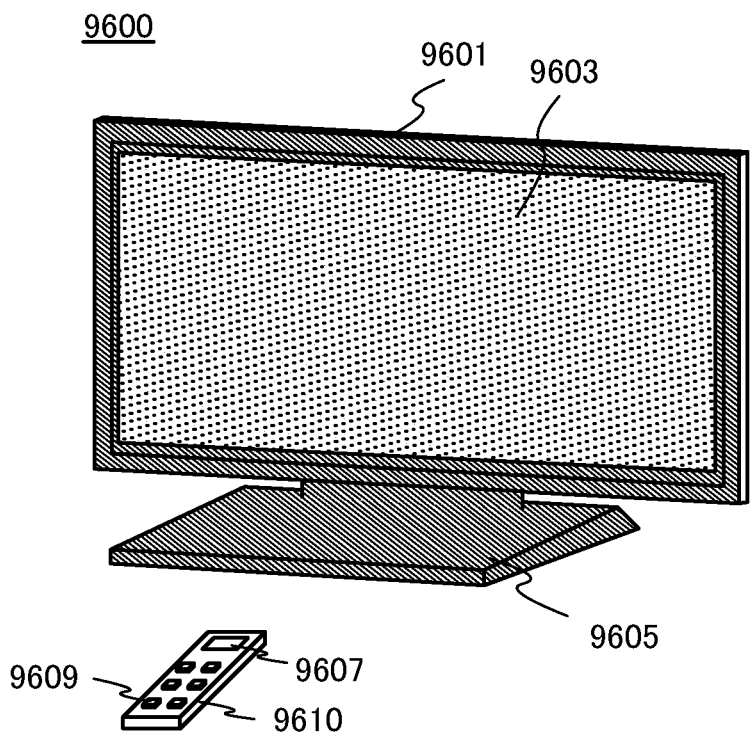
FIGS. 21A and 21B are external views illustrating examples of a television device and a digital photo frame.

FIG. 21A illustrates a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. With operation keys 9609 of the remote controller 9610, channels and volume can be controlled and an image displayed on the display portion 9603 can be controlled. Moreover, the remote controller 9610 may be provided with a display portion 9607 for displaying data output from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 21B:
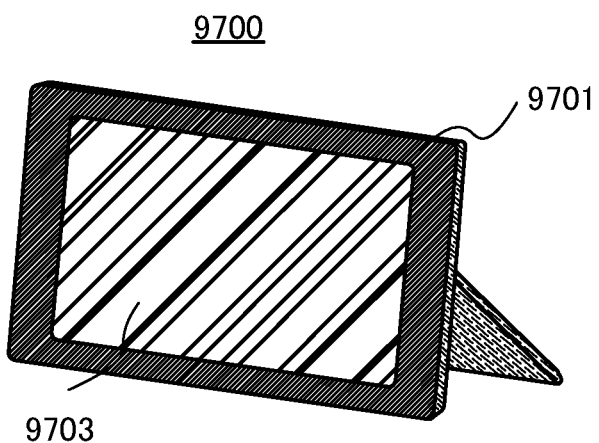

FIG. 21B illustrates a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (e.g., a USB terminal or a terminal connectable to a variety of cables such as a USB cable), a recording medium insertion portion, and the like. Although these components may be provided on the same surface as the display portion, it is preferable to provide them on the side surface or the back surface for design aesthetics. For example, a memory that stores data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 22A:
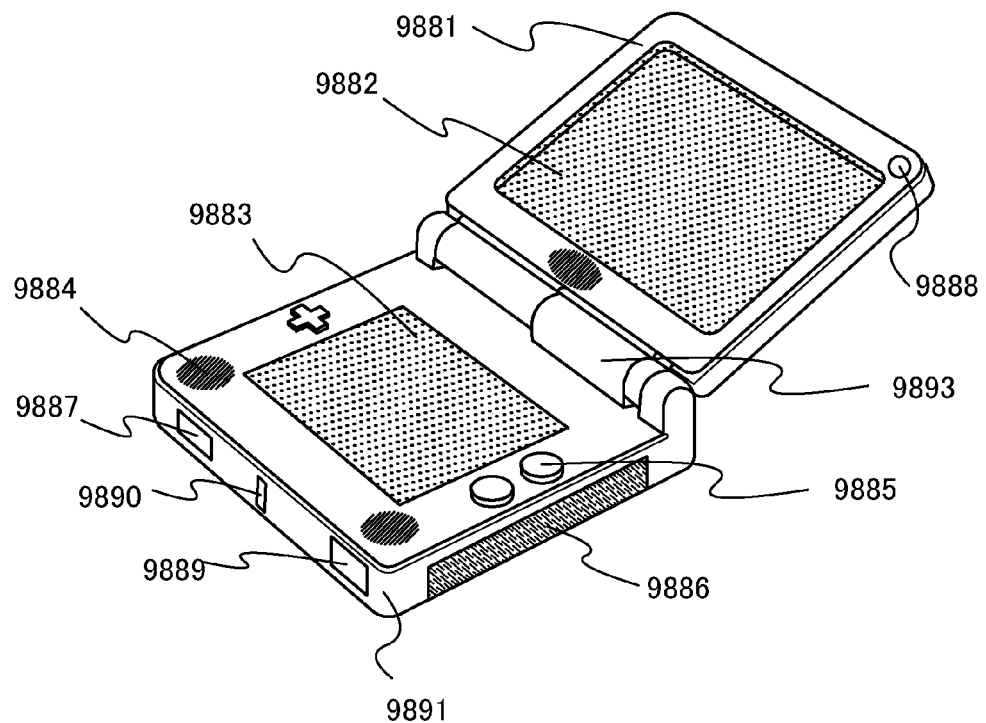
FIGS. 22A and 22B are external views each illustrating an example of a game machine.

FIG. 22A illustrates a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 22A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification can be employed. The portable game machine may include an additional accessory as appropriate. The portable game machine illustrated in FIG. 22A has a function of reading a program or data stored in the recording medium to display it on the display portion, and a function of sharing data with another portable game machine by wireless communication. Note that a function of the portable game machine in FIG. 22A is not limited to those described above, and the portable game machine can have a variety of functions.

Figure 22B:
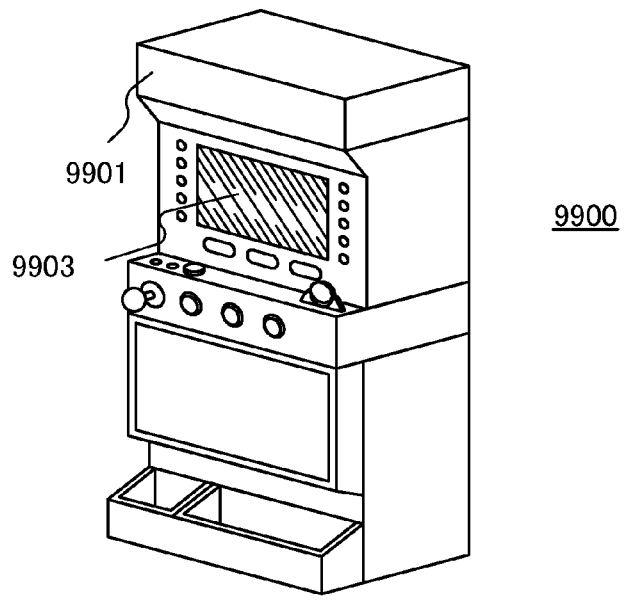

FIG. 22B illustrates a slot machine 9900 which is a large-sized game machine. In the slot machine 9900, a display portion 9903 is incorporated in a housing 9901. In addition, the slot machine 9900 includes operation means such as a start lever and a stop switch, a coin slot, a speaker, and the like. Needless to say, the structure of the slot machine 9900 is not limited to the above and other structures provided with at least a semiconductor device disclosed in this specification may be employed. The slot machine 9900 may include other accessory equipment as appropriate.

Figure 23A:
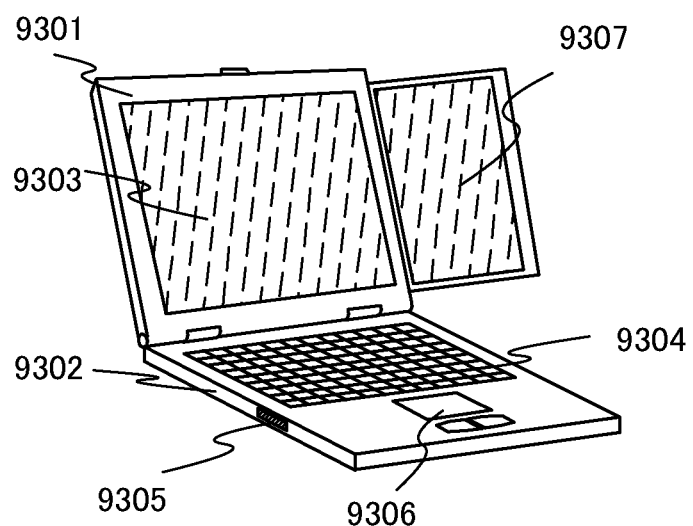
FIGS. 23A and 23B are external views illustrating examples of a portable computer and a mobile phone.

FIG. 23A is a perspective view illustrating an example of a portable computer.

In the portable computer illustrated in FIG. 23A, a top housing 9301 having a display portion 9303 and a bottom housing 9302 having a keyboard 9304 can overlap with each other by closing a hinge unit that connects the top housing 9301 and the bottom housing 9302. The portable computer illustrated in FIG. 23A is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 that can be stowed in the top housing 9301 by being slid therein. With the display portion 9307, a large display screen can be realized. In addition, a user can adjust the angle of a screen of the stowable display portion 9307. If the stowable display portion 9307 is a touch panel, the user can input data by touching part of the display portion 9307.

The display portion 9303 or the stowable display portion 9307 is formed using an image display device such as a liquid crystal display panel or a light-emitting display panel including an organic light-emitting element, an inorganic light-emitting element, or the like.

Further, the portable computer illustrated in FIG. 23A can be provided with a receiver and the like and can receive a TV broadcast to display images on the display portion. The user can watch a TV broadcast with the whole screen of the display portion 9307 by sliding and exposing the display portion 9370 and adjusting the screen angle, while the hinge unit which connects the top housing 9301 and the bottom housing 9302 is closed. In that case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 23B:
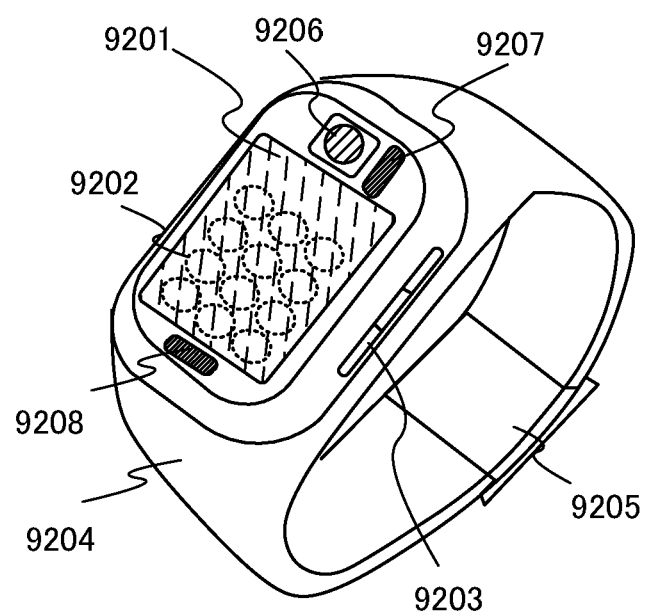

FIG. 23B is a perspective view of an example of a mobile phone that the user can wear on the wrist like a wristwatch.

This mobile phone is formed with a main body that includes a communication device having at least a telephone function, and a battery; a band portion 9204 that enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start taking images, or the like, and can be configured to have respective functions.

A user can input data into this mobile phone by touching the display portion 9201 with a finger or an input pen, operating the operation switches 9203, or inputting voice into the microphone 9208. In FIG. 23B, display buttons 9202 are displayed on the display portion 9201. A user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 23B is provided with a receiver of a TV broadcast and the like, and can display images on the display portion 9201 by receiving the TV broadcast. Moreover, the mobile phone may be provided with a storage device such as a memory, and the like and can record the TV broadcast in the memory. The mobile phone illustrated in FIG. 23B may have a function of collecting location information such as GPS.

An image display device such as a liquid crystal display panel or a light-emitting display panel including an organic light-emitting element, an inorganic light-emitting element, or the like is used as the display portion 9201. The mobile phone illustrated in FIG. 23B is compact and lightweight and thus has a limited battery capacity. For that reason, a panel that can be driven with low power consumption is preferably used as a display device used for the display portion 9201.

Note that although FIG. 23B illustrates the electronic device that is worn on the wrist, this embodiment is not limited thereto as long as an electronic device is portable.

(Embodiment 14)

In this embodiment, as one embodiment of a semiconductor device, examples of display devices each including the thin film transistor described in any of Embodiments 1 to 4 will be described with reference to FIGS. 24 to 37. In this embodiment, examples of liquid crystal display devices including a liquid crystal element as a display element will be described with reference to FIG. 24 to FIG. 37. The thin film transistor described in any of Embodiments 1 to 4 can be used as each of TFTs 628 and 629. The TFTs 628 and 629 can be manufactured through a process similar to that described in any of Embodiments 1 to 4 and have excellent electric characteristics and high reliability. The TFT 628 and the TFT 629 include a channel protection layer 608 and a channel protection layer 611, respectively, and are inverted staggered thin film transistors in each of which a channel formation region is formed in an oxide semiconductor layer.

First, a vertical alignment (VA) liquid crystal display device is described. The VA liquid crystal display device has a kind of mode in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and liquid crystal molecules are aligned in different directions in their respective regions. This is referred to as multi-domain or multi-domain design. Liquid crystal display devices of the multi-domain design are described below.

Figure 24:
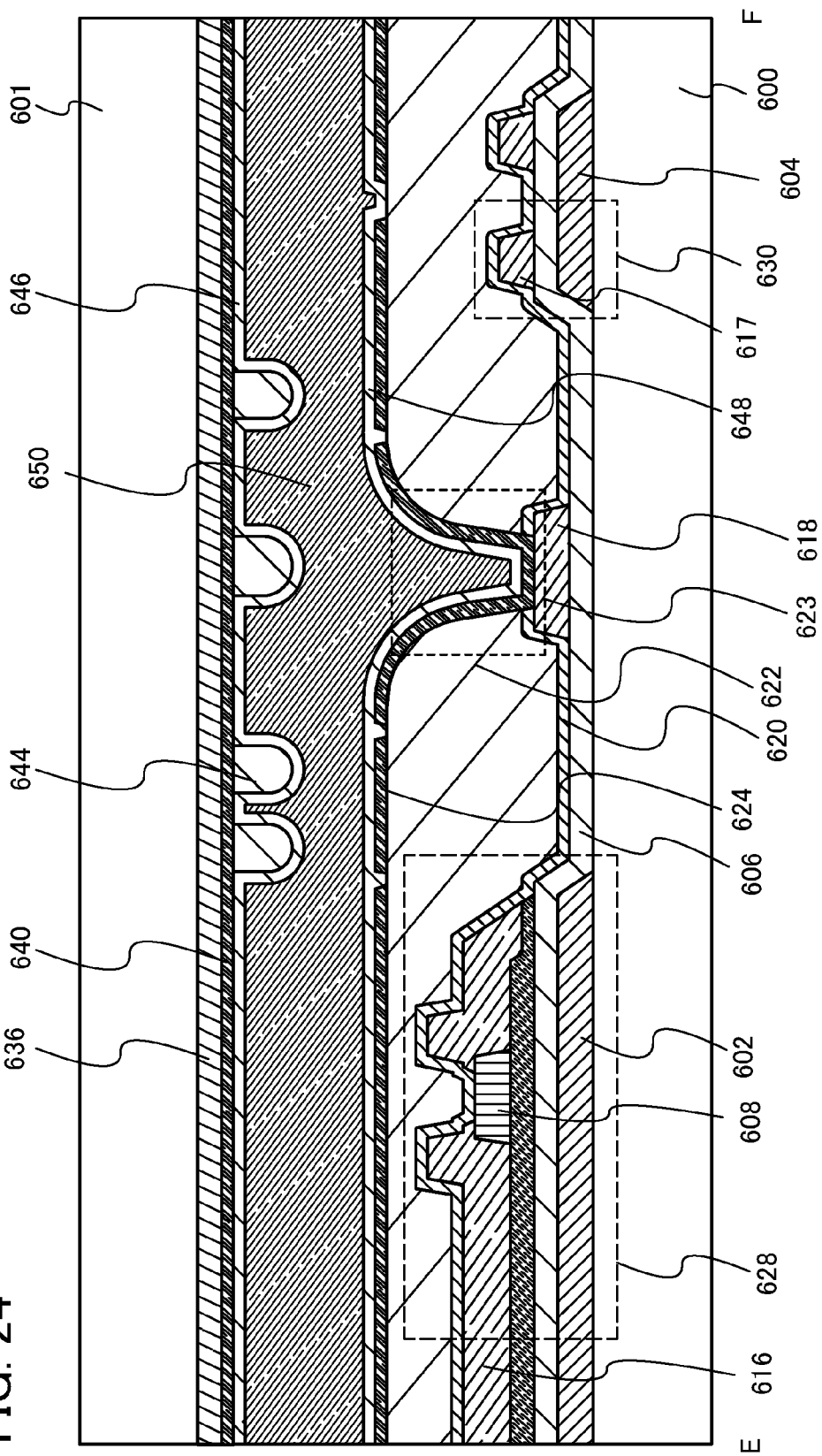
FIG. 24 illustrates a semiconductor device.
Figure 25:
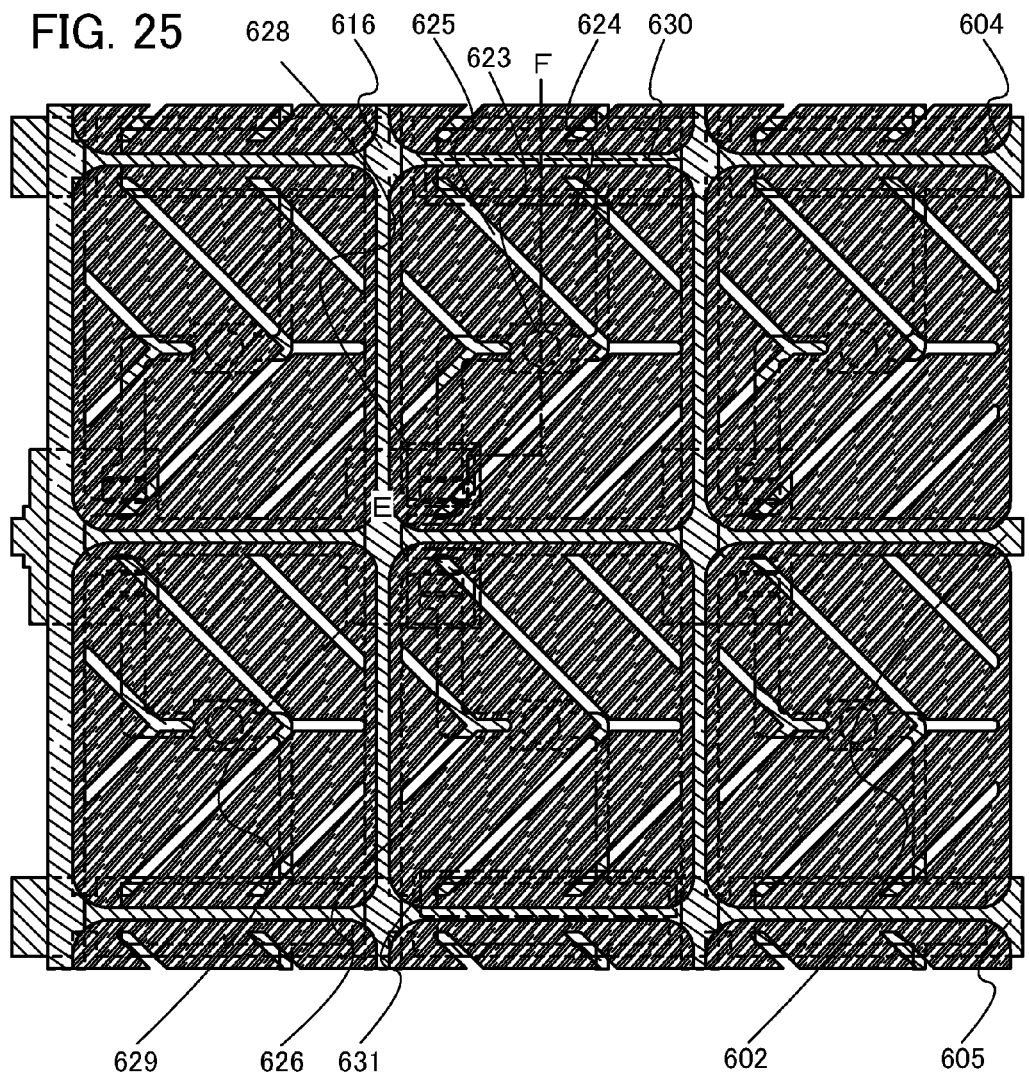
FIG. 25 illustrates a semiconductor device.
Figure 26:
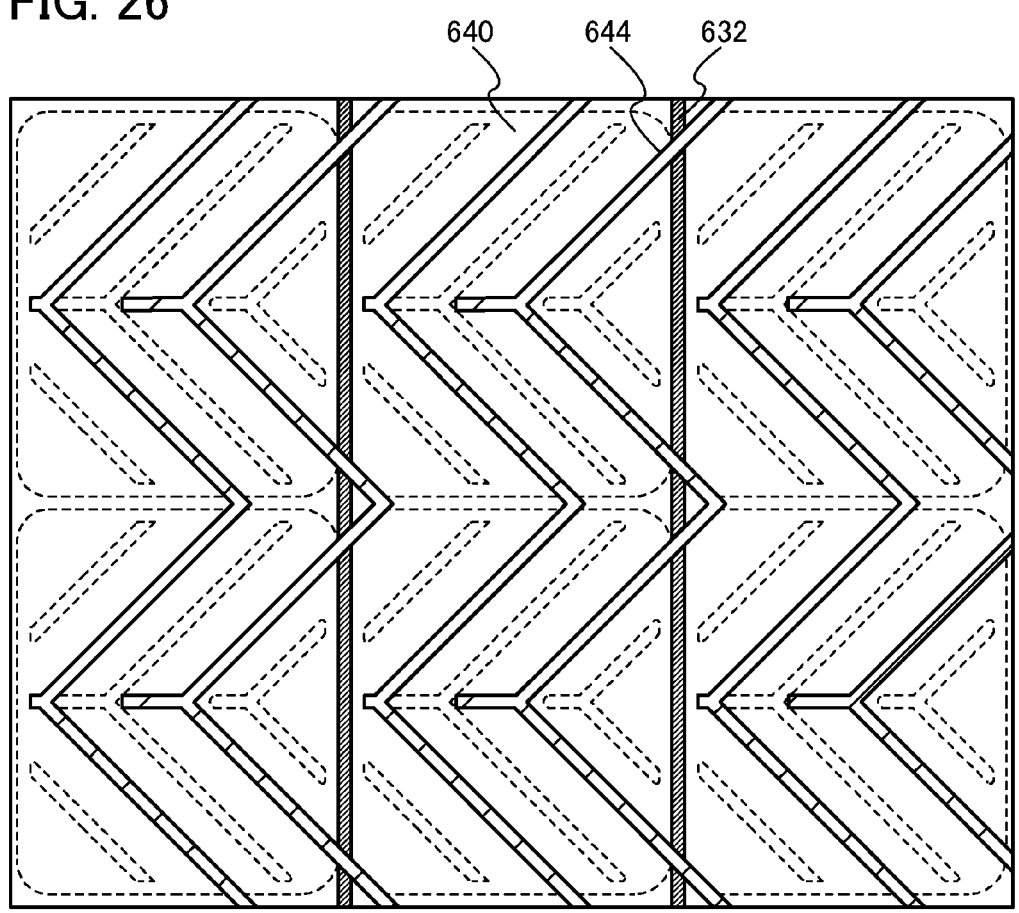
FIG. 26 illustrates a semiconductor device.

FIG. 25 and FIG. 26 illustrate a pixel electrode and a counter electrode, respectively. FIG. 25 is a plan view illustrating substrate where the pixel electrode is formed. FIG. 24 illustrates a cross-sectional structure along section line E-F in FIG. 25. FIG. 26 is a plan view illustrating a substrate where the counter electrode is formed. The following description is made with reference to those drawings.

In FIG. 24, a substrate 600 where the TFT 628, a pixel electrode layer 624 connected to the TFT 628, and a storage capacitor portion 630 are formed and a counter substrate 601 provided with a counter electrode layer 640 and the like overlap with each other, and liquid crystals are injected between the substrate 600 and the counter substrate 601.

The counter substrate 601 is provided with a coloring film 636 and the counter electrode layer 640, and protrusions 644 are formed on the counter electrode layer 640. An alignment film 648 is formed over the pixel electrode layer 624. Similarly, an alignment film 646 is formed on the counter electrode layer 640 and the protrusions 644. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to a wiring 618 through a contact hole 623 that penetrates an insulating film 620 for covering the TFT 628, a wiring 616, and the storage capacitor portion 630 and also penetrates an insulating film 622 for covering the insulating film 620. The thin film transistor described in any of Embodiments 1 to 4 can be used as the TFT 628 as appropriate. Further, the storage capacitor portion 630 includes a capacitor wiring 604 which is formed at the same time as a gate wiring 602 of the TFT 628, a gate insulating film 606, and a capacitor wiring 617 which is formed at the same time as the wirings 616 and 618.

The pixel electrode layer 624, the liquid crystal layer 650, and the counter electrode layer 640 overlap with each other, whereby a liquid crystal element is formed.

FIG. 25 illustrates a planar structure on the substrate 600. The pixel electrode layer 624 is formed using the material described in Embodiment 1. The pixel electrode layer 624 is provided with slits 625. The slits 625 are provided for controlling the alignment of the liquid crystals.

The TFT 629, a pixel electrode layer 626 connected to the TFT 629, and a storage capacitor portion 631 which are illustrated in FIG. 25 can be formed in a similar manner to the TFT 628, the pixel electrode layer 624, and the storage capacitor portion 630, respectively. Both the TFTs 628 and 629 are connected to the wiring 616. One pixel in this liquid crystal display panel includes the pixel electrode layers 624 and 626. The pixel electrode layers 624 and 626 constitute subpixels.

FIG. 26 illustrates a planar structure of the counter substrate side. The counter electrode layer 640 is formed over a light-blocking film 632. The counter electrode layer 640 is preferably formed using a material similar to that of the pixel electrode layer 624. The protrusions 644 that control the alignment of the liquid crystals are formed on the counter electrode layer 640. Note that in FIG. 26, the pixel electrode layers 624 and 626 formed over the substrate 600 are represented by dashed lines, and the counter electrode layer 640 and the pixel electrode layers 624 and 626 overlap with each other.

Figure 27:
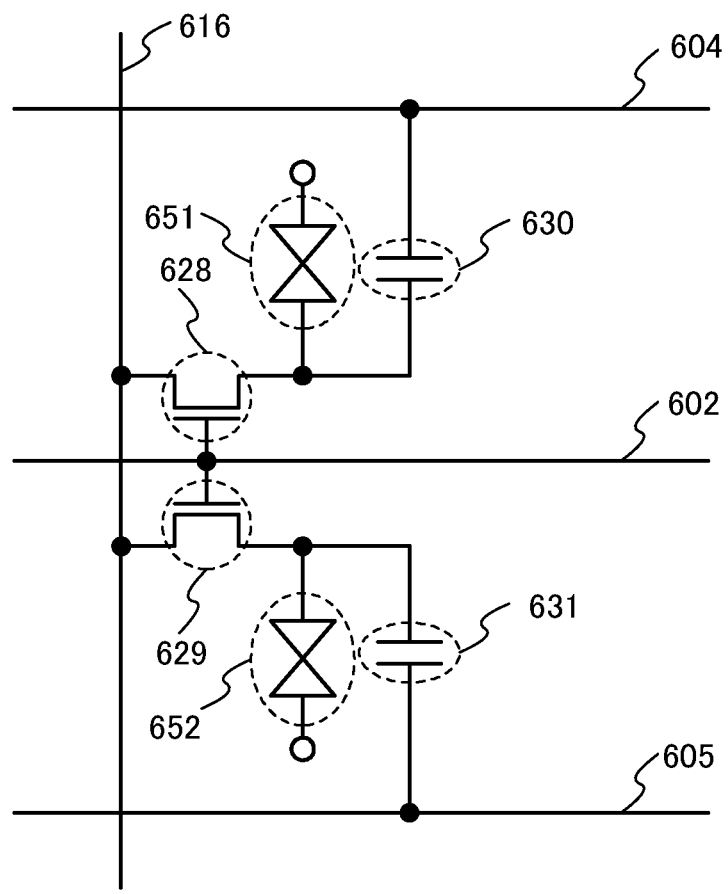
FIG. 27 illustrates a semiconductor device.

FIG. 27 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can vary. In other words, the alignment of the liquid crystals is precisely controlled and the viewing angle is increased by separate control of the potentials of the capacitor wirings 604 and 605.

When voltage is applied to the pixel electrode layer 624 provided with the slits 625, a distorted electric field (an oblique electric field) is generated in the vicinity of the slits 625. The protrusions 644 on the counter substrate 601 side and the slits 625 are alternately arranged with each other so that the oblique electric field is effectively generated to control the alignment of the liquid crystals, whereby the direction of the alignment of the liquid crystals varies depending on the location. In other words, the viewing angle of the liquid crystal display panel is increased by domain multiplication.

Next, a VA liquid crystal display device, which is different from the above-described device, will be described with reference to FIG. 28 to FIG. 31.

Figure 28:
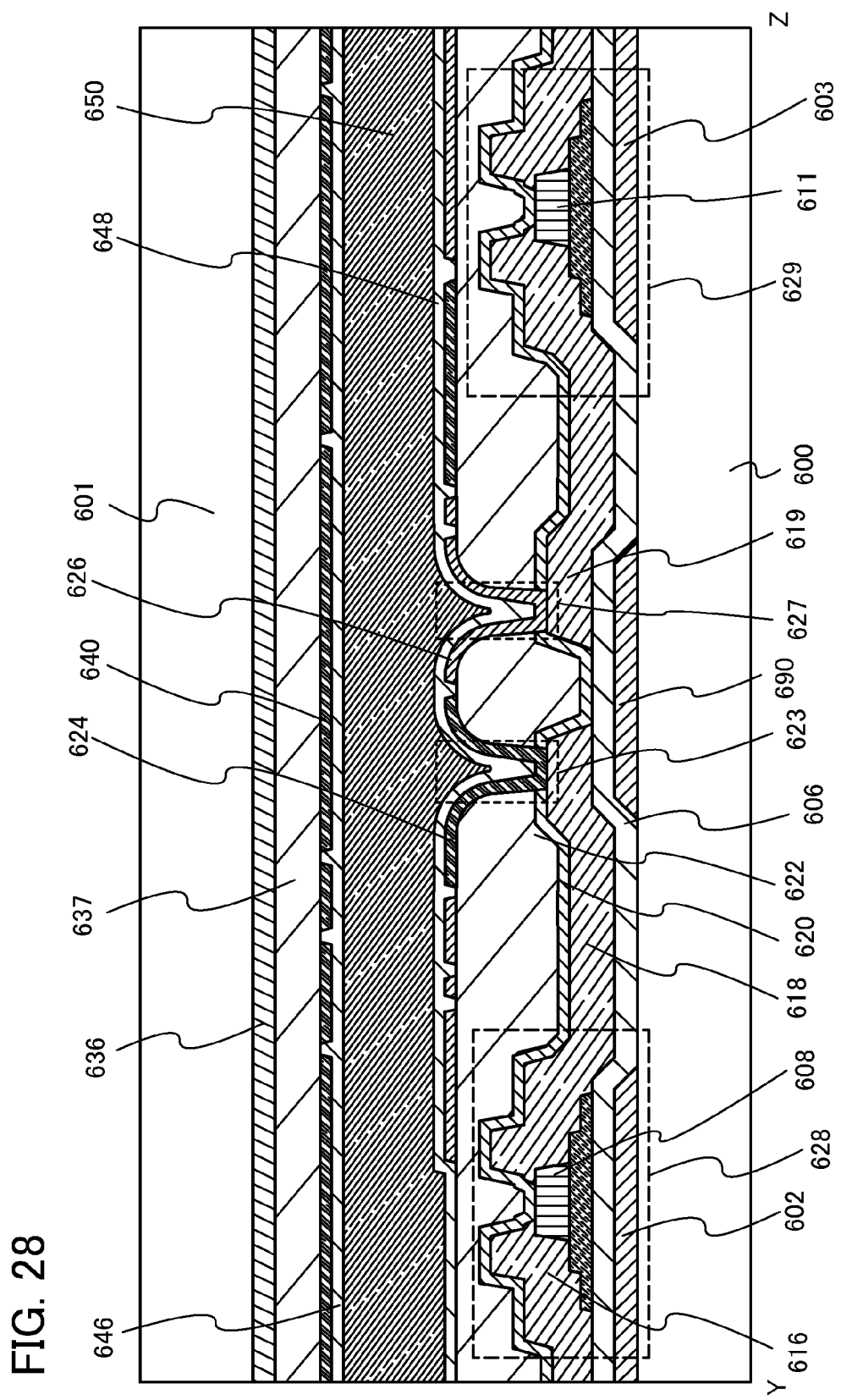
FIG. 28 illustrates a semiconductor device.
Figure 29:
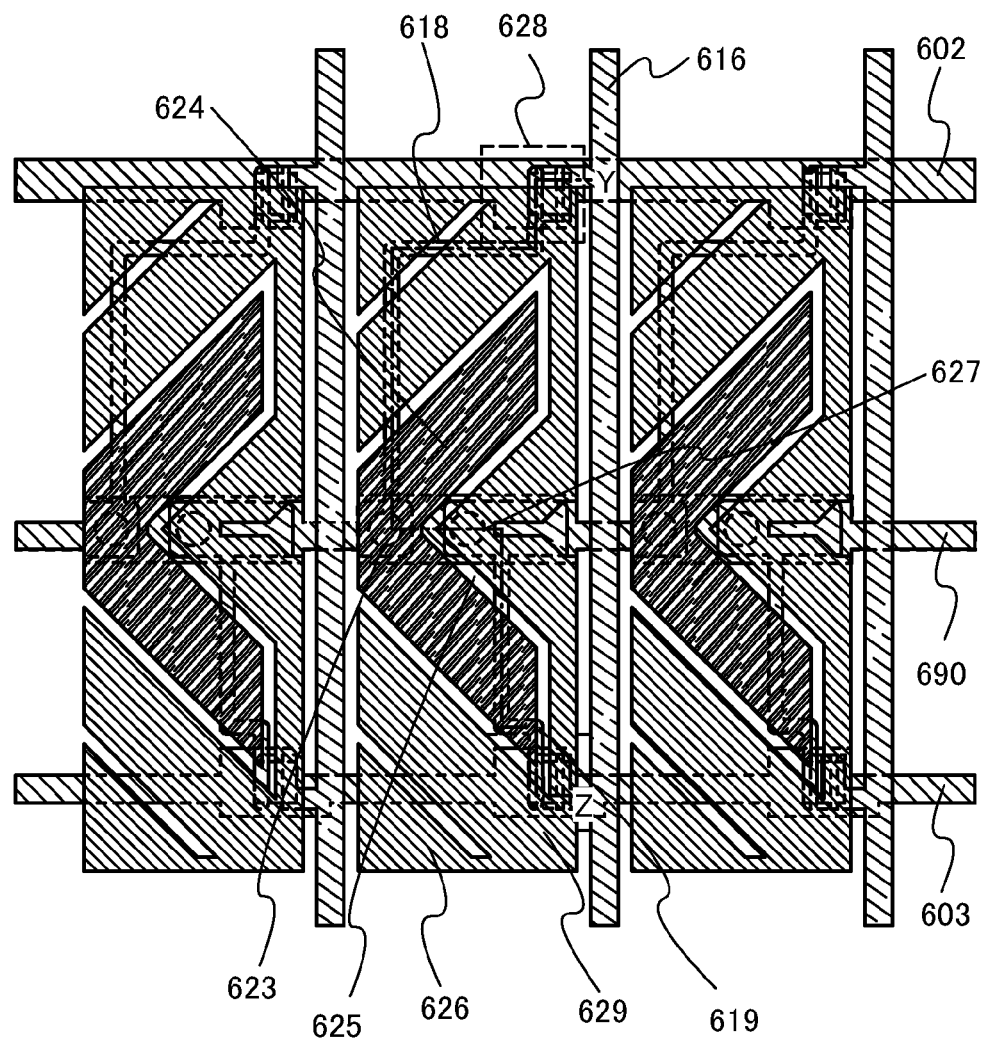
FIG. 29 illustrates a semiconductor device.

FIG. 28 and FIG. 29 illustrate a pixel structure of a VA liquid crystal display panel. FIG. 29 is a plan view of the substrate 600. FIG. 28 illustrates a cross-sectional structure along section line Y-Z in FIG. 29.

In this pixel structure, one pixel includes a plurality of pixel electrodes, and a TFT is connected to each of the pixel electrodes. The TFTs are driven by different gate signals. In other words, signals applied to individual pixel electrodes in a multi-domain pixel are controlled independently of each other.

The pixel electrode layer 624 is connected to the TFT 628 through a wiring 618 in the contact hole 623 penetrating the insulating films 620 and 622. The pixel electrode layer 626 is connected to the TFT 629 through a wiring 619 in a contact hole 627 penetrating the insulating films 620 and 622. The gate wiring 602 of the TFT 628 is separated from a gate wiring 603 of the TFT 629 so that different gate signals can be supplied. On the other hand, the wiring 616 serving as a data line is shared by the TFTs 628 and 629. The thin film transistor described in any of Embodiments 1 to 4 can be used as appropriate as each of the TFTs 628 and 629. Note that the gate insulating film 606 is formed over the gate wiring 602, the gate wiring 603, and a capacitor wiring 690.

Figure 31:
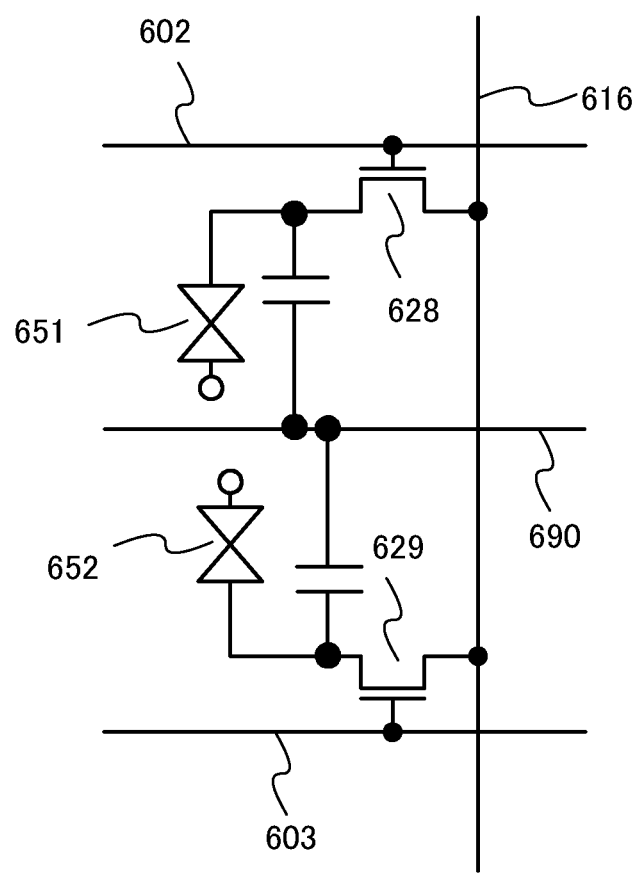
FIG. 31 illustrates a semiconductor device.

The shape of the pixel electrode layer 624 is different from that of the pixel electrode layer 626. The pixel electrode layer 626 is formed so as to surround the pixel electrode layer 624 which has a V shape. A voltage applied to the pixel electrode layer 624 by the TFT 628 is made to be different from a voltage applied to the pixel electrode layer 626 by the TFT 629, whereby alignment of liquid crystals is controlled. FIG. 31 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of liquid crystal elements 651 and 652 can vary. In other words, the operations of the TFTs 628 and 629 are controlled separately to precisely control the alignment of the liquid crystals in the liquid crystal elements 651 and 652, which leads to a wider viewing angle.

Figure 30:
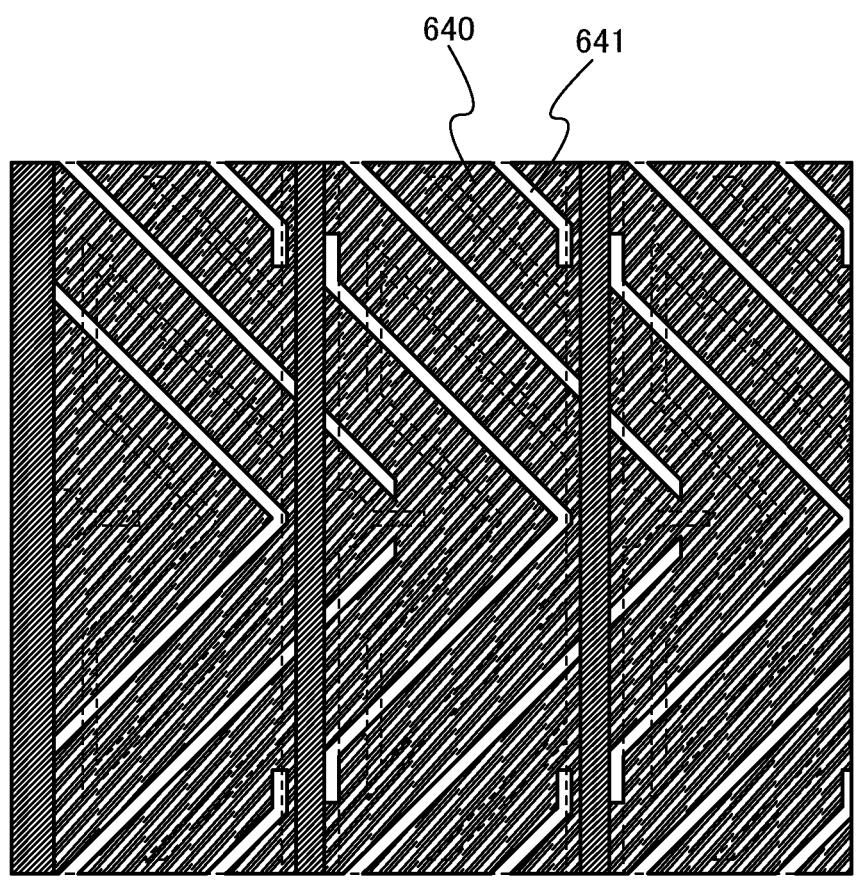
FIG. 30 illustrates a semiconductor device.

The counter substrate 601 is provided with the coloring film 636 and the counter electrode layer 640. A planarization film 637 is formed between the coloring film 636 and the counter electrode layer 640 to prevent alignment disorder of the liquid crystals. FIG. 30 illustrates a structure of the counter substrate side. The counter electrode layer 640 is an electrode shared by plural pixels and provided with slits 641. The slits 641 and the slits 625 on the pixel electrode layer 624 and 626 sides are alternately arranged with each other so that an oblique electric field is effectively generated, whereby the alignment of the liquid crystals can be controlled. Thus, the direction of the alignment of the liquid crystals can vary depending on the location, which leads to a wider viewing angle. Note that in FIG. 30, the pixel electrode layers 624 and 626 formed over the substrate 600 are represented by dashed lines, and the counter electrode layer 640 and the pixel electrode layers 624 and 626 overlap with each other.

The alignment film 648 is formed over the pixel electrode layer 624 and the pixel electrode layer 626. Similarly, the counter electrode layer 640 is provided with the alignment film 646. The liquid crystal layer 650 is formed between the substrate 600 and the counter substrate 601. The pixel electrode layer 624, the liquid crystal layer 650, and the counter electrode layer 640 overlap with each other to form a first liquid crystal element. Moreover, the pixel electrode layer 626, the liquid crystal layer 650, and the counter electrode layer 640 overlap with each other to form a second liquid crystal element. The pixel structure of the display panel illustrated in FIGS. 28 to 31 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell so that liquid crystals are driven to express gray scale. With this method, a viewing angle can be increased to about 180°. A liquid crystal display device in the horizontal electric field mode is described below.

Figure 32:
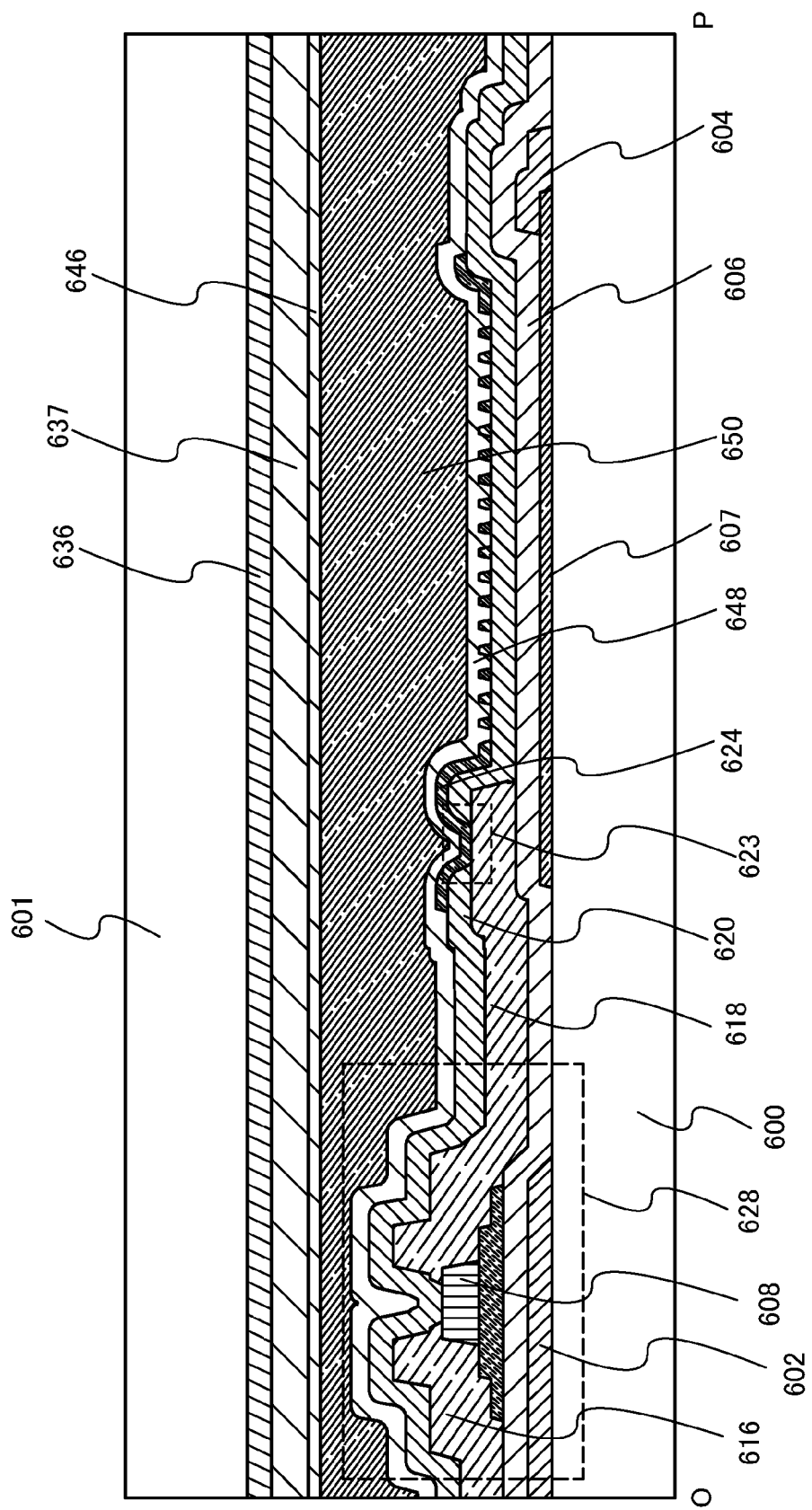
FIG. 32 illustrates a semiconductor device.

In FIG. 32, the substrate 600 where an electrode layer 607 and the pixel electrode layer 624 connected to the TFT 628 are formed overlaps with the counter substrate 601, and liquid crystals are injected between the substrate 600 and the counter substrate 601. The counter substrate 601 is provided with the coloring film 636, the planarization film 637, and the like. Note that a counter electrode is not provided on the counter substrate 601 side. In addition, the liquid crystal layer 650 is formed between the substrate 600 and the counter substrate 601, and the alignment films 646 and 648 are provided between the liquid crystal layer 650 and the substrate 600 and the counter substrate 601.

The electrode layer 607 and the capacitor wiring 604 connected to the electrode layer 607, and the TFT 628 are formed over the substrate 600. The capacitor wiring 604 can be formed at the same time as the gate wiring 602 of the TFT 628. The thin film transistor described in any of Embodiments 1 to 4 can be used as the TFT 628. The electrode layer 607 can be formed using a material similar to that of the pixel electrode layer described in any of Embodiments 1 to 4. Moreover, the electrode layer 607 is divided almost in a pixel form. Note that the gate insulating film 606 is formed over the electrode layer 607 and the capacitor wiring 604.

The wirings 616 and 618 of the TFT 628 are formed over the gate insulating film 606. The wiring 616 is a data line through which a video signal travels, extends in one direction in a liquid crystal display panel, is connected to a source region or a drain region of the TFT 628, and functions as one of source and drain electrodes. The wiring 618 functions as the other of the source and drain electrodes and is connected to the pixel electrode layer 624.

The insulating film 620 is formed over the wirings 616 and 618. Over the insulating film 620, the pixel electrode layer 624 is formed to be connected to the wiring 618 through a contact hole formed in the insulating film 620. The pixel electrode layer 624 is formed using a material similar to that of the pixel electrode layer described in Embodiment 1.

In such a manner, the TFT 628 and the pixel electrode layer 624 connected to the TFT 628 are formed over the substrate 600. Note that a storage capacitor is formed with the electrode layer 607 and the pixel electrode layer 624.

Figure 33:
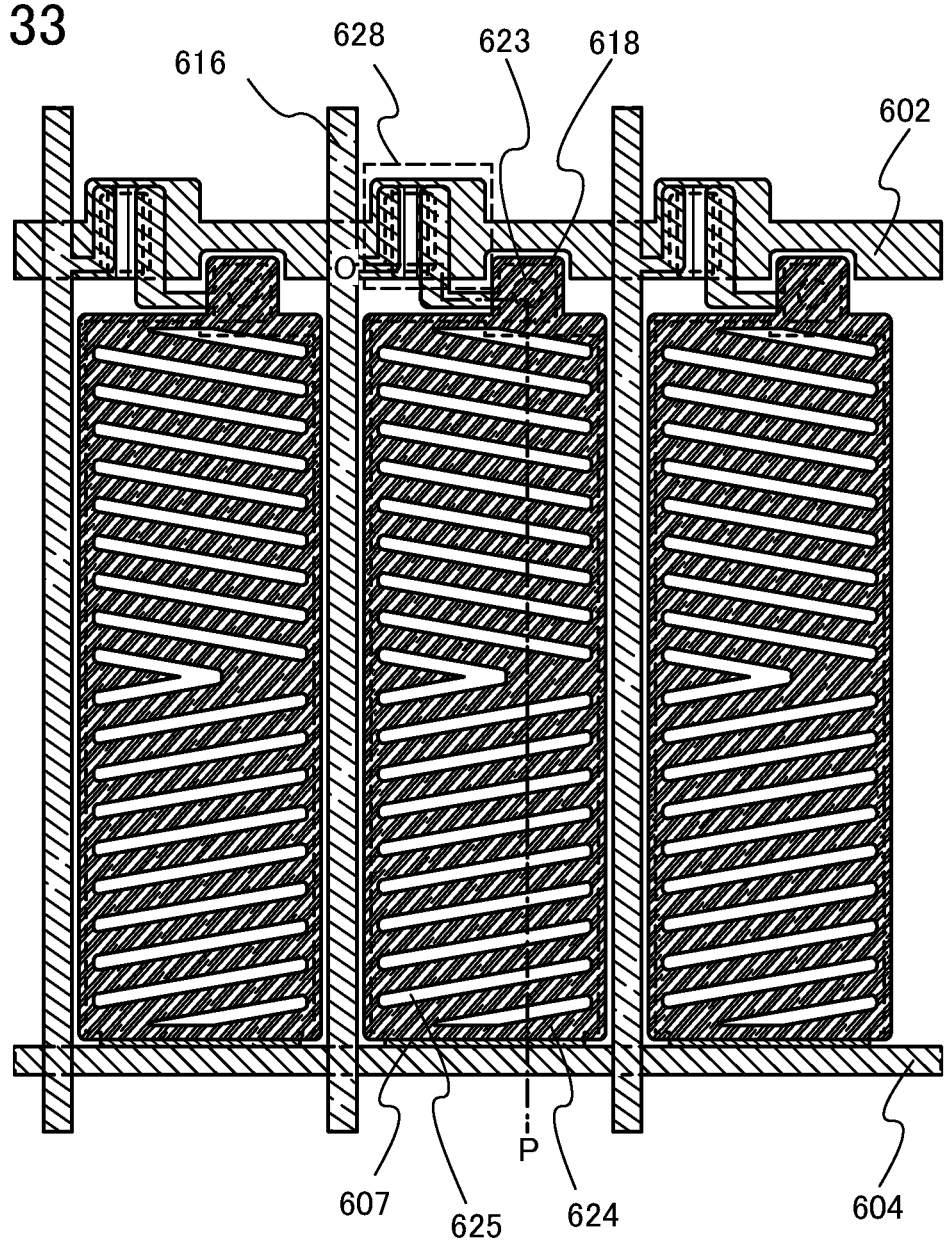
FIG. 33 illustrates a semiconductor device.

FIG. 33 is a plan view illustrating a structure of the pixel electrode. FIG. 32 illustrates a cross-sectional structure along section line O-P in FIG. 33. The pixel electrode layer 624 is provided with slits 625. The slits 625 are provided for controlling alignment of liquid crystals. In that case, an electric field is generated between the electrode layer 607 and the pixel electrode layer 624. The thickness of the gate insulating film 606 formed between the electrode layer 607 and the pixel electrode layer 624 is 50 nm to 200 nm, which is much smaller than the thickness of the liquid crystal layer of 2 μm to 10 μm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the angle of viewing, which leads to a wider viewing angle. In addition, since both the electrode layer 607 and the pixel electrode layer 624 are light-transmitting electrodes, the aperture ratio can be increased.

Next, a different example of a liquid crystal display device in the horizontal electric field mode is described.

Figure 34:
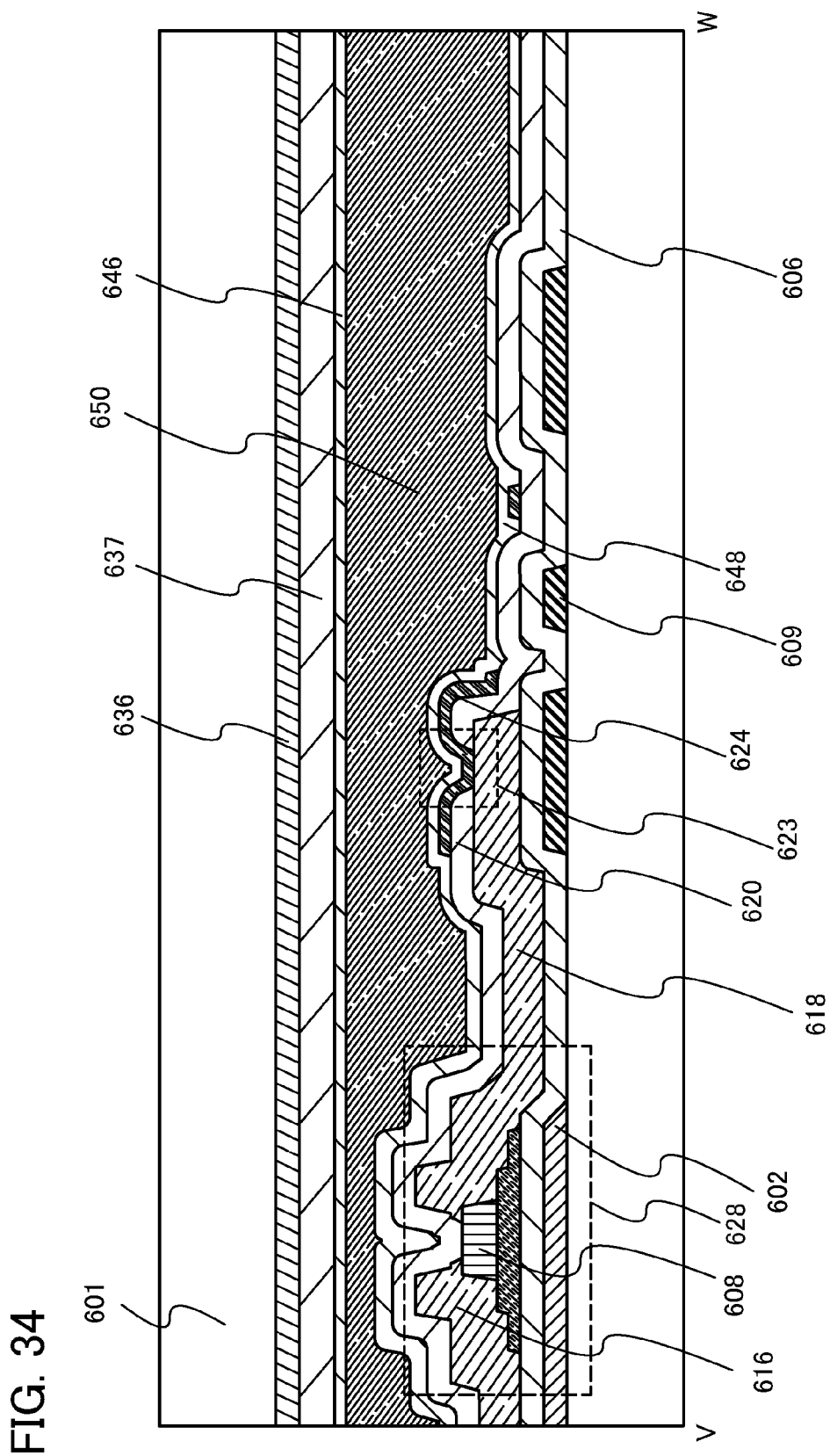
FIG. 34 illustrates a semiconductor device.
Figure 35:
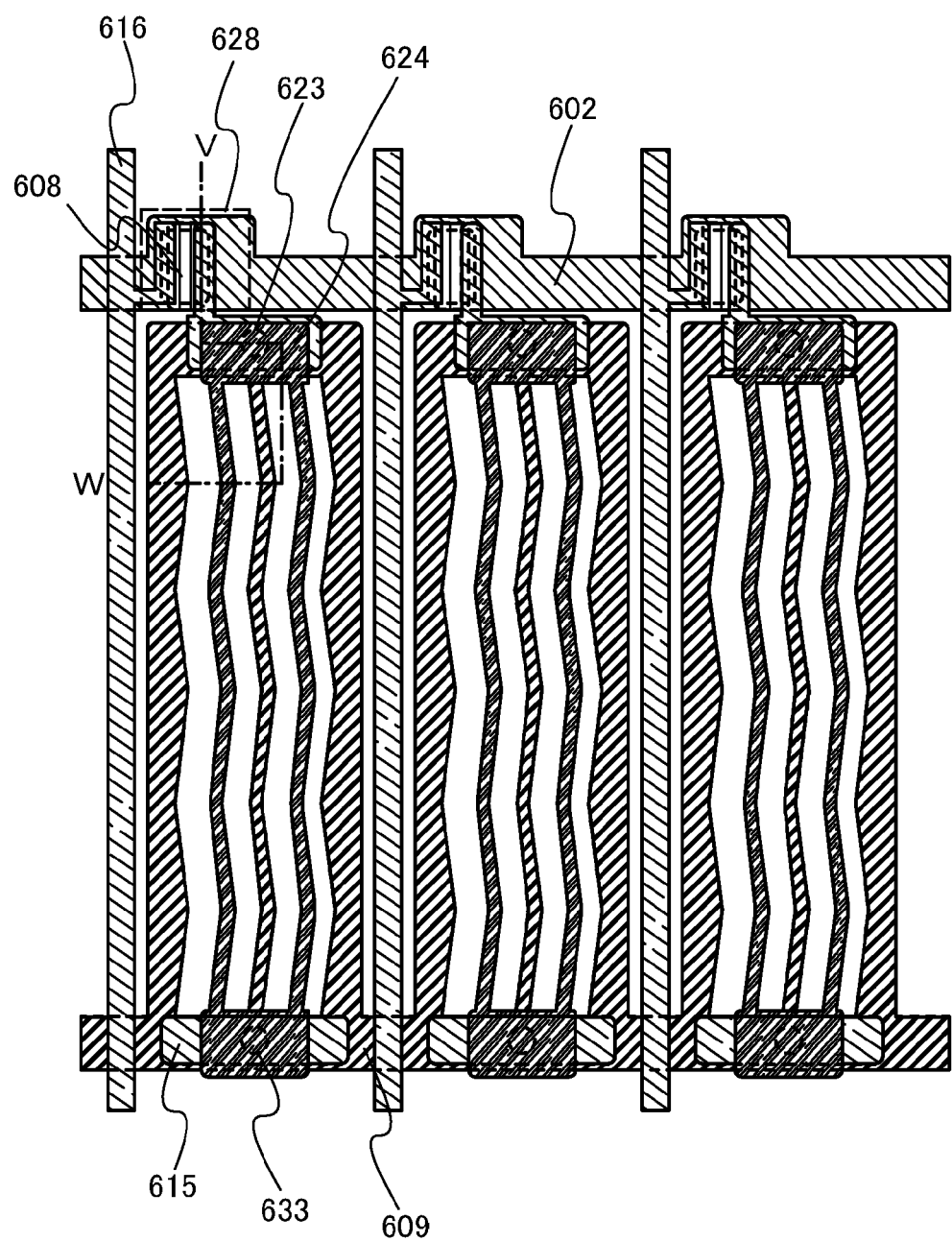
FIG. 35 illustrates a semiconductor device.

FIG. 34 and FIG. 35 illustrate a pixel structure of a liquid crystal display device in an IPS mode. FIG. 35 is a plan view. FIG. 34 illustrates a cross-sectional structure along section line V-W in FIG. 35. The following description is made with reference to both the drawings.

In FIG. 34, the substrate 600 over which the TFT 628 and the pixel electrode layer 624 connected to the TFT 628 are formed overlaps with the counter substrate 601, and liquid crystals are injected between the substrate 600 and the counter substrate 601. The counter substrate 601 is provided with the coloring film 636, the planarization film 637, and the like. Note that a counter electrode is not provided on the counter substrate 601 side. The liquid crystal layer 650 is formed between the substrate 600 and the counter substrate 601, and the alignment films 646 and 648 are provided between the liquid crystal layer 650 and the substrate 600 and the counter substrate 601.

A common potential line 609 and the TFT 628 are formed over the substrate 600. The common potential line 609 can be formed at the same time as the gate wiring 602 of the TFT 628. The thin film transistor described in any of Embodiments 1 to 4 can be used as the TFT 628.

The wirings 616 and 618 of the TFT 628 are formed over the gate insulating film 606. The wiring 616 is a data line through which a video signal travels, extends in one direction in a liquid crystal display panel, is connected to a source region or a drain region of the TFT 628, and functions as one of source and drain electrodes. The wiring 618 functions as the other of the source and drain electrodes and is connected to the pixel electrode layer 624.

The insulating film 620 is formed over the wirings 616 and 618. Over the insulating film 620, the pixel electrode layer 624 is formed to be connected to the wiring 618 through the contact hole 623 formed in the insulating film 620. The pixel electrode layer 624 is formed using a material similar to that of the pixel electrode layer described in Embodiment 1. Note that as illustrated in FIG. 35, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and the comb-like electrodes formed at the same time as the common potential line 609 are alternately arranged with each other.

The alignment of the liquid crystals is controlled by an electric field generated between a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the angle of viewing, which leads to a wider viewing angle.

In such a manner, the TFT 628 and the pixel electrode layer 624 connected to the TFT 628 are formed over the substrate 600. A storage capacitor is formed with a gate insulating film 606, the common potential line 609, and a capacitor electrode layer 615. The capacitor electrode layer 615 and the pixel electrode layer 624 are connected to each other through a contact hole 633.

Next, an embodiment of a liquid crystal display device in a TN mode is described.

Figure 36:
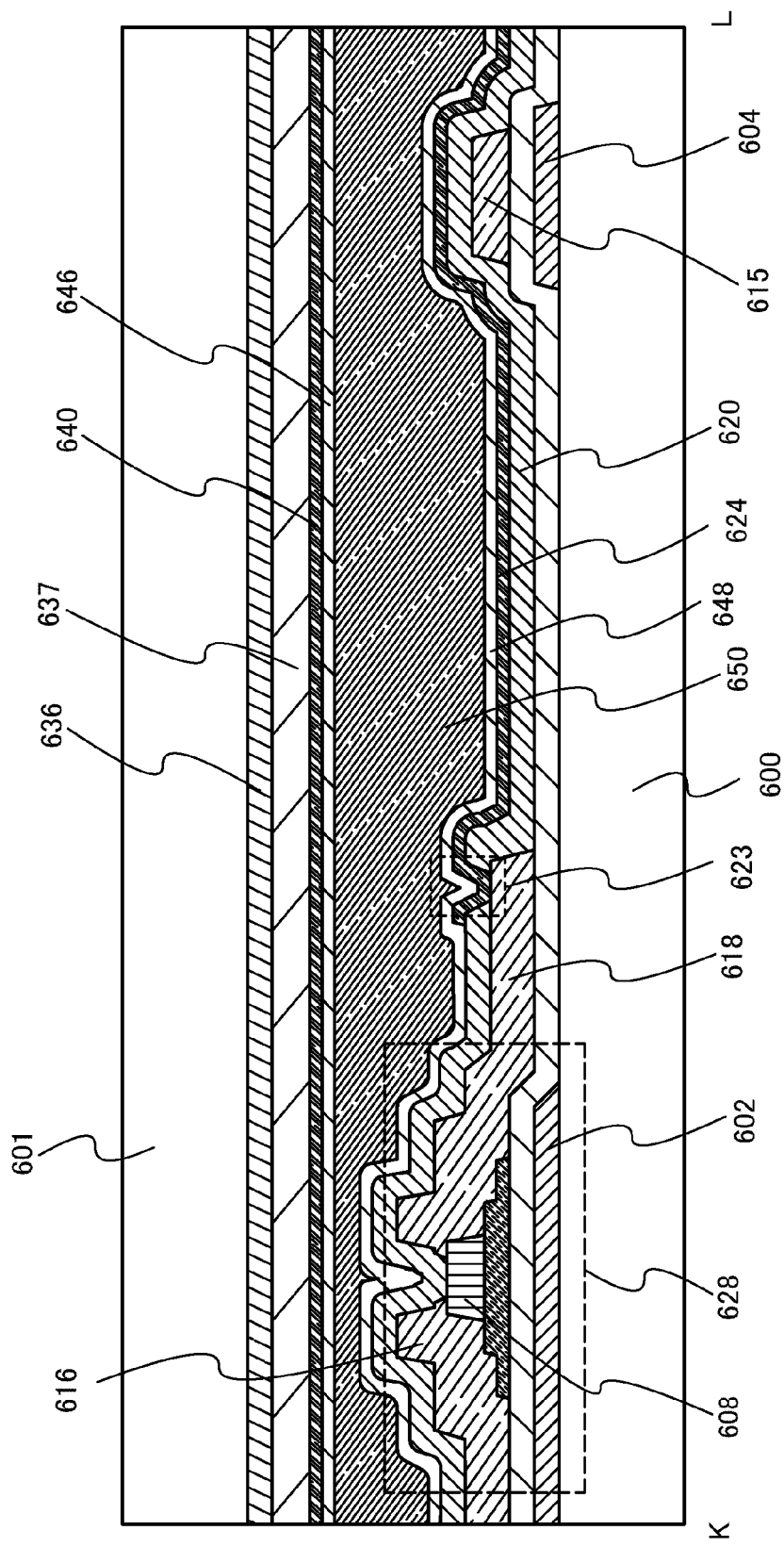
FIG. 36 illustrates a semiconductor device.
Figure 37:
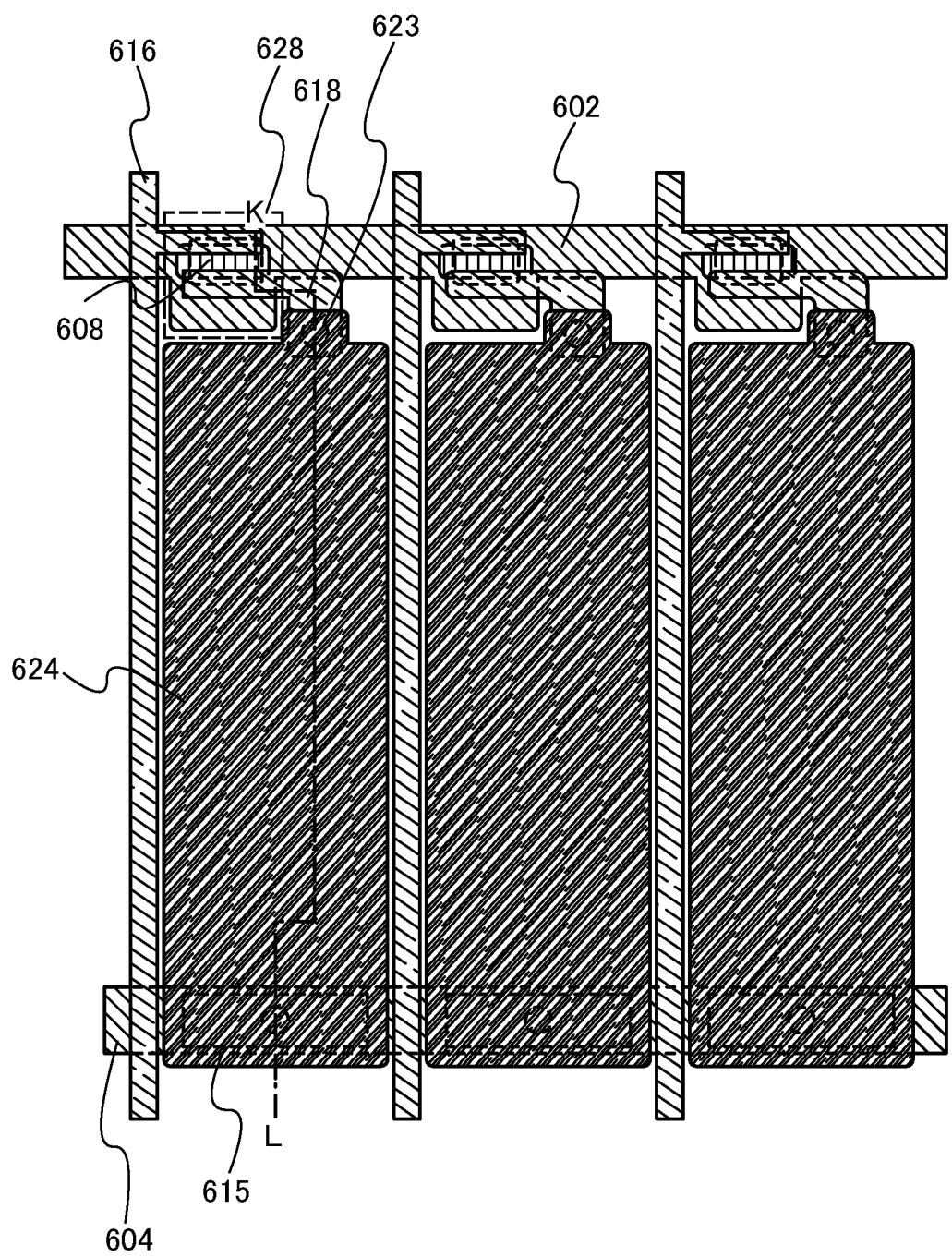
FIG. 37 illustrates a semiconductor device.

FIG. 36 and FIG. 37 illustrate a pixel structure of a liquid crystal display device in a TN mode. FIG. 37 is a plan view. FIG. 36 illustrates a cross-sectional structure along section line K-L in FIG. 37. The following description is made with reference to both the drawings.

The pixel electrode layer 624 is connected to the TFT 628 through the wiring 618 and the contact hole 623 formed in the insulating film 620. A wiring 616 functioning as a data line is connected to the TFT 628. The TFT described in any of Embodiments 1 to 4 can be used as the TFT 628.

The counter substrate 601 is provided with the coloring film 636 and the counter electrode layer 640. The planarization film 637 is formed between the coloring film 636 and the counter electrode layer 640 to prevent alignment disorder of liquid crystals. The liquid crystal layer 650 is formed between the pixel electrode layer 624 and the counter electrode layer 640 with the alignment films 646 and 648 therebetween.

The pixel electrode layer 624, the liquid crystal layer 650, and the counter electrode layer 640 overlap with each other, whereby a liquid crystal element is formed.

Alternatively, the coloring film 636 may be formed on the substrate 600 side. Further, a polarizing plate is attached to a surface of the substrate 600, which is opposite to the surface provided with the thin film transistor, and a polarizing plate is attached to a surface of the counter substrate 601, which is opposite to the surface provided with the counter electrode layer 640.

Through the above-described process, liquid crystal display devices can be manufactured as display devices. The liquid crystal display devices in this embodiment each have a high aperture ratio.

(Embodiment 15)

Figure 38:
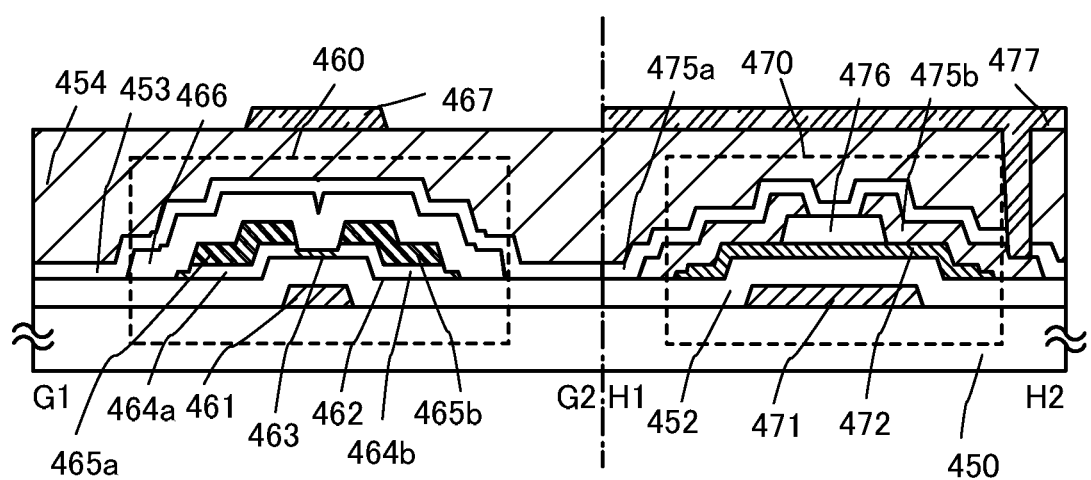
FIG. 38 illustrates a semiconductor device.

In this embodiment, FIG. 38 illustrates an example in which an oxide semiconductor layer is surrounded by nitride insulating films when seen in cross section. FIG. 38 is the same as FIG. 1B except for the top surface shape of the oxide insulating layer 466, the positions of edges of the oxide insulating layer 466, and the structure of the gate insulating layer. Thus, the same portions are denoted by common reference numerals, and specific description of the same portions is omitted.

The thin film transistor 460 provided in a driver circuit is a channel-etched thin film transistor and includes, over the substrate 450 having an insulating surface, the gate electrode layer 461; a gate insulating layer 452 formed using a nitride insulating film; an oxide semiconductor layer including at least the channel formation region 463, the first high-resistance drain region 464a, and the second high-resistance drain region 464b; the source electrode layer 465a; and the drain electrode layer 465b. In addition, the oxide insulating layer 466 is provided so as to cover the thin film transistor 460 and be in contact with the channel formation region 463.

The oxide insulating layer 466 is processed so that a portion of the gate insulating layer 452, which is placed outside the thin film transistor 460, is exposed when the oxide insulating layer 476 which functions as a channel protective layer of the thin film transistor 470 provided in a pixel is formed through a photolithography process. At least the area of the top surface of the oxide insulating layer 466 is larger than that of the top surface of the oxide semiconductor layer, and the top surface of the oxide insulating layer 466 preferably covers the thin film transistor 460.

Further, the protective insulating layer 453 formed using a nitride insulating film is formed so as to cover the top surface and side surfaces of the oxide insulating layer 466.

The first high-resistance drain region 464a is formed in contact with a bottom surface of the source electrode layer 465a in a self-aligned manner. The second high-resistance drain region 464b is formed in contact with a bottom surface of the drain electrode layer 465b in a self-aligned manner. The channel formation region 463 is in contact with the oxide insulating layer 466, has a small thickness, and is a region (an i-type region) with higher resistance than the first high-resistance drain region 464a and the second high-resistance drain region 464b.

The gate insulating layer 452 is formed, using a nitride insulating film, in contact with bottom surfaces of the channel formation region 463, the first high-resistance drain region 464a, and the second high-resistance drain region 464b.

For the protective insulating layer 453 formed using a nitride insulating film, an inorganic insulating film that does not contain impurities such as moisture, a hydrogen ion, and $OH^-$ and blocks entry of these from the outside is used: for example, a silicon nitride film, a silicon oxynitride film, an aluminum nitride film, or an aluminum oxynitride film obtained with a sputtering method is used.

In this embodiment, as the protective insulating layer 453 formed using a nitride insulating film, a 100-nm-thick silicon nitride film is formed with an RF sputtering method so as to cover the top surface and side surfaces of the oxide semiconductor layer 462. In addition, the protective insulating layer 453 is in contact with the gate insulating layer 452 formed using a nitride insulating film.

With the structure illustrated in FIG. 38, entry of moisture from the outside can be prevented in a manufacturing process after formation of the protective insulating layer 453 formed using a nitride insulating film. Further, even after a device is completed as a semiconductor device such as a liquid crystal display device, entry of moisture from the outside can be prevented in the long term; therefore, the long-term reliability of the device can be improved.

In a similar manner, in the thin film transistor 470, the protective insulating layer 453, which is formed using a nitride insulating film, is formed using a 100-nm-thick silicon nitride film with an RF sputtering method so as to cover a top surface and side surfaces of the oxide semiconductor layer 472. In addition, the protective insulating layer 453 is in contact with the gate insulating layer 452 formed using a nitride insulating film.

In this embodiment, one thin film transistor is covered with a nitride insulating film; however, one embodiment of the present invention is not limited to this structure. Alternatively, a plurality of thin film transistors may be covered with a nitride insulating film, or a plurality of thin film transistors in a pixel portion may be collectively covered with a nitride insulating film. A region where the protective insulating layer 453 and the gate insulating layer 452 are in contact with each other may be formed so that at least the pixel portion of the active matrix substrate is surrounded.

This embodiment can be freely combined with any of other embodiments. This application is based on Japanese Patent Application serial No. 2009-172413 filed with Japan Patent Office on Jul. 23, 2009, the entire contents of which are hereby incorporated by reference.

The invention claimed is:

1. A semiconductor device comprising:
   a pixel portion over a substrate, the pixel portion comprising a first transistor and a pixel electrode layer; and
   a driver circuit over the substrate, the driver circuit comprising a second transistor,
   wherein the first transistor comprises:
      a first gate electrode layer over the substrate;
      a gate insulating layer over the first gate electrode layer;
      a first oxide semiconductor layer over the gate insulating layer;
      a first oxide insulating layer in contact with a part of the first oxide semiconductor layer; and
      a first source electrode layer and a first drain electrode layer over and in contact with both the first oxide insulating layer and the first oxide semiconductor layer,
   wherein the second transistor comprises:
      a second gate electrode layer over the substrate;
      the gate insulating layer over the second gate electrode layer;
      a second oxide semiconductor layer over the gate insulating layer; and
      a second source electrode layer and a second drain electrode layer over the second oxide semiconductor layer,
   wherein the first gate electrode layer, the gate insulating layer, the first oxide semiconductor layer, the first oxide insulating layer, the first source electrode layer, the first drain electrode layer and the pixel electrode layer have a light-transmitting property, and
   wherein a material of the second source electrode layer and the second drain electrode layer is different from a material of the first source electrode layer and the first drain electrode layer.

2. The semiconductor device according to claim 1, wherein the second source electrode layer and the second drain electrode layer are in contact with the second oxide semiconductor layer.

3. The semiconductor device according to claim 1,
   wherein an end portion of the second oxide semiconductor layer is positioned outside a side surface of the second source electrode layer and the second drain electrode layer, and
   wherein the end portion of the first oxide semiconductor layer is thinner than a region of the first oxide semiconductor layer overlapping with the second source electrode layer and the second drain electrode layer.

4. The semiconductor device according to claim 1,
   wherein the second oxide semiconductor layer has a channel formation region thinner than a region overlapping with the second source electrode layer or the second drain electrode layer.

5. The semiconductor device according to claim 1, further comprising a second oxide insulating layer over the second source electrode layer and the second drain electrode layer,
   wherein the first oxide insulating layer and the second oxide insulating layer comprises the same light-transmitting insulating material.

6. The semiconductor device according to claim 1,
   wherein the second source electrode layer and the second drain electrode layer comprises a film containing an element selected from Al, Cr, Cu, Ta, Ti, Mo, and W or a stacked film including any of these elements.

7. The semiconductor device according to claim 1,
   wherein the first source electrode layer, the first drain electrode layer, and the pixel electrode layer comprises indium oxide, an alloy of indium oxide and tin oxide, an alloy of indium oxide and zinc oxide, or zinc oxide.

8. The semiconductor device according to claim 1, further comprising a capacitor portion over the substrate,
   wherein the capacitor portion includes a capacitor wiring and a capacitor electrode overlapping with the capacitor wiring, and
   wherein the capacitor wiring and the capacitor electrode have a light-transmitting property.

9. The semiconductor device according to claim 1, further comprising a protective insulating film over the first oxide insulating layer, the first source electrode layer, and the first drain electrode layer,
   wherein the protective insulating film is provided so as to be in contact with the gate insulating layer.

10. The semiconductor device according to claim 1, wherein the first oxide semiconductor layer comprises a first high-resistance drain region overlapping with the first source electrode layer or the first drain electrode layer.

11. The semiconductor device according to claim 1, wherein the second gate electrode layer comprises a metal layer.

12. A semiconductor device comprising:
   a pixel portion over a substrate, the pixel portion comprising a first transistor and a pixel electrode layer; and
   a driver circuit over the substrate, the driver circuit comprising a second transistor,
   wherein the first transistor comprises:
      a first gate electrode layer over the substrate;
      a gate insulating layer over the first gate electrode layer;
      a first oxide semiconductor layer over the gate insulating layer;
      a first oxide insulating layer in contact with a part of the first oxide semiconductor layer; and
      a first source electrode layer and a first drain electrode layer over and in contact with both the first oxide insulating layer and the first oxide semiconductor layer,
   wherein the second transistor comprises:
      a second gate electrode layer over the substrate;
      the gate insulating layer over the second gate electrode layer;
      a second oxide semiconductor layer over the gate insulating layer; and
      a second source electrode layer and a second drain electrode layer over the second oxide semiconductor layer; and
      a conductive layer over the second source electrode layer and the second drain electrode layer and overlapping with the second gate electrode layer,
   wherein the first gate electrode layer, the gate insulating layer, the first oxide semiconductor layer, the first oxide insulating layer, the first source electrode layer, the first drain electrode layer and the pixel electrode layer have a light-transmitting property,
   wherein a material of the second source electrode layer and the second drain electrode layer is different from a material of the first source electrode layer and the first drain electrode layer.

13. The semiconductor device according to claim 12, wherein the second source electrode layer and the second drain electrode layer are in contact with the second oxide semiconductor layer.

14. The semiconductor device according to claim 12,
wherein an end portion of the second oxide semiconductor layer is positioned outside a side surface of the second source electrode layer and the second drain electrode layer, and
wherein the end portion of the first oxide semiconductor layer is thinner than a region of the first oxide semiconductor layer overlapping with the second source electrode layer and the second drain electrode layer.

15. The semiconductor device according to claim 12,
wherein the second oxide semiconductor layer has a channel formation region thinner than a region overlapping with the second source electrode layer or the second drain electrode layer.

16. The semiconductor device according to claim 12, further comprising a second oxide insulating layer over the second source electrode layer and the second drain electrode layer,
wherein the first oxide insulating layer and the second oxide insulating layer comprises the same light-transmitting insulating material.

17. The semiconductor device according to claim 12,
wherein the second source electrode layer and the second drain electrode layer comprises a film containing an element selected from Al, Cr, Cu, Ta, Ti, Mo, and W or a stacked film including any of these elements.

18. The semiconductor device according to claim 12, wherein the first source electrode layer, the first drain electrode layer, and the pixel electrode layer comprises indium oxide, an alloy of indium oxide and tin oxide, an alloy of indium oxide and zinc oxide, or zinc oxide.

19. The semiconductor device according to claim 12, further comprising a capacitor portion over the substrate,
wherein the capacitor portion includes a capacitor wiring and a capacitor electrode overlapping with the capacitor wiring, and
wherein the capacitor wiring and the capacitor electrode have a light-transmitting property.

20. The semiconductor device according to claim 12, further comprising a protective insulating film over the first oxide insulating layer, the first source electrode layer, and the first drain electrode layer,
wherein the protective insulating film is provided so as to be in contact with the gate insulating layer.

21. The semiconductor device according to claim 12, wherein the first oxide semiconductor layer comprises a first high-resistance drain region overlapping with the first source electrode layer or the first drain electrode layer.

22. The semiconductor device according to claim 12, wherein the second gate electrode layer comprises a metal layer.

23. The semiconductor device according to claim 1, wherein each of the first oxide semiconductor layer and the second oxide semiconductor layer comprises indium.

24. The semiconductor device according to claim 1, wherein each of the first oxide semiconductor layer and the second oxide semiconductor layer comprises indium, gallium, zinc and oxygen.

25. The semiconductor device according to claim 1, wherein the second oxide semiconductor layer comprises a second high-resistance drain region overlapping with the second source electrode layer or the second drain electrode layer.

26. The semiconductor device according to claim 12, wherein each of the first oxide semiconductor layer and the second oxide semiconductor layer comprises indium.

27. The semiconductor device according to claim 12, wherein each of the first oxide semiconductor layer and the second oxide semiconductor layer comprises indium, gallium, zinc and oxygen.

28. The semiconductor device according to claim 12, wherein the second oxide semiconductor layer comprises a second high-resistance drain region overlapping with the second source electrode layer or the second drain electrode layer.

* * * * *